(12) United States Patent
Kamakura et al.

(10) Patent No.: US 8,330,199 B2
(45) Date of Patent: Dec. 11, 2012

(54) SEMICONDUCTOR DEVICE HAVING RESISTORS WITH A BIASED SUBSTRATE VOLTAGE

(75) Inventors: Masaomi Kamakura, Tokyo (JP); Toshio Kumamoto, Tokyo (JP); Takashi Okuda, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 520 days.

(21) Appl. No.: 12/570,650

(22) Filed: Sep. 30, 2009

(65) Prior Publication Data

US 2010/0109775 A1    May 6, 2010

(30) Foreign Application Priority Data

Oct. 31, 2008    (JP) ................. 2008-281160

(51) Int. Cl.
*H03F 3/45*    (2006.01)
*H03F 3/04*    (2006.01)
*H01C 1/012*    (2006.01)

(52) U.S. Cl. ......... 257/300; 330/260; 330/291; 338/308
(58) Field of Classification Search .................. 257/300; 330/260, 291; 338/308
See application file for complete search history.

(56) References Cited

U.S. PATENT DOCUMENTS

| | | | | |
|---|---|---|---|---|
| 4,409,678 A * | 10/1983 | Takemae et al. | ............... | 365/206 |
| 4,565,971 A * | 1/1986 | Brookshire | ...................... | 330/9 |
| 5,111,068 A * | 5/1992 | Kusakabe | ..................... | 327/565 |
| 5,479,044 A * | 12/1995 | Narahara et al. | ............... | 257/533 |
| 5,479,045 A * | 12/1995 | Narahara et al. | ............... | 257/533 |
| 5,600,276 A * | 2/1997 | Imamura et al. | ............... | 327/362 |
| 5,739,577 A * | 4/1998 | Tuttle | ............................ | 257/536 |
| 5,886,580 A * | 3/1999 | Ikeda et al. | .................... | 330/293 |
| 6,369,654 B1 | 4/2002 | Inagaki et al. | | |
| 7,045,865 B2 * | 5/2006 | Amishiro et al. | ............. | 257/379 |
| 7,671,416 B1 * | 3/2010 | O et al. | ........................ | 257/360 |

FOREIGN PATENT DOCUMENTS

JP        04297061 A  * 10/1992
JP        2001-168651        6/2001

* cited by examiner

*Primary Examiner* — Wai Sing Louie
*Assistant Examiner* — Robert Carpenter
(74) *Attorney, Agent, or Firm* — McDermott Will & Emery LLP

(57) ABSTRACT

To eliminate the substrate voltage dependences of the respective resistance values of resistor elements, in the resistor elements coupled in series to each other over respective substrate regions, the ends of the resistor elements are coupled to the corresponding substrate regions by respective bias wires such that respective average potentials between the substrate regions of the resistor elements and the corresponding resistor elements have opposite polarities, and equal magnitudes.

16 Claims, 31 Drawing Sheets

: +Δ REPRESENTS PLUS-DIRECTION SUBSTRATE VOLTAGE DEPENDENCE,
-Δ REPRESENTS MINUS-DIRECTION SUBSTRATE VOLTAGE DEPENDENCE

: R1 AND R2 FORM SERIES-COUPLED RESISTOR, AND SUBSTRATE VOLTAGE
DEPENDENCES OF R1 AND R2 ARE CANCELLED THEREBETWEEN
(CONFIGURATION OF ANY OF EMBODIMENTS 1 TO 5 IS APPLIED)

: SUBSTRATE VOLTAGE DEPENDENCES OF RK1
AND RK2 ARE CANCELLED THEREBETWEEN
(CONFIGURATION OF ANY OF EMBODIMENTS 1 TO 5 IS APPLIED)

$\alpha = \dfrac{1}{4}$ $\alpha = \dfrac{1}{4}$

SEMICONDUCTOR DEVICE HAVING RESISTORS WITH A BIASED SUBSTRATE VOLTAGE

CROSS-REFERENCE TO RELATED APPLICATIONS

The disclosure of Japanese Patent Application No. 2008-281160 filed on Oct. 31, 2008 including the specification, drawings and abstract is incorporated herein by reference in its entirety.

BACKGROUND OF THE INVENTION

The present invention relates to semiconductor devices, and particularly to a semiconductor device using resistor elements such as polysilicon resistors. More particularly, the present invention relates to a configuration which inhibits the substrate voltage dependences of resistor elements such as polysilicon resistors.

In a semiconductor circuit device, resistor elements are used in various portions thereof. To implement a desired operation characteristic of a circuit, a resistor element is required to precisely retain the resistance value thereof. Typically, when a diffused resistor using the resistance of an impurity layer (diffusion layer) is used as a resistor element, the size of a depletion layer differs according to the potential difference between the diffused resistor and a well region where the diffused resistor is formed, and the resistance value of the diffused resistor varies in accordance therewith.

A configuration aiming at inhibiting the substrate voltage dependence of such a diffused resistor is shown in Japanese Unexamined Patent Publication No. 2001-168651 (Patent Document 1). In the configuration shown in Patent Document 1, an insulating film is formed over an epitaxial layer, and resistor elements formed of polysilicon or the like are disposed over the insulating film. In a layer overlying the resistor elements, a shield film for preventing noise from another wiring or the like is disposed. When the resistor elements are coupled in series, i.e., when the resistor elements are used as, e.g., the input resistor and feedback resistor of an operational amplifier (op-amp), a shield layer is coupled to one end of each of the resistor elements such that the voltages between the shield layer and the resistor elements have the same polarity. The epitaxial layer is brought into a floating state.

In Patent Document 1, the same polarity is given to each of the voltages between the shield layer and the resistor elements of the input resistor and feedback resistor of the op-amp to cause equal changes in the respective resistance values of the input resistor and the feedback resistor. By maintaining the resistance ratio therebetween at a given value, it is intended to hold constant the amplification factor of the op-amp. In addition, by providing a configuration in which a substrate bias voltage is not applied to the epitaxial layer, it is intended to eliminate the need for a region and wiring for the application of a substrate bias, and thereby implement simplified wiring and a smaller-size resistor circuit.

[Patent Document 1]
Japanese Unexamined Patent Publication No. 2001-168651

SUMMARY OF THE INVENTION

In general, when a polysilicon resistor is used as a resistor element, the resistance value thereof also has a substrate voltage dependence, though it is smaller than the substrate voltage dependence of the resistance value of a diffused resistor. Therefore, in the case where the resistance value of such a polysilicon resistor element has a substrate voltage dependence, when a voltage applied between the both ends of the resistor changes, the voltage between a substrate region and the resistor element changes to change the resistance value of the resistor element, and the operation characteristic of a semiconductor device using the resistor element also changes. In particular, when the resistor element is used in an op-amp, the amplification factor thereof varies according to the substrate voltage dependence of the resistance value thereof, and the waveform of an output signal therefrom deviates from the waveform of an ideal response characteristic so that distortion occurs in an output signal from the amplifier. In particular, in a recently practiced application in which high accuracy is required such as image processing or audio processing, the distortion component presents a significant problem.

In the configuration shown in Patent Document 1 described above, the polysilicon resistors are disposed over the epitaxial layer via the insulating film, and one end of each of the polysilicon resistors is coupled to the shield layer disposed so as to cover the polysilicon resistors. In the series-coupled resistor elements, the same polarity is given to the voltages between the shield layer and the resistor elements so as to cancel out variations in resistance values resulting from the voltage differences between the shield layer and the resistor elements in the entire sequence of the resistor elements.

However, in the configuration shown in Patent Document 1 mentioned above, the bias voltage is not applied to the epitaxial layer formed under the insulating film so that the epitaxial layer is brought into the floating state. As a result, the epitaxial layer in this substrate region is unstable and, when the potential of the epitaxial layer varies due to noise or the like, the potential variation is transmitted to the resistor elements through the insulating film so that the characteristic of a circuit formed of the resistor elements is unstable. In Patent Document 1 mentioned above, no consideration is given to the configuration when the potential of the epitaxial layer is fixed. In addition, when the shield layer is coupled to one end of each of the resistor elements, the potential of the shield layer changes in response to the input signal, and is not fixed. Consequently, the potential variation of the shield layer may act as a noise source with respect to another circuit.

It is therefore an object of the present invention to provide a semiconductor device which allows reliable inhibition of the influence of the substrate voltage dependences of the resistance values of resistor elements.

A semiconductor device according to the present invention includes a plurality of resistor elements formed over respective substrate regions, coupled in series to each other, and having resistance values which are dependent on the voltages of the substrate regions. In a pair of series-coupled resistor elements included in the plural resistor elements, one end of each of the resistor elements is coupled to the corresponding substrate region such that voltages between the resistor elements and the substrate regions have opposite polarities.

In the series-coupled resistor elements, the voltages between the substrate regions and the resistor elements have the opposite polarities. Accordingly, the substrate voltage dependences of the respective resistance values of the series-coupled resistor elements are inhibited or cancelled therebetween and hence, the substrate voltage dependence of the resistance value of the entire sequence of the series-coupled resistor elements can be eliminated.

Therefore, by applying the resistor elements to the input resistor and/or feedback resistor of an op-amp or the like, it is possible to inhibit signal distortion resulting from the sub-

DESCRIPTION OF THE PREFERRED EMBODIMENTS

Embodiment 1

Figure 1:
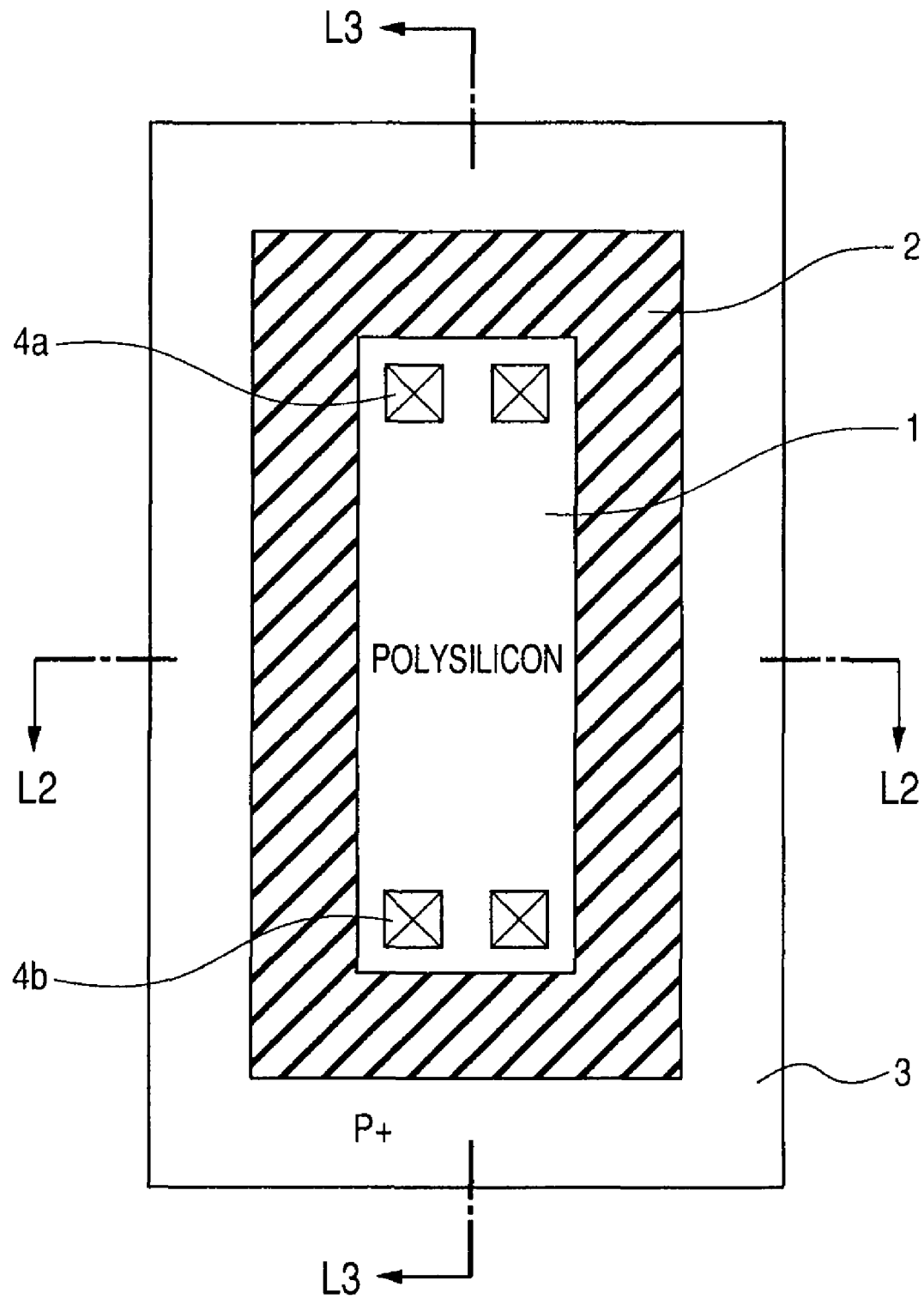
FIG. 1 is a view schematically showing a two-dimensional layout of a unit resistor of a resistor element according to Embodiment 1 of the present invention.

FIG. 1 is a view schematically showing a two-dimensional layout of a resistor element used in the present invention. In FIG. 1, a polysilicon resistive element 1 having a rectangular shape, and forming the resistor element is disposed over an isolation film 2. The isolation film 2 is, e.g., a shallow trench isolation (STI) film. In a surface of a substrate region (not shown in FIG. 1) around the isolation film 2, there is provided a high-concentration impurity region 3. An example of the high-concentration impurity region 3 is a high-concentration P-type impurity layer in which a P-type impurity has been implanted at a high concentration. Through the high-concentration impurity region 3, a substrate bias voltage is supplied to a well region (substrate region) formed under the high-concentration impurity region 3 (substrate bias voltage for supplying a voltage to a substrate will be described later in detail). The P-type impurity region 3 is used because the polysilicon of the resistive element 1 is P-type polysilicon into which a P-type impurity has been implanted for the adjustment of the resistance value thereof. A well forming the substrate region of the resistor element is a P-type well.

By disposing the polysilicon resistive element 1 forming the resistor element over the isolation film 2, the influence of a substrate potential is inhibited unlike in the case of a diffused resistor. On the both ends of the polysilicon resistive element 1, contacts 4a and 4b are provided, and each coupled to another element or another resistive element via low-resistance wiring.

Figure 2:
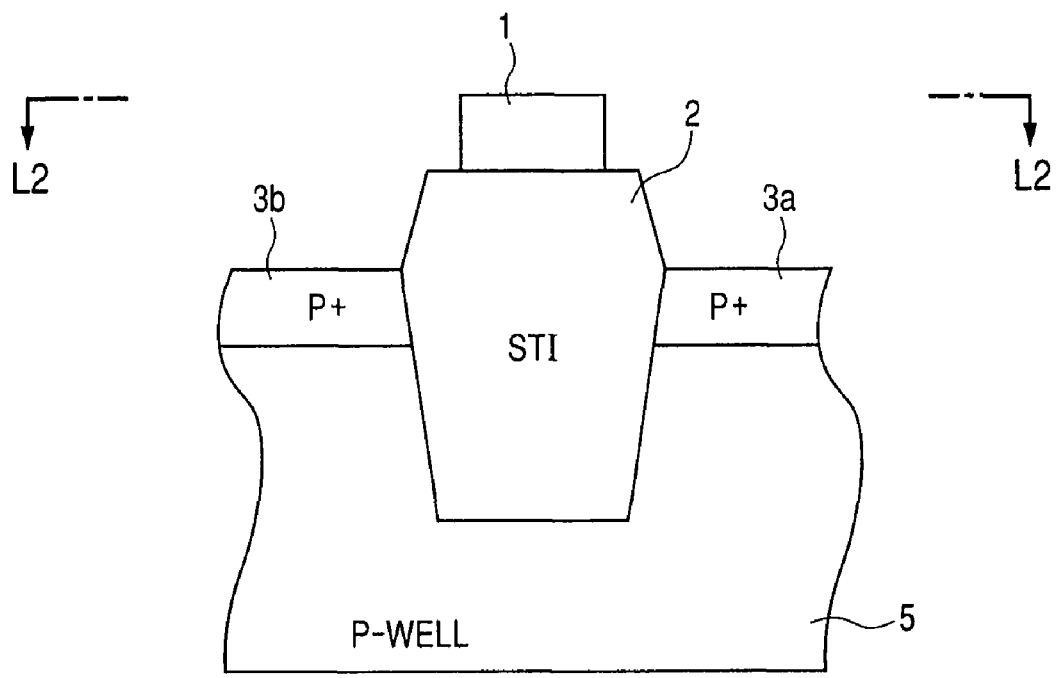
FIG. 2 is a view schematically showing a cross-sectional structure along the line L2-L2 shown in FIG. 1.

FIG. 2 is a view schematically showing a cross-sectional structure along the line L2-L2 shown in FIG. 1. In FIG. 2, the isolation film 2 is formed in the surface of a P-well 5, and high-concentration impurity regions 3a and 3b are disposed on the both sides of the isolation film 2. The high-concentration impurity regions 3a and 3b correspond to the high-concentration impurity region 3 shown in FIG. 1. Over the isolation film 2, the polysilicon resistive element 1 is disposed. To the P-well 5, a voltage is supplied through the high-concentration impurity region 3 (3a, 3b).

Figure 3:
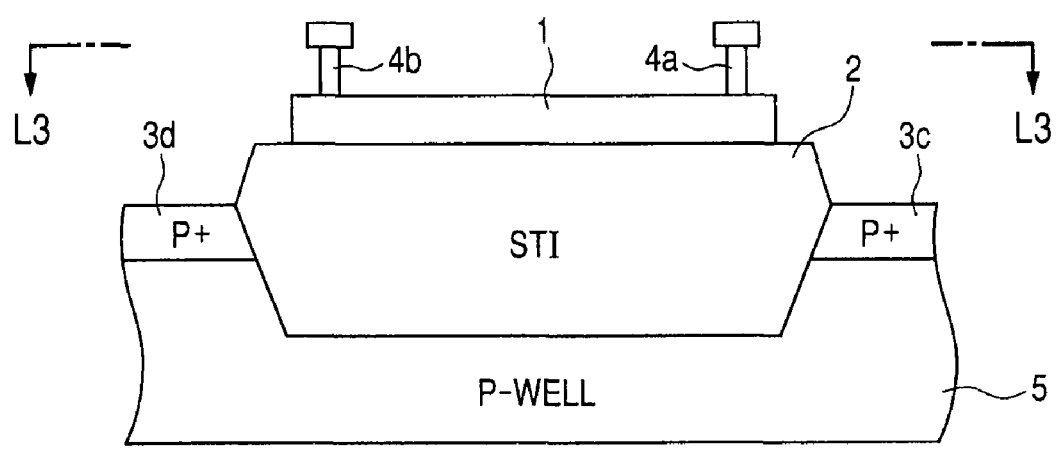
FIG. 3 is a view schematically showing a cross-sectional structure along the line L3-L3 shown in FIG. 1.

FIG. 3 is a view schematically showing a cross-sectional structure along the line L3-L3 shown in FIG. 1. As shown in FIG. 3, the isolation film 2 is formed in the surface of the P-well 5 also in the longitudinal direction of the polysilicon resistive element 1, and high-concentration impurity regions 3c and 3d are provided on the both sides of the isolation film 2 in the longitudinal direction of the polysilicon resistive element 1. The high-concentration impurity regions 3c and 3d correspond to the high-concentration impurity region 3 shown in FIG. 1. On the both ends of the resistive element 1, the contacts 4a and 4b are provided to electrically couple wiring and the resistive element.

As shown in FIGS. 2 and 3, the high-concentration impurity region 3 (3a to 3d) is disposed around the isolation film 2 to supply the voltage to the P-well 5 formed thereunder. In the case where the polysilicon resistive element 1 is formed, in a typical semiconductor integrated circuit device, the polysilicon resistive element 1 is formed in the same step as a step of forming the gate electrode of a MOS transistor (insulated-gate field effect transistor). The MOS transistor is formed in a semiconductor substrate region, and the resistive element 1 is also formed over the substrate region (well).

As miniaturization proceeds in a semiconductor integrated circuit device, the thickness of the isolation film (STI film) 2 is also reduced, and a voltage difference occurs between the polysilicon resistive element 1 and the P-well 5 in accordance with a voltage supplied to the polysilicon resistive element 1. It is expected that an electric field is formed in the isolation film 2, the electric field formed at the interface between the polysilicon resistive element 1 and the isolation film changes in accordance with the voltage applied to the resistive element 1, and the resistance value of the polysilicon resistive element 1 differs in accordance therewith (due to a change in a depletion layer or in a vertical electric field in the resistive element 1).

Figure 4:
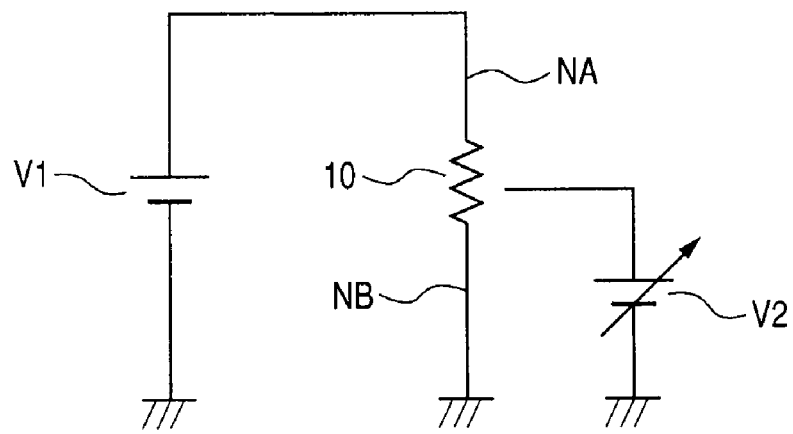
FIG. 4 is a view showing an example of a configuration for measuring the substrate voltage dependence of a resistor element used in the present invention.
Figure 10:
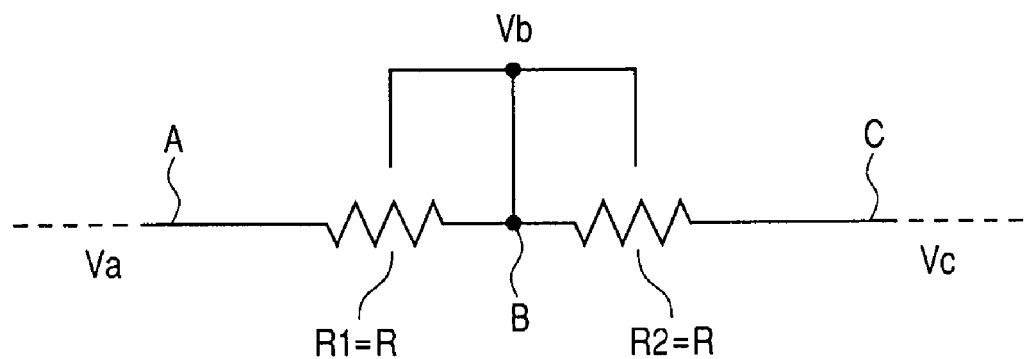
FIG. 10 is a view schematically showing a coupling form of the substrate of resistor elements according to Embodiment 2 of the present invention.

FIG. 4 is a view showing an example of a coupling configuration for measuring the substrate voltage dependence of a resistor element 10 using the polysilicon resistive element 1. In FIG. 10, the resistor element 10 has one end NA thereof which is supplied with a positive voltage from a power supply V1, and the other end NB thereof which is coupled to a ground node. To the substrate region (P-well) of the resistor element 10, a voltage from a variable power supply V2 is supplied. Here, by modeling the resistor 10 as a three-terminal element, a change in the resistance value thereof in response to the substrate voltage V2 is measured, and the dependence of the resistance value of the resistor 10 on a substrate potential is measured.

Figure 5:
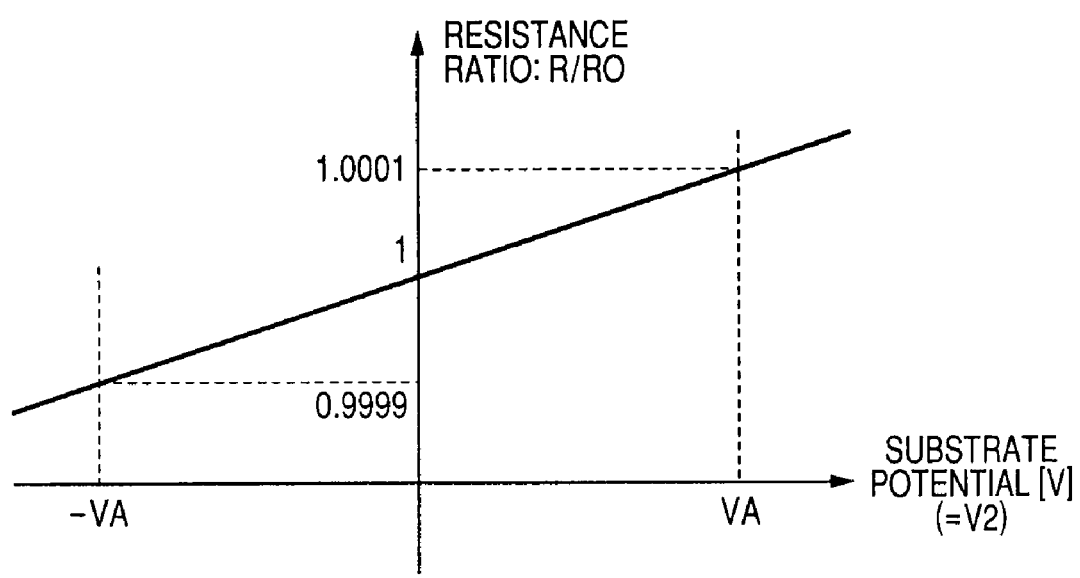
FIG. 5 is a view showing the substrate voltage dependence of the resistor element that has been measured with the measurement circuit shown in FIG. 4.

FIG. 5 is a view showing the relationship between the resistance value of the resistor element 10 and the substrate potential in the circuit shown in FIG. 4. In FIG. 5, the abscissa represents the substrate voltage (V2), and the ordinate represents the resistance ratio R/R0 of the resistor element 10. Here, the resistance value R0 is the resistance value of the resistor element 10 when the substrate voltage V2 is 0 V.

As shown in FIG. 5, as the substrate voltage changes from $-VA$ to $+VA$, the resistance ratio R/R0 substantially linearly changes from 0.9999 to 1.0001. In this case, a resistance value R of the resistor element 10 can be represented by the following expression by primary approximation: $R=R0(1+k \cdot Vx)$ wherein k represents a primary factor of the substrate voltage dependence, and Vx represents an average potential from the substrate (P-well) to the both end nodes of the resistor element, which is given by the following expression: $Vx=(V(NA)+V(NB))/2-V2$ wherein V(NA) and V(NB) represent respective potentials at the nodes NA and NB shown in FIG. 4.

In the three-terminal model of the resistor element 10, the substrate voltage dependence of the resistance value R is low, and hence a higher-order substrate voltage dependence factor can be ignored.

As shown in FIG. 5, the resistance value R of the resistor element 10 has a dependence on the substrate voltage V2, though the degree of dependence is low. Therefore, in a circuit in which the resistance value of the resistor element exerts influence on the operation characteristic thereof, distortion occurs due to the substrate voltage dependence and, when the circuit is applied to a circuit device in which high accuracy is required, the distortion becomes unignorable to degrade the reliability of the circuit device.

Figure 6:
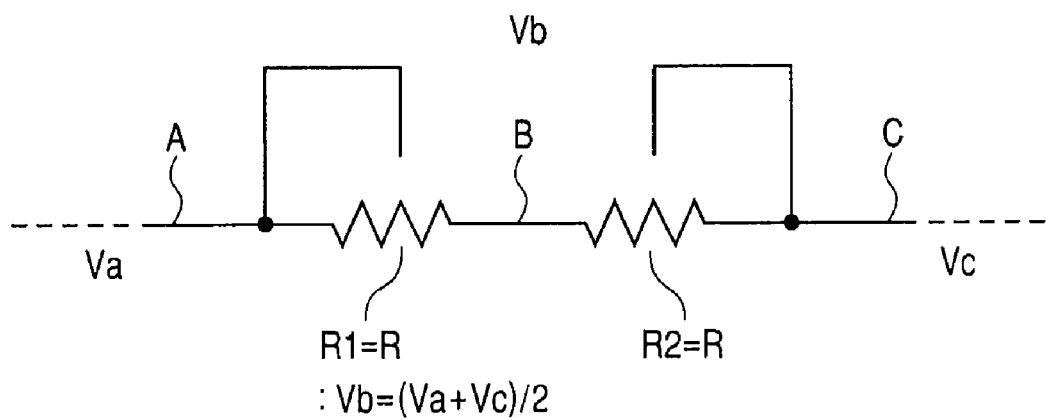
FIG. 6 is a view schematically showing a coupling form of the substrate of the resistor elements according to Embodiment 1.

FIG. 6 is a view schematically showing a configuration of a resistor circuit according to Embodiment 1. In FIG. 6, between nodes A and C, resistor elements R1 and R2 are coupled in series. Each of the resistor elements R1 and R2 has the equal resistance value R, formed of the same material, and has the same substrate voltage dependence. It is assumed now that respective voltages at the nodes A and C are Va and Vc. In this case, a voltage Vb at a coupling node B between the resistor elements R1 and R2 is given by the following expression: $Vb=(Va+Vc)/2$. In the resistor element R1, the substrate region (well) is electrically coupled to the node A, and the substrate voltage is set to the voltage Va. On the other hand, in the resistor element R2, the substrate region thereof is coupled to the node C, and the substrate voltage thereof is set to the voltage Vc.

In this case, an average potential Vx(AB) from the substrate between the nodes A and B is given by the following expression: $Vx(AB)=(Va+Vb)/2-Va=(-Va+Vc)/4$. On the other hand, an average potential Vx(BC) from the substrate between the nodes B and C is given by the following expression: $Vx(BC)=(Vb+Vc)/2-Vc=-(-Va+Vc)/4$. Thus, the average potentials $Vx(AB)$ and $Vx(BC)$ of the resistors R1 and R2 from the substrate have equal absolute values, and opposite signs.

Figure 7:
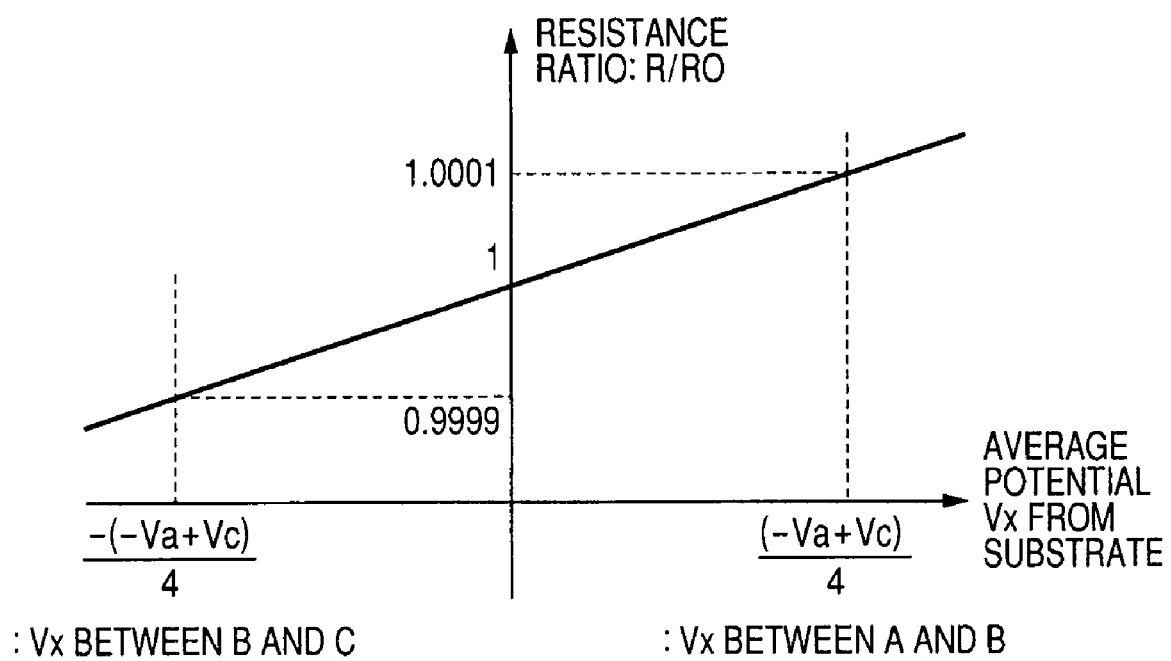
FIG. 7 is a view showing the substrate voltage dependence of each of the resistor elements shown in FIG. 6.

As a result, as shown in FIG. 7, changes in the respective resistance ratios of the resistor elements R1 and R2 in response to the average potential $Vx(AB)$ from the substrate between the nodes A and B and to the average potential $Vx(BC)$ from the substrate between the nodes B and C have equal values, and opposite signs. That is, when the resistor elements R1 and R2 and the average potentials $Vx(AB)$ and $Vx(BC)$ are substituted in the foregoing expression representing the substrate voltage dependence of the resistance value R of the resistor element, the following expressions are established for the resistor elements R1 and R2: $R1=R0(1+k\cdot Vx(AB))=R0(1+k\cdot((-Va+Vc)/4))$, and $R2=R0(1+k\cdot Vx(BC))=R0(1-k\cdot((-Va+Vc)/4))$. As can be seen from the foregoing expressions, the resistor elements R1 and R2 have the substrate voltage dependences of equal magnitudes, and the respective resistances thereof change in directions having opposite signs. Therefore, in a combined resistor R1+R2 formed of the resistor elements R1 and R2, the respective substrate voltage dependences of the resistor elements R1 and R2 are cancelled therebetween, and $R1+R2=2\cdot R0$ is derived from the foregoing expressions so that a resistor having a given value independent of the substrate voltage is implemented.

Figure 8:
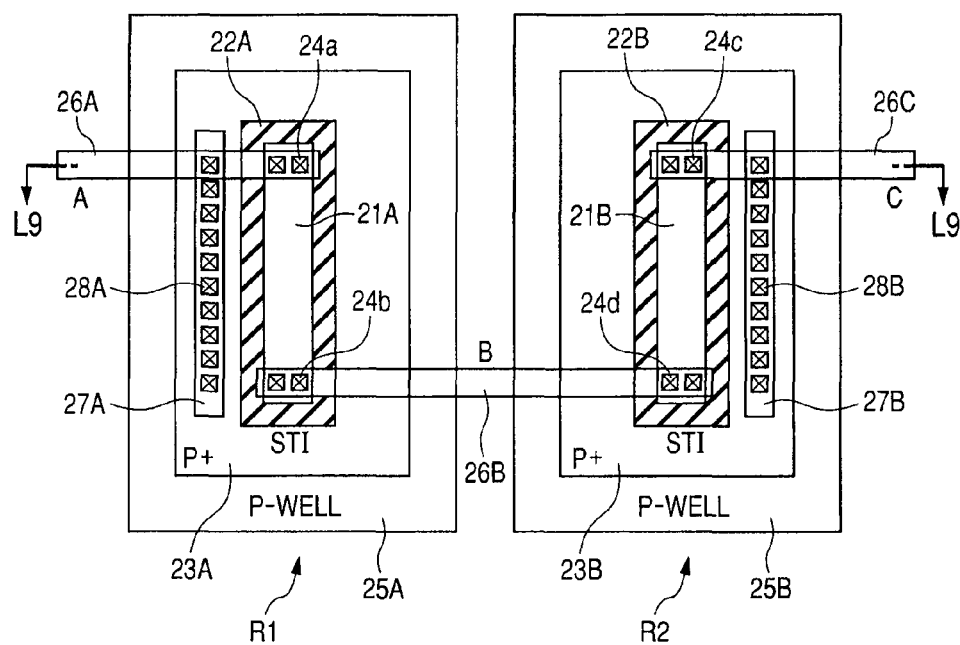
FIG. 8 is a view schematically showing a two-dimensional layout of the resistor elements shown in FIG. 6.

FIG. 8 is a view schematically showing a two-dimensional layout of the resistor elements R1 and R2 shown in FIG. 6. In FIG. 8, the resistor elements R1 and R2 are formed in a P-well 25A and a P-well 25B provided in separate relation. In the surface of the P-well 25A, a high-concentration P-type impurity region 23A is formed. An isolation film (STI film) 22A having a rectangular shape is formed so as to be surrounded by the high-concentration impurity region 23A. Over the isolation film 22A, a resistive element 21A formed of, e.g., polysilicon is disposed. The resistive element 21A is electrically coupled via contacts 24a to a coupling wire 26A formed of, e.g., a first metal wire. By the coupling wire 26A, one end of the resistor element is coupled to the node A.

On the outside of the isolation film 22A closer to the node A, a bias wire 27A formed of the first metal wire is disposed, and coupled (connected) to the coupling wire 26A. The bias wire 27A is coupled via contacts 28A to the high-concentration P-type impurity region 23A in an underlying layer. By the bias wire 27A, the substrate voltage of the resistor element R1 is set to a voltage level in accordance with the node A.

On the other hand, in the surface of the P-well 25B, an isolation film 22B having a rectangular shape is formed, and a high-concentration P-type impurity region 23B is disposed in the surface of the P-well 25B so as to surround the isolation film 22B. Over the isolation film 22B, a resistive element 21B formed of, e.g., polysilicon is disposed. The resistive elements 21A and 21B are formed to have the same shape and the same size, and have equal resistance values during application of no substrate voltage. The resistive element 21B is electrically coupled via contacts 24c to a coupling wire 26C formed of the first metal wire, and one end of the resistor element R2 is coupled to the node C.

On the outside of the isolation film 22B closer to the node C, a bias wire 27B formed of the first metal wire is disposed, and connected to the coupling wire 26C. The bias wire 27B is electrically coupled via contacts 28B to the high-concentration P-type impurity region 23B in an underlying layer. By the bias wire 27B, the voltage level of the substrate region (P-well 25B) is set to a voltage level at the node C so that the substrate voltage of the resistor element R2 is set.

The resistive elements 21A and 21B are electrically coupled via respective contacts 24b and 24d to a coupling wire 26B formed of the first metal wire, and coupled in series between the nodes A and C.

By electrically coupling the high-concentration impurity regions 23A and 23B and the bias wires 27A and 27B to each other, the voltages of the P-wells 25A and 25B forming the respective substrate regions of the resistor elements R1 and R2 are set to the respective voltage levels at the nodes A and C. The substrate voltages of the resistor elements R1 and R2 are on different voltage levels and, by disposing the P-wells 25A and 25B in mutually separate relation, it is possible to set the substrate voltages of the resistor elements R1 and R2 to the different voltage levels at the nodes A and C.

Additionally, by forming the bias wires 27A and 27B into the shapes of elongated rectangles in parallel with the resistive elements, it is possible to stably supply the voltages to the substrate regions (wells) 25A and 25B, circumvent the formation of voltage distributions in the substrate regions (wells) due to the resistances of the wells, and set the well voltages to the same voltage levels throughout the entire wells.

Figure 9:
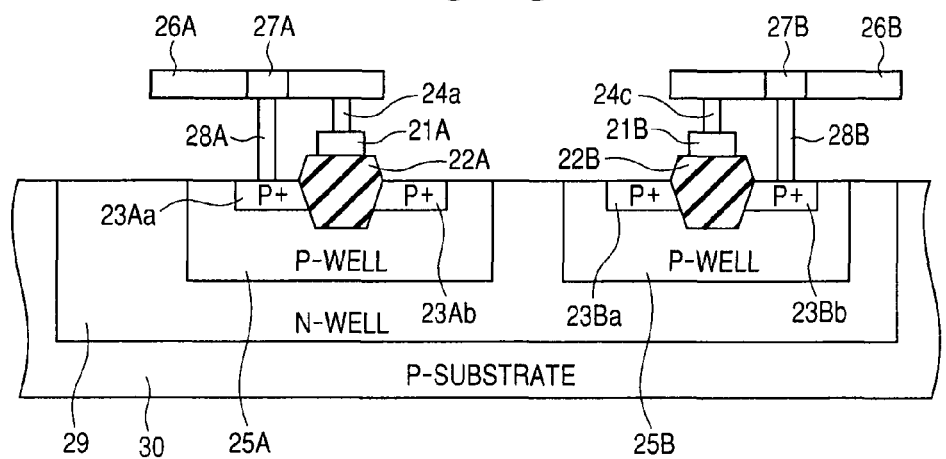
FIG. 9 is a view schematically showing a cross-sectional structure along the line L9-L9 shown in FIG. 8.

FIG. 9 is a view schematically showing a cross-sectional structure along the line L9-L9 shown in FIG. 8. In FIG. 9, an N-well 29 is formed over a P-type substrate 30. In the surface of the N-well 29, the P-wells 25A and 25B are disposed in separate relation. By the N-well 29, the P-wells 25A and 25B are separated, and the respective voltage levels thereof can be set individually.

In the surface of the P-well 25A, the isolation film 22A is formed, and the high-concentration P-type impurity region 23A (23Aa, 23Ab) is formed so as to surround the isolation film 22A. The high-concentration P-type impurity region 22A is electrically coupled via the contacts 28A to the bias wire 27A at an impurity region 22Aa included therein. The bias wire 27A is also electrically coupled to the first metal wire 26A (which is the wire in the same wiring layer, and the bias wire 27A and the first meal wire 26A are connected to each other). The coupling wire 26A is also electrically coupled via the contacts 24A to the resistive element 21A formed over the isolation film 22A.

On the other hand, in the surface of the P-well 25B, a high-concentration P-type impurity region 23B (23Ba, 23Bb) is disposed so as to surround the isolation film 22B. Over the isolation film 22B, the resistive element 21B formed of, e.g., polysilicon is disposed. The resistive element 21B is electrically coupled via the contacts 24c to the coupling wire 26C formed of the first metal wire. The high-concentration P-type impurity region 23B is electrically coupled via the contacts 28B to the bias wire 27B at the region 23Bb included therein. The bias wire 27B is formed of the first metal in the same wiring layer as that of the coupling wire 26B, and the bias wire 27B and the coupling wire 26B are connected to each other.

As shown in FIG. 9, by disposing the resistor elements R1 and R2 using a triple-well structure of the P-wells and the N-well, it is possible to individually dispose the respective substrate regions of the resistor elements R1 and R2 in separate relation, and individually set the respective substrate voltages thereof.

Note that, in FIG. 9, the P-wells 25A and 25B forming the respective substrate regions of the resistor elements R1 and R2 are separated from each other using the triple-well structure. However, there may be also used a configuration in which bottom N-wells are provided in respective layers underlying the P-wells 25A and 25B, and respective side N-type layers or trench isolation films are formed so as to surround the respective sidewalls of the P-wells 25A and 25B to separate the P-wells 25A and 25B.

Thus, according to Embodiment 1, the respective substrate regions of the resistor elements which are coupled in series to each other via the coupling node are coupled to the non-coupling nodes each opposing the coupling node. In this manner, the respective average voltages between the series-coupled resistor elements and the substrate regions of the resistor elements can be set to have the same magnitude, and mutually different signs. This allows changes in the resistances of the resistor elements to be cancelled therebetween irrespective of the potential of the input signal, and allows elimination of the substrate voltage dependences of the resistance values of the resistor elements.

Embodiment 2

FIG. 10 is a view showing the coupling of resistor elements according to Embodiment 2 of the present invention. In FIG. 10, the resistor elements R1 and R2 are coupled in series between the nodes A and C. The coupling node B between the resistor elements R1 and R2 is electrically coupled to the respective substrate regions of the resistor elements R1 and R2. Each of the resistor elements R1 and R2 has the equal resistance value R.

In a form of substrate voltage supply to the resistor elements R1 and R2 shown in FIG. 10, the average potentials Vx(AB) and Vx(BC) from the respective substrate regions of the resistor elements R1 and R2 are given by the following respective expressions.

Figure 11:
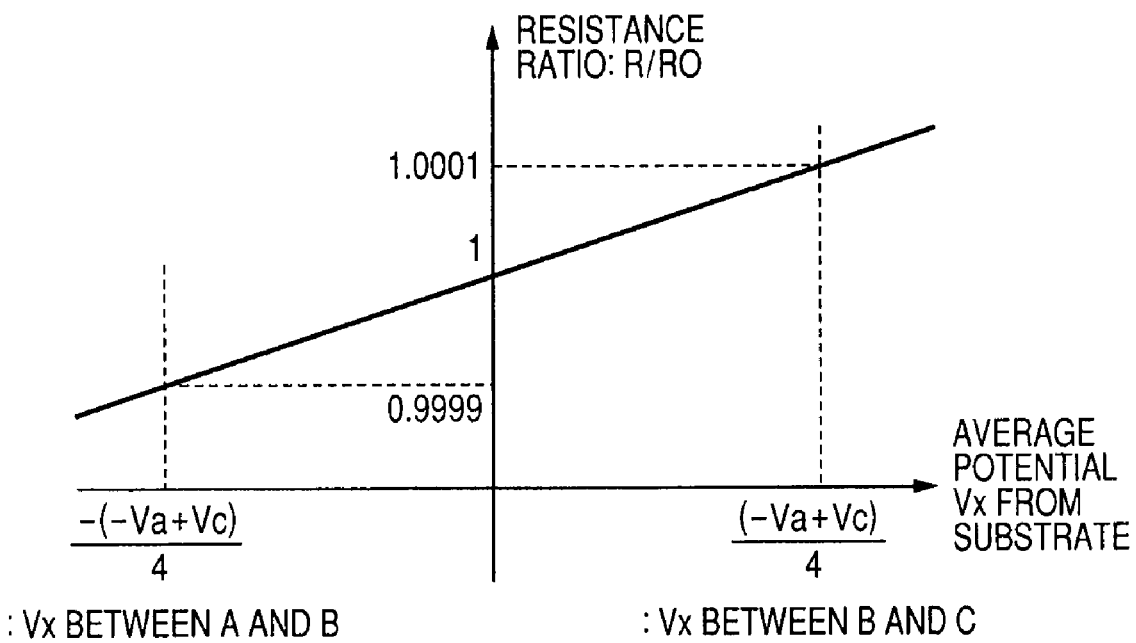
FIG. 11 is a view showing the substrate voltage dependence of each of the resistor elements shown in FIG. 10.

Average Potential from Substrate between nodes A and B: $Vx(AB)=(Va+Vb)/2-Vb=-(-Va+C)/4$. Average Potential from Substrate between nodes B and C: $Vx(BC)=(Vb+Vc)/-Vb=(-Va+Vc)/4$. Therefore, in the coupling form of the substrate regions of the resistor elements shown in FIG. 10, the average potential Vx(BC) from the substrate between the nodes BC and the average potential Vx(AB) from the substrate between the nodes AB are in the form reverse to that in Embodiment 1, but have equal absolute values and opposite signs, as shown in FIG. 11. As a result, the resistor elements R1 and R2 have equal resistance values during application of no substrate voltage so that the change rates of the resistance ratios accordingly have the same magnitudes and opposite signs. Therefore, in the coupling form shown in FIG. 10 also, it is possible to cancel out the substrate voltage dependence of the combined resistance 2·R of the resistor elements R1 and R2, and stably hold the resistance value between the nodes A and C at a given value independent of the substrate voltages.

Figure 12:
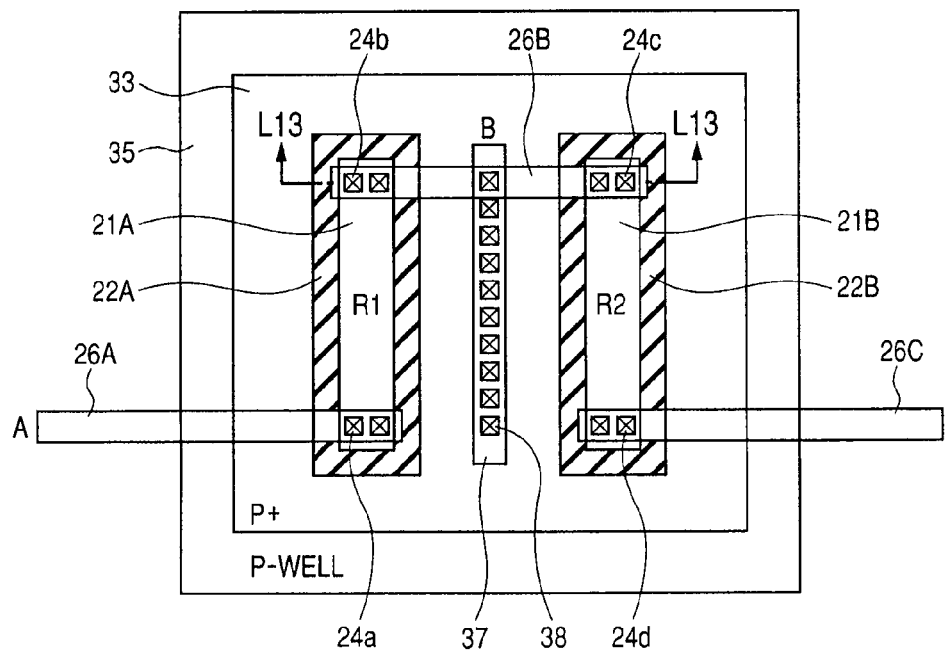
FIG. 12 is a view schematically showing a two-dimensional layout of the resistor elements shown in FIG. 10.

FIG. 12 is a view schematically showing a two-dimensional layout of the resistor elements shown in FIG. 10. In FIG. 12, a P-well 35 and a P-type high-concentration impurity region 33 are provided commonly to the resistor elements R1 and R2. In the surface of the P-well 35, isolation films 22A and 22B having the same rectangular shape are disposed in mutually spaced-apart relation. The isolation films (STI films) 22A and 22B are each surrounded by the high-concentration impurity region 33.

Over the isolation films 22A and 22B, the resistive elements 21A and 21B each having a rectangular shape and formed of polysilicon are respectively disposed. The resistive element 21A is electrically coupled via the contacts 24a to the coupling wire 26A. The resistive element 21B is electrically coupled via the contacts 24d to the coupling wire 26C. The resistive elements 21A and 21B are each electrically coupled to the coupling wire 26B via the respective contacts 24b and 24c, whereby the resistor elements R1 and R2 are coupled in series.

In the region between the isolation films 22A and 22B, in parallel with the resistive elements 21A and 21B, a bias wire 37 having a rectangular shape is disposed. The bias wire 37 is formed of, e.g., the first metal wire, and connected to the coupling wire 26B formed of the first metal wire. The bias wire 37 is electrically coupled via contacts 38 to the high-concentration impurity region 33. Between the isolation films 22A and 22B forming the resistor elements R1 and R2, the bias wire 37 is disposed to allow the potential at the coupling node B between the resistor elements R1 and R2 to be set to the respective substrate voltages of the resistor elements R1 and R2.

As the bias wire, only one bias wire is disposed commonly to the resistor elements R1 and R2. This allows a reduction in the layout area of a resistor circuit formed of the resistor elements R1 and R2. The well is also disposed commonly to the resistor elements R1 and R2. This obviates the need for a region for well separation, and allows a reduction in the layout area of the entire resistor elements R1 and R2.

Figure 13:
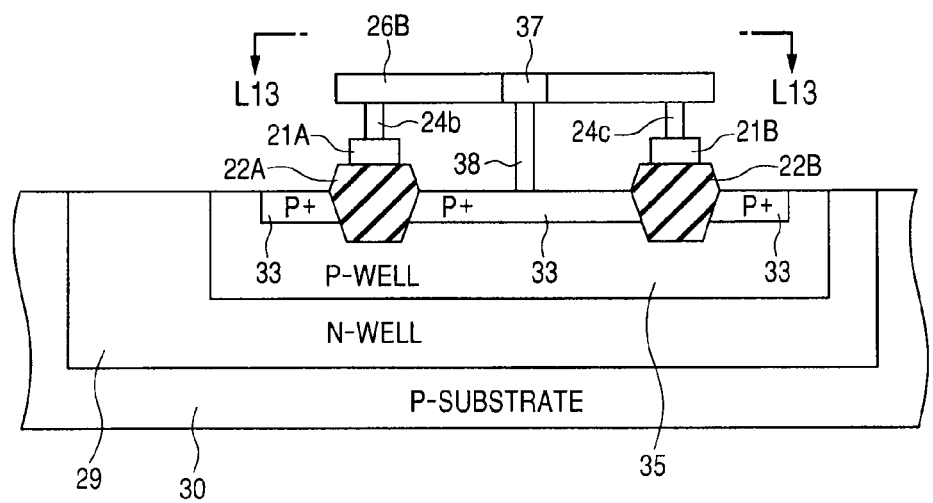
FIG. 13 is a view schematically showing a cross-sectional structure along the line L13-L13 shown in FIG. 12.

FIG. 13 is a view schematically showing a cross-sectional structure along the line L13-L13 shown in FIG. 12. In FIG. 13, the N-type well 29 is formed in the surface of the P-type substrate 30, and the P-well 35 is disposed in the N-well 29. In the surface of the P-well 35, the isolation films 22A and 22B are disposed in mutually spaced-apart relation. In the surface of the P-well 35, the high-concentration P-type impurity region 33 is formed so as to surround each of the isolation films 22A and 22B.

The resistive elements 21A and 21B each formed of polysilicon are respectively disposed over the isolation films 22A and 22B. The resistive elements 21A and 21B are electrically coupled via the respective contacts 24b and 24c to the coupling wire 26B. The coupling wire 26B is connected to the bias wire 37 at the region between the isolation films 22A and 22B. The bias wire 37 is electrically coupled via the contacts 38 to the high-concentration impurity region 33 disposed therebelow.

In the case of the configuration shown in FIG. 13, it is not necessary to separate the P-well for the respective resistive elements 21A and 21B so that a well separation region is unnecessary, and the bias wire is one. As a result, it is possible to further reduce the layout area of the entire resistor elements, and implement resistor elements which occupy a small area, and do not show a substrate voltage dependence as a whole.

Thus, according to Embodiment 2, the potential at the coupling node between the series-connected resistor elements is used as the substrate voltages. Accordingly, it is not necessary to dispose individual bias wires for the respective resistor elements coupled in series, and separate the substrate region (P-well), resulting in a reduction in layout area. Additionally, in the same manner as in Embodiment 1, it is possible to eliminate the substrate voltage dependence of the resistance value of the series-coupled resistor elements as a whole.

Embodiment 3

Figure 14:
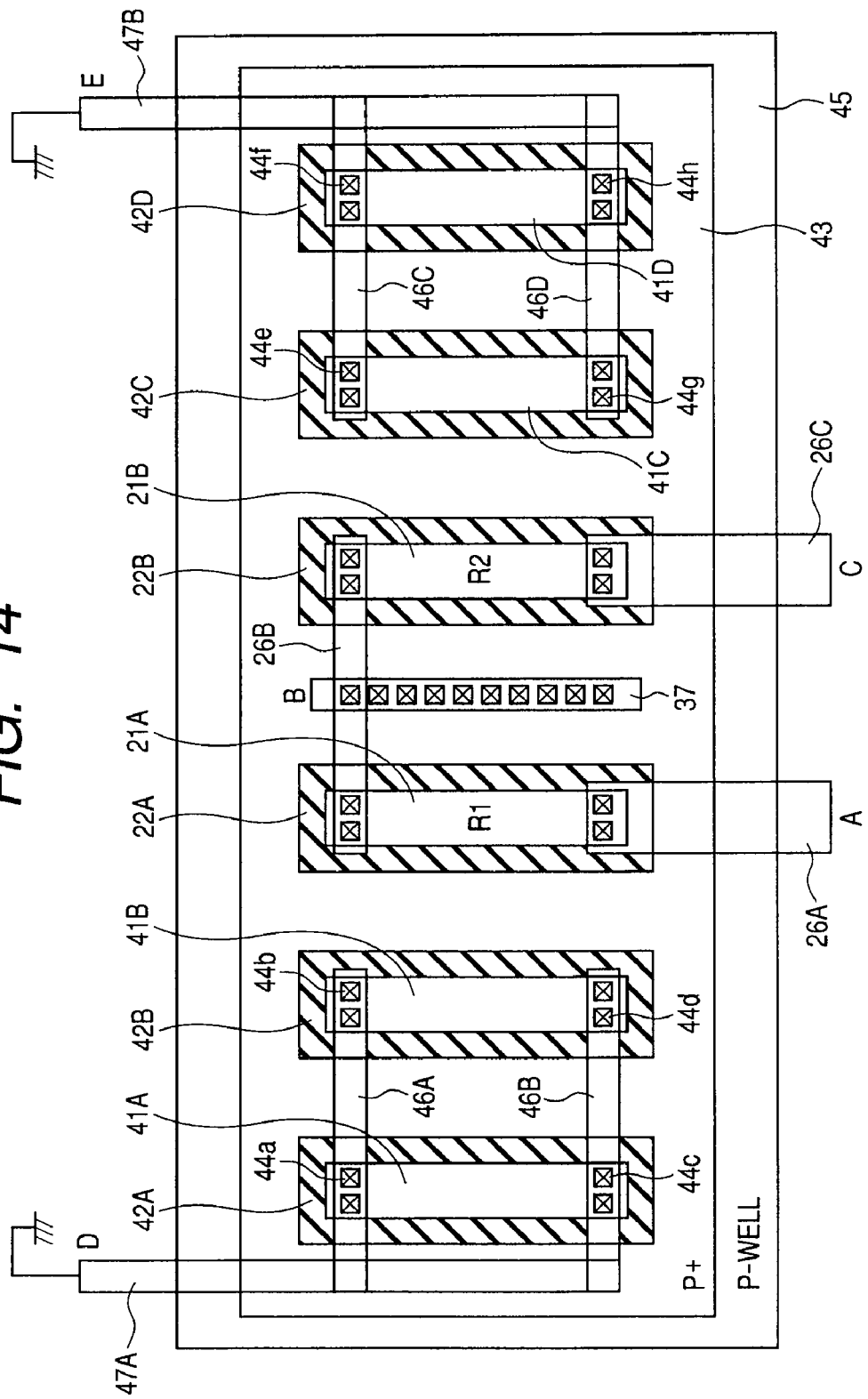
FIG. 14 is a view schematically showing a two-dimensional layout of resistor elements according to Embodiment 3 of the present invention.

FIG. 14 is a view schematically showing a two-dimensional layout of resistor elements according to Embodiment 3 of the present invention. In FIG. 14, the resistor elements R1 and R2 are coupled in series between the nodes A and B, and the potential at the coupling node B between the resistor elements R1 and R2 is transmitted to a P-well 45 through a high-concentration impurity region 42, in the same manner as in Embodiment 2. The two-dimensional layout of the resistor elements R1 and R2 is the same as the two-dimensional layout shown in FIG. 12 except that the coupling wires 26A and 26C extend in the longitudinal direction of the drawing. In FIG. 14, the portions of the resistor elements R1 and R2 corresponding to those in the two-dimensional layout shown in FIG. 12 are denoted by the same reference numerals, and a detailed description thereof is omitted.

In the two-dimensional layout shown in FIG. 14, at locations outside the isolation film 22A, isolation films 42A and 42B are further disposed in the surface of the P-well while, at locations outside the isolation film 22B, isolation films 42C and 42D are disposed in the surface of the P-well. The isolation films 42A to 42D and the isolation films 22A and 22B are disposed with the same pitch as that of the isolation films 22A and 22B forming the resistor elements and in the same shapes as those of the isolation films 22A and 22B, and also formed of the same materials as those of the isolation films 22A and 22B. Over the isolation films 42A to 42D, resistive elements 41A to 41D each formed of polysilicon are respectively disposed. The resistive elements 41A to 41D have the same shapes as those of the resistive elements 21A and 21B, and formed of the same materials as those of the resistive elements 21A and 21B.

The resistive elements 42A and 42B have respective one ends thereof which are coupled via contacts 44a and 44b to a dummy coupling wire 46A formed of the first metal wire, and the respective other ends thereof which are coupled via contacts 44c and 44d to a dummy coupling wire 46B. The dummy coupling wires 46A and 46B are coupled commonly to a wire 47A formed of, e.g., the first metal wire, and coupled to the ground node via a node D.

The resistive elements 41C and 41D are coupled commonly via contacts 44e and 44f to a dummy coupling wire 46C at respective one ends thereof, and coupled commonly via contacts 44g and 44h to a dummy coupling wire 46D at the respective other ends thereof. The dummy coupling wires 46C and 46D are each formed of the first metal wire, and connected commonly to a dummy wire 47B formed of the first metal wire. The coupling wire 47B is coupled to the ground node via a node E. The dummy coupling wires 46A and 46C, and the coupling wire 26B are formed of the same material and in the same shape, and equidistantly separated from each other.

In the case of the layout shown in FIG. 14, the resistive elements 41A, 41B, 41C, and 41D have the respective both ends thereof fixed to a ground voltage, and used as dummy elements. The dummy elements are disposed in the same pattern as that of the resistor elements R1 and R2 and with the same pitch as that of the resistor elements R1 and R2. Repeating the pattern with the dummy elements disposed inhibits the influence of mask displacement, patterning distortion in a peripheral portion, and the like during the manufacturing steps, so that the resistor elements R1 and R2 are patterned with high accuracy. By precise patterning of the resistive elements of the resistor elements R1 and R2 and the isolation films, it is possible to precisely implement the resistor elements having desired resistance values.

The substrate voltage dependences of the resistor elements R1 and R2 shown in FIG. 14 are the same as in the case of the configuration shown in Embodiment 2 so that a detailed description thereof is omitted.

Thus, according to Embodiment 3, the dummy elements are disposed in the same pattern as that of the series-coupled resistor of the resistor elements in adjacent relation to the outside of the region where the series-coupled resistor of the resistor elements is disposed. As a result, the regularity of the pattern with respect to the patterning of the resistor elements is maintained and, by precise patterning of the resistor elements R1 and R2, the resistor elements having desired resistance values can be implemented with high accuracy.

Embodiment 4

Figure 15:
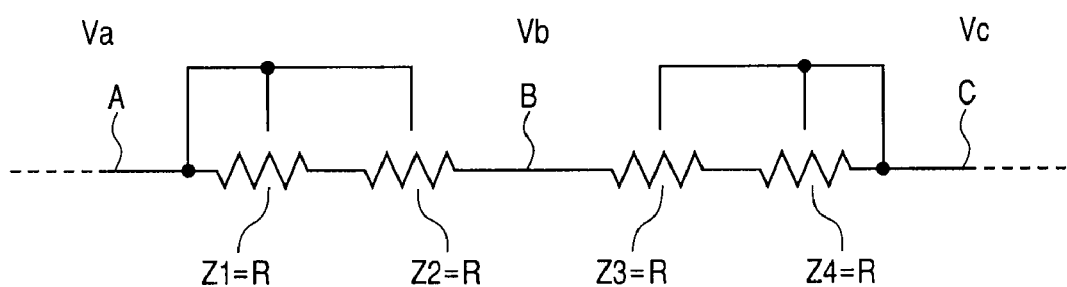
FIG. 15 is a view schematically showing a coupling form of the substrate of resistor elements according to Embodiment 4 of the present invention.

FIG. 15 is a view showing a coupling form of a resistor according to Embodiment 4 of the present invention. In FIG. 15, resistor elements Z1 and Z2 are coupled in series between the nodes A and B, and resistor elements Z3 and Z4 are coupled in series between the nodes B and C. The respective substrate regions of the resistor elements Z1 and Z2 are electrically coupled to the node A, and the respective substrate regions of the resistor elements Z3 and Z4 are electrically coupled to the node C. Each of the resistor elements Z1 to Z4 has the resistance value R.

The coupling form of the resistors shown in FIG. 15 is equivalent to a configuration obtained by dividing the resistor element R1 coupled between the nodes A and B into the resistor elements Z1 and Z2, and dividing the resistor element R2 coupled between the nodes B and C into the resistor elements Z3 and Z4. When it is assumed that the respective voltages at the nodes A, B, and C are Va, Vb, and Vc, and the resistance value of each of the resistor elements Z1 to Z3 is R, average potentials Vx(Z1), Vx(Z2), Vx(Z3), and Vx(Z4) are given by the following expressions: $Vx(Z1)=(-Va+Vb)/4$, $Vx(Z2)=3(-Va+Vb)/4$, $Vx(Z3)=3(Vb-Vc)/4$, and $Vx(Z4)=(Vb-Vc)/4$.

The voltage Vb at the node B is $(Va+Vc)/2$. When $(Va+Vc)/2$ is substituted in Vb in the foregoing expressions, the average potentials Vx(Z1) to Vx(Z4) shown in the foregoing expressions are transformed to the following expressions: $Vx(Z1)=(-Va+Vc)/8$, $Vx(Z2)=3(-Va+Vc)/8$, $Vx(Z3)=-3(Va+Vc)/8$, and $Vx(Z4)=-(Va+Vc)/8$.

As can be seen from the foregoing expressions, the average potentials from the substrate voltages of the resistor elements Z1 and Z4 have opposite signs and the same magnitude, and the average potentials from the substrate potentials of the resistor elements Z2 and Z3 have opposite signs and the same magnitude.

Therefore, when the resistance values of the resistor elements Z1 to Z4 are represented by primary approximation expressions, in a series-coupled resistor of the resistor elements Z1 to Z4, the respective substrate voltage dependences of the resistor elements Z1 and Z4 are cancelled therebetween, and the respective substrate voltage dependences of the resistor elements Z2 and Z3 are cancelled therebetween. As a result, in a resistor circuit in which the resistor elements Z1 to Z4 are coupled in series, the substrate voltage dependences of the respective resistance values of the resistor elements Z1 to Z4 are cancelled out, and the combined resistance value thereof is maintained at a resistance value when the average voltage from the substrate region is 0, i.e., during application of no substrate voltage.

Figure 16:
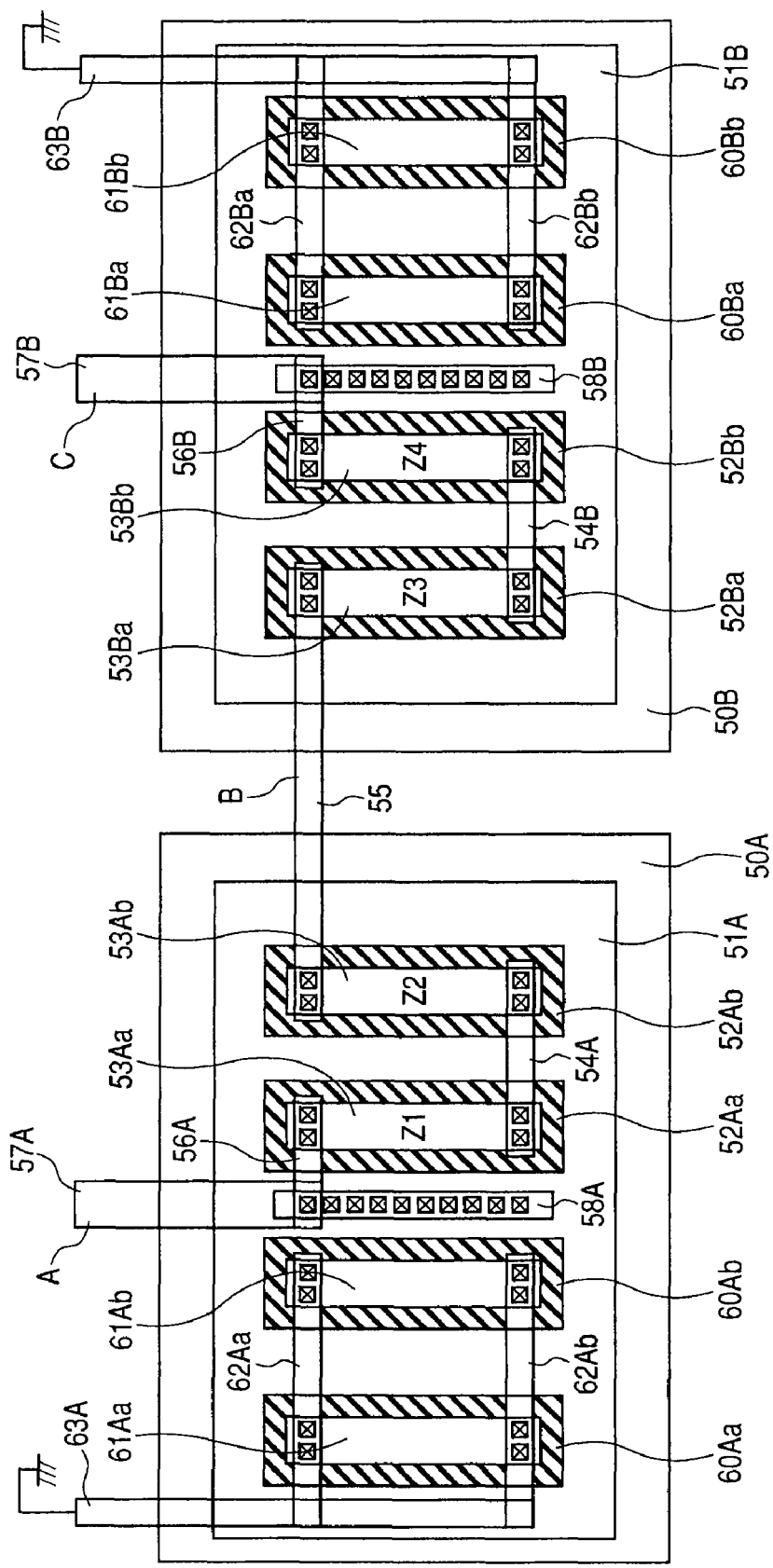
FIG. 16 is a view schematically showing a two-dimensional layout of the resistor elements shown in FIG. 15.

FIG. 16 is a view schematically showing a two-dimensional layout of the resistor elements shown in FIG. 15. In FIG. 16, the resistor elements Z1 and Z2 are formed over a P-well 50A, and the resistor elements Z3 and Z4 are disposed over a P-well 50B. The P-wells 50A and 50B are disposed in mutually separate relation. As a configuration for well separation, the same configuration as used in Embodiment 1 described above is used.

In the surface of the P-well 50A, isolation films 52Aa and 52Ab each having a rectangular shape are disposed in mutually spaced-apart relation. Over the isolation films 52Aa and 52Ab, resistive elements 53Aa and 53Ab each having a rectangular shape, and formed of polysilicon are respectively disposed. The resistive elements 53Aa and 53Ab are coupled to each other by a coupling wire 54A formed of the first metal wire at respective one ends thereof. The other end of the resistor 53Aa in the upper part of the drawing is coupled to a coupling wire 57A formed of the first metal wire via an internal coupling wire 56A. The coupling wire 57A is coupled to the node A.

On the outside of the isolation film 52Aa closer to the coupling wire 57A, a coupling bias wire 58A formed of the first metal wire is formed in a rectangular shape so as to be connected to the coupling wire 57A. The bias wire 58A is electrically coupled via contacts to a high-concentration impurity region 51A formed in the surface of the P-well 50A so as to surround the isolation film. As a result, the potential of the P-well 50A forming the substrate region of each of the resistor elements Z1 and Z2 is set to the voltage level at the node A.

In the P-well 50A, isolation films 60Aa and 60Ab and resistive elements 61Aa and 61Ab which have the same patterns (shapes, sizes, and materials) as those of the isolation films 52Aa and 52Ab and the resistive elements 53Aa and 53Ab are disposed. The resistive elements 61Aa and 61Ab are coupled to each other by dummy coupling wires 62Aa and 62Ab at the respective both ends thereof. The dummy coupling wires 62Aa and 62Ab are disposed in alignment with the internal coupling wires 56A and 54A. The dummy coupling wires 62Aa and 62Ab are coupled to a dummy coupling wire 63A. The dummy coupling wire 63A is coupled to the ground node.

In the same manner as the resistor elements Z1 and Z2 are disposed in the P-well 50A, in the P-well 50B also, isolation films 52Ba and 52Bb each having a rectangular shape are disposed in mutually separate relation, and resistive elements 53Ba and 53Bb are disposed over the isolation films 52Ba and 52Bb. The resistive element 53Ba is coupled to the resistive element 53Ab via a coupling wire 55. The resistive elements 53Ba and 53Bb are also coupled to each other by a coupling wire 54B at the lower ends thereof in the drawing so that the resistor elements Z3 and Z4 are coupled in series.

The other end (the upper end in the drawing) of the resistor 53Bb is coupled to a coupling wire 57B via a coupling wire 56B, each formed of the first metal wire. A bias wire 58B is formed of the first metal wire so as to be connected to the coupling wire 57B. The bias wire 58B is electrically coupled via contacts to a high-concentration P-type impurity region 51B formed therebelow so that the P-well 50B of the substrate region is set to the voltage level at the node C.

Isolation films 60Ba and 60Bb and resistive elements 61Ba and 61Bb are disposed in the same patterns as those of the isolation films 52Ba and 52Bb and the resistive elements 53Ba and 53Bb, and formed of the same materials as those of the isolation films 52Ba and 52Bb and the resistive elements 53Ba and 53Bb. The resistive elements 61Ba and 61Bb are electrically coupled to each other by dummy coupling wires 62Ba and 62Bb at opposing ends thereof (the upper ends and the lower ends in the drawing). The dummy coupling wires 62Ba and 62Bb are also electrically coupled to a dummy coupling wire 63B. The dummy coupling wire 63B is coupled to the ground node. The dummy coupling wires 62Ba and 62Bb are respectively arranged in alignment with the internal coupling wires 56B and 54A.

The resistive elements 53Ab and 53Ba are coupled to each other by the coupling wire 55 formed of the first metal wire at the respective upper ends thereof in the drawing.

In the two-dimensional layout shown in FIG. 16, the dummy elements which maintain the regularity of the pattern with the resistive elements 61Aa and 61Ab formed over the isolation films 60Aa and 60Ab and with the resistive elements 61Ba and 61Bb formed over the isolation films 60Ba and 60Bb are disposed as so-called shape dummy elements. In the P-wells 50A and 50B, the so-called shape dummy elements are disposed to inhibit pattern displacement for the resistor elements Z1 to Z4, and implement precise resistance values.

As shown in FIG. 16, even when resistor elements are subdivided into subdivision resistor elements having smaller resistance values, by forming the subdivision resistor elements which correspond to one resistor in the same well, and commonly setting the voltages of the substrate regions of the subdivision resistor elements, it is possible to cancel out the substrate voltage dependence of a combined resistance when the subdivision resistor elements are all coupled in series (when there are equal numbers of the respective subdivision resistor elements having the substrate voltage dependences of opposite characteristics), and implement the resistor elements having respective resistance values free from substrate voltage dependences.

Embodiment 5

Figure 17:
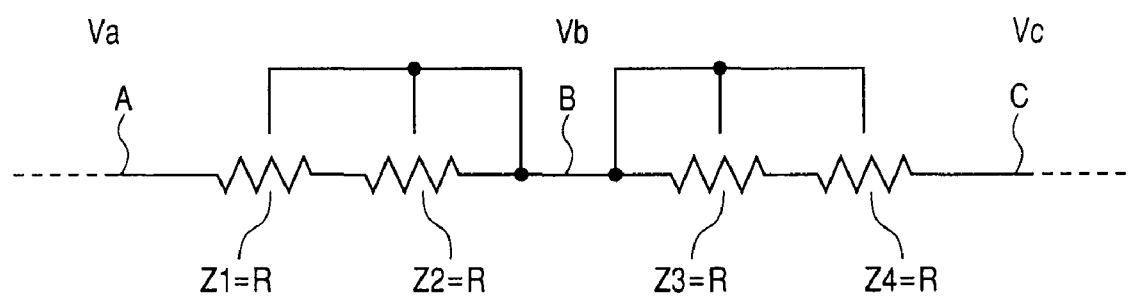
FIG. 17 is a view schematically showing a coupling form of the substrate of resistor elements according to Embodiment 5 of the present invention.

FIG. 17 is a view showing a coupling form of resistor elements according to Embodiment 5 of the present invention. In FIG. 17, the resistor elements Z1 and Z2 are coupled in series between the nodes A and B, and the resistor elements Z3 and Z4 are coupled in series between the nodes B and C. The respective substrate regions of the resistor elements Z1 and Z2 are electrically coupled to the node B, and the respective substrate regions of the resistor elements Z3 and Z4 are electrically coupled to the node B. Each of the resistor elements Z1 to Z4 has the equal resistance value R.

It is assumed now that the voltages at the nodes A, B, and C are Va, Vb, and Vc. In this case, the voltage Vb is equal to (Va+Vc)/2. The average potentials Vx(Z1) to Vx(Z4) from the respective substrate regions of the resistor elements Z1 to Z4 are respectively given by the following expressions: Vx(Z1) =3(Va−Vc)/8, Vx(Z2)=(Va−Vc)/8, Vx(Z3)=−(Va−Vc)/8, and Vx(Z4)=(−3)·(Va−Vc)/8.

Thus, the average potentials from the substrate regions of the resistor elements Z1 and Z4 have the same magnitude and the opposite signs, and the average potentials from the substrate regions of the resistor elements Z2 and Z3 have the same magnitude and the opposite signs. As a result, the substrate voltage dependences of the respective resistance values of the resistor elements Z1 and Z2 are cancelled by the substrate voltage dependences of the respective resistance values of the resistor elements Z3 and Z4. Therefore, in the case of the coupling shown in FIG. 17 also, the substrate voltage dependence of the combined resistance value of a resistor circuit formed of the resistor elements Z1 to Z4 is cancelled out.

Figure 18:
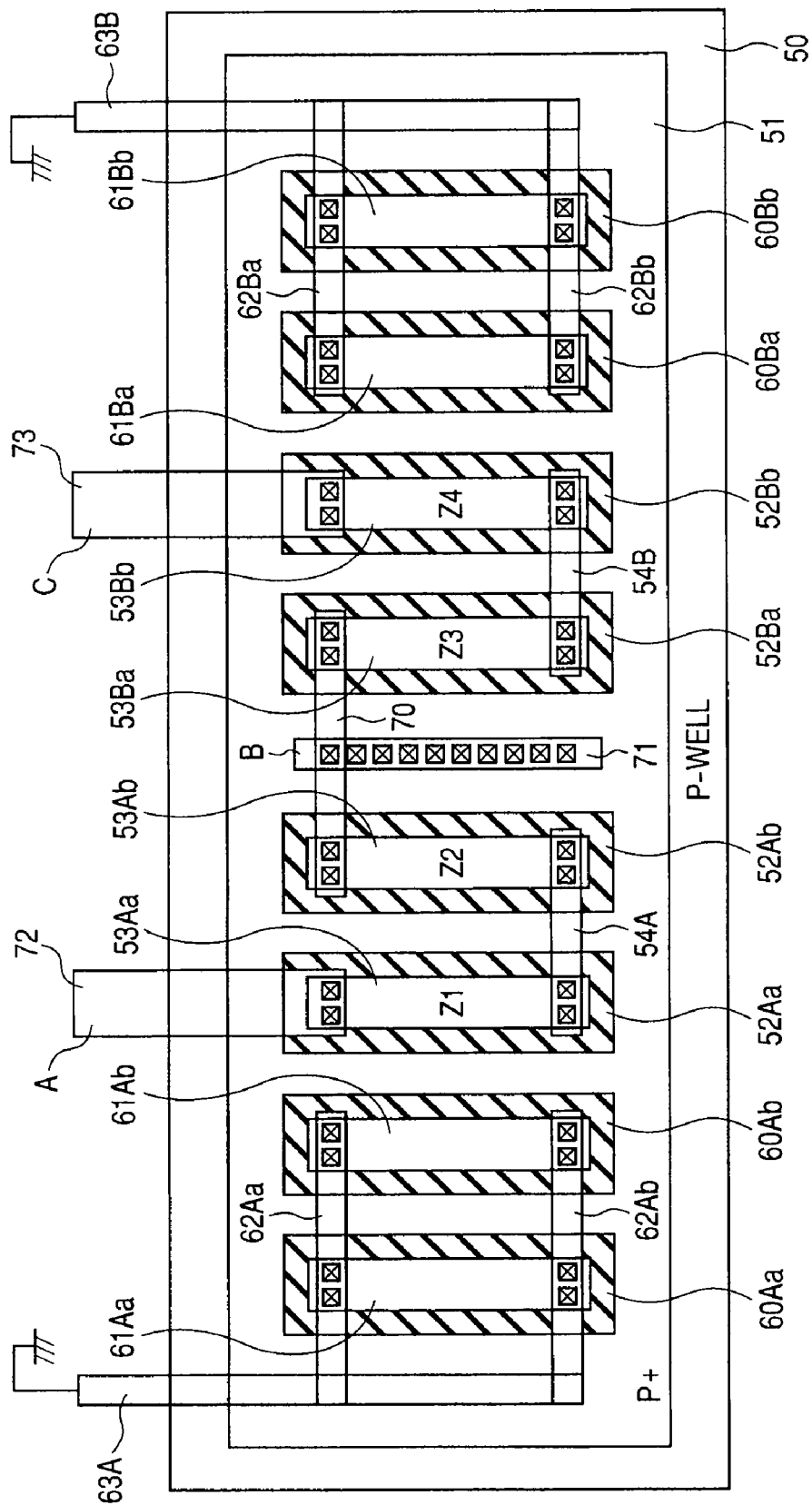
FIG. 18 is a view schematically showing a two-dimensional layout of the resistor elements shown in FIG. 14.

FIG. 18 is a view schematically showing a two-dimensional layout of the resistor elements shown in FIG. 17. The two-dimensional layout shown in FIG. 18 is different from the two-dimensional layout of the resistor elements shown in FIG. 16 in the following point. That is, a P-well 50 and a high-concentration impurity region 51 are disposed commonly to the resistor elements Z1 to Z4. The resistive elements 53Ab and 53Ba formed over the isolation films 52Ab and 52Ba corresponding to the respective resistor elements Z2 and Z3 are coupled to each other by a coupling wire 70 formed of the first metal wire at respective one ends thereof. A bias wire 71 connected to the coupling wire 70, and formed of the first metal wire is disposed between the isolation films 53Ab and 53Bb. The bias wire 71 is electrically coupled via contacts to the high-concentration impurity region 51 disposed in an underlying layer.

The resistor elements Z1 and Z4 have respective one ends thereof which are respectively coupled to coupling wires 72 and 73 coupled to the respective nodes A and C, and each formed of the first metal wire. The coupling wires 72 and 73 are electrically coupled via contacts to the respective resistive elements 52Aa and 52Bb.

The layout of the resistor elements shown in FIG. 18 is otherwise the same as that of the resistor elements shown in FIG. 16 so that a detailed description thereof is omitted by providing the corresponding parts with the same reference numerals.

As shown in FIG. 18, the bias wire 71 is disposed between respective regions where the resistor elements Z2 and Z3 are formed, and the resistor elements Z1 to Z4 and the shape dummy elements are disposed in the common P-well 50. Accordingly, in this layout also, in the same manner as described above in Embodiment 2, the layout area of the P-well 50 can be reduced. In addition, by subdividing the resistor elements to the subdivision resistor elements having smaller resistance values, and coupling the plural (even number of) subdivision resistor elements Z1 to Z4 in series, it is possible to implement a resistor circuit having a desired resistance value, and a sufficiently-hidden substrate voltage dependence.

By using the subdivision resistor elements as unit resistors, it is possible to implement a resistor element having a required resistance value. The number of the subdivision resistor elements forming one resistor element is not limited to 2. It is sufficient that there are even numbers of subdivision resistor elements having respective substrate voltage dependences opposite to each other.

Embodiment 6

Figure 19:
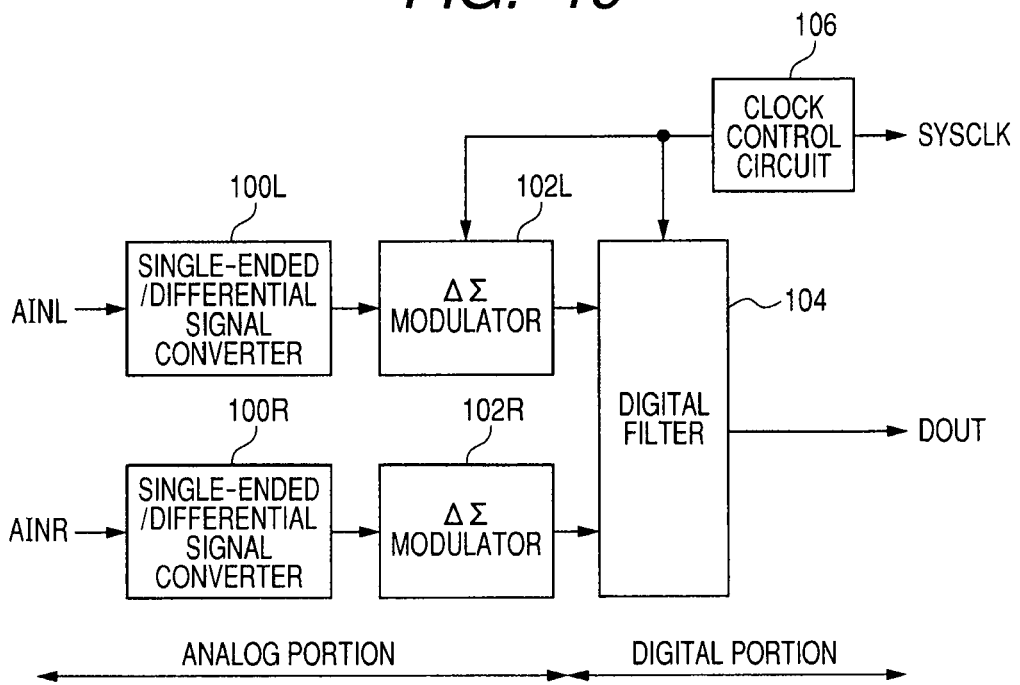
FIG. 19 is a block diagram showing a configuration of a ΔS analog/digital conversion circuit to which resistor elements according to the present invention are applied.

FIG. 19 is a block diagram schematically showing a configuration of a ΔS analog/digital conversion circuit for audio processing to which a resistor circuit including the resistor elements according to the present invention is applied. In FIG. 19, the ΔS analog/digital conversion circuit includes single-ended/differential signal converters 100L and 100R provided respectively for analog input signals AINL and AINR, ΔS modulators 102L and 102R provided respectively for the single-ended/differential signal converters 100L and 100R, and a digital filter 104 which performs a filtering process with respect to respective output signals from the ΔS modulators 102L and 102R to generate a digital signal DOUT.

The analog input signals AINL and AINR are single-ended L-channel/R-channel analog input signals. By converting the single-ended analog input signals to differential signals with the single-ended/differential signal converters 100L and 100R, the amplitudes of the input signals are increased, and in-phase noise such as power supply noise is cancelled out to improve signal quality.

The ΔS modulators 102L and 102R perform ΔS modulation with respect to the respective differential signals given thereto to generate digital signals. The ΔS modulators 102L and 102R perform a process of determining the difference between the analog input signals and the output signals quantized in a previous cycle, and integrating and then requantizing the differential signals to convert the analog input signals to the digital signals. The ΔS modulators 102L and 102R perform oversampling at an increased sampling rate, and noise shaping to shift a noise component to a high-frequency region.

The ΔS modulators 102L and 102R may generate either a 1-bit output data string or a multi-bit digital data string. The order or degree of each of the ΔS modulators 102L and 102R is determined appropriately depending on an application thereof.

The digital filter 104 passes the low-frequency component of the data string from each of the ΔS modulators 102L and 102R, while removing high-frequency noise. The digital filter 104 also performs a decimation process of decimating the output signals from the ΔS modulators 102L and 102R to reduce the sampling rate, and generate the digital signal.

To the digital filter 104 and to the ΔS modulators 102L and 102R, a clock signal is given from a clock control circuit 106. The clock control circuit 106 generates the necessary clock signal in accordance with a system clock SYSCLK. To inhibit a quantization noise component, in accordance with the internal clock signal from the clock control circuit 106, the ΔS modulators 102L and 102R perform a ΔS modulating operation at a sampling rate higher than a required sampling rate. The digital filter 104 removes the noise component shifted to a high-frequency component (noise shaping), and also reduces the sampling rate.

Typically, in order to perform ΔS modulation with high accuracy, differential signals are used, and a differential amplifier is used in each of the single-ended/differential signal converters 100L and 100R.

Figure 20:
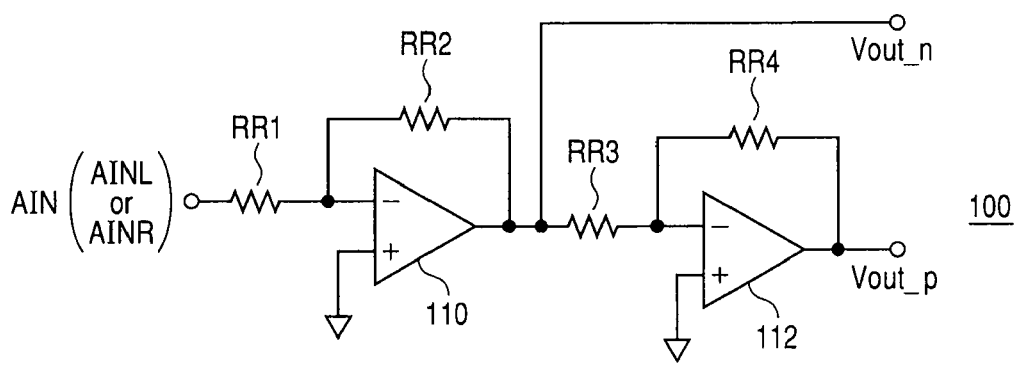
FIG. 20 is a view showing an example of a configuration of each of the single-ended/differential signal converters shown in FIG. 19.

FIG. 20 is a view schematically showing an example of a configuration of each of the single-ended/differential-signal converters 100L and 100R shown in FIG. 19. In FIG. 20, the single-ended/differential signal converter 100 (100L or 100R) includes two cascade-coupled inverting amplifiers (op-amps: operational amplifiers) 110 and 112. The op-amp 110 receives an analog input signal AIN (AINL or AINR) at the negative input thereof via a resistor element RR1, and the output of the op-amp 110 is coupled to the negative input thereof via a resistor element RR2. The positive input of the op-amp 110 is coupled to a reference voltage source (bias voltage source: In FIG. 20, the ground is shown as the reference voltage source).

The op-amp 112 receives an output signal from the op amp 110 at the negative input thereof via a resistor element RR3, and the output and negative inputs of the op-amp 112 are coupled to each other via a resistor element RR4. The positive input of the op-amp 112 is coupled to the reference voltage source.

The respective resistance values of the resistor elements RR1 to RR4 are the same. From the op-amp 110, an internal analog signal Vout_n in opposition to that of the analog input signal AIN is generated. From the op-amp 112, an internal analog signal Vout_p in phase to that of the analog input signal AIN is generated.

Each of the op-amps 110 and 112 executes an inverting amplifying operation of invertingly amplifying an input signal given thereto. In this case, to equalize the amplification factors (amplitudes) of the differential signals Vout_n and Vout_p, it is necessary to precisely set the amplification factors of the op-amps 110 and 112 to −1. In this case, the amplification factors A of the op-amps 110 and 112 are given by −(RR2/RR1) and −(RR4/RR3).

Figure 21:
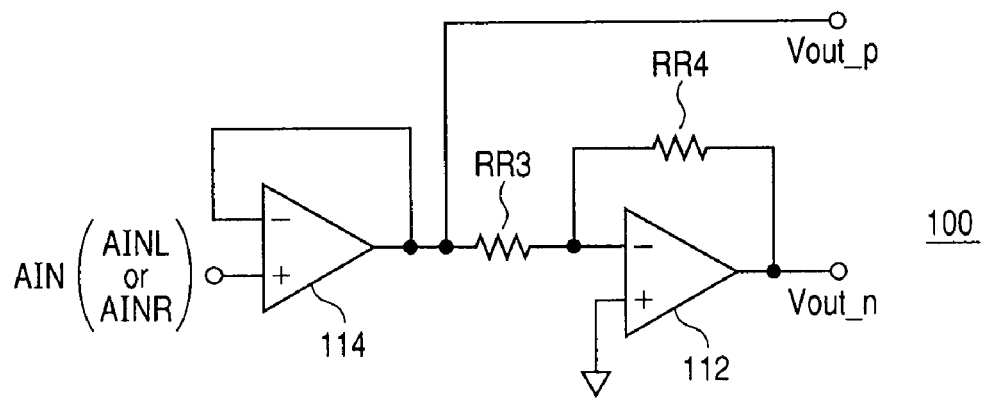
FIG. 21 is a view schematically showing a configuration of a variation of each of the single-ended/differential signal converters shown in FIG. 19.

FIG. 21 is a view schematically showing another configuration of the single-ended/differential-signal converters 100L and 100R shown in FIG. 19. The single-ended/differential signal converter 100 (100L, 100R) shown in FIG. 21 has the configuration which is different from that of the single-ended/ differential signal converter 100 shown in FIG. 20 in the following point. That is, a first-stage op-amp 114 has the negative input and output thereof which are coupled by a wire, while the op-amp 112 has the same configuration as that of the op-amp 112 shown in FIG. 24.

The op-amp 114 has the negative input and output thereof which are coupled to each other by the wire, and receives the analog input signal AIN at the positive input thereof. The op-amp 114 operates as a so-called voltage follower, and generates the internal analog signal Vout_p in accordance with the analog input signal AIN. Accordingly, in the case of the configuration shown in FIG. 21, the output signal from the op-amp 112 is the internal analog signal Vout_n in phase to that of the analog input signal AIN, unlike in the configuration shown in FIG. 24.

In this case also, to equalize the amplitudes of the differential signals Vout_p and Vout_n, it is necessary to precisely set the amplification factor thereof to 1.

Figure 22:
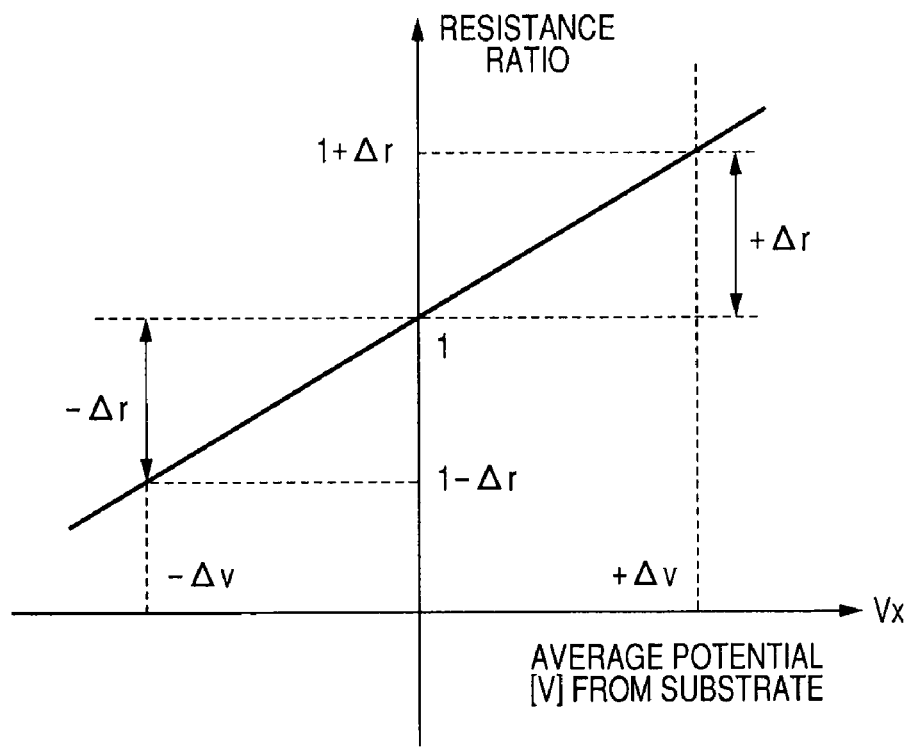
FIG. 22 is a view showing the substrate voltage dependence of each of the input resistor and the feedback resistor shown in FIGS. 20 and 21.

FIG. 22 is a view schematically showing the substrate voltage dependence of each of the resistor elements RR1 to RR4 of the inverting amplifier. In FIG. 22, the abscissa represents an average potential from the substrate region to the resistor element, and the ordinate represents a resistance ratio. When the average potential from the substrate gets higher by $+\Delta V$, the resistance ratio increases by $+\Delta r$. On the other hand, when the average potential changes by $-\Delta V$, the resistance ratio similarly changes by $-\Delta r$.

Therefore, when the resistance values have substrate potential dependences in, e.g., each of the op-amps 110 and 112 shown in FIG. 20, the amplification factor changes as follows.

When the level of the input signal is higher than a voltage from the reference voltage source, the average potential from the substrate region of the input resistor is positive, while the average potential from the substrate region of the feedback resistor is negative. Accordingly, the amplification factor (gain) is $-(R(0)-\Delta r)/(R(0)+\Delta r)$ wherein R(0) represents a resistance value when the average potential from the substrate of the resistor element is zero, i.e., during application of no substrate voltage.

On the other hand, when the level of the input signal is lower than the voltage from the reference voltage source, the average potential from the substrate of the input resistor is negative, while the average potential from the substrate of the feedback resistor is positive. Accordingly, the amplification factor is $-(R(0)+\Delta r)/(R(0)-\Delta r)$.

As a result, when the resistor elements RR1 to RR4 have the substrate voltage dependences, a problem arises that the amplification factors cannot be precisely maintained at −1, and precise differential signals cannot be generated to result in the occurrence of distortion in $\Delta S$ modulation. To prevent the problem, the coupling of the resistor elements in any of Embodiments 1 to 5 described above is applied to the input resistor RR1 and RR2 and the feedback resistor RR3 and RR4 of the inverting amplifiers (differential amplifiers) included in the single-ended/differential signal converters 100L and 100R.

Figure 23:
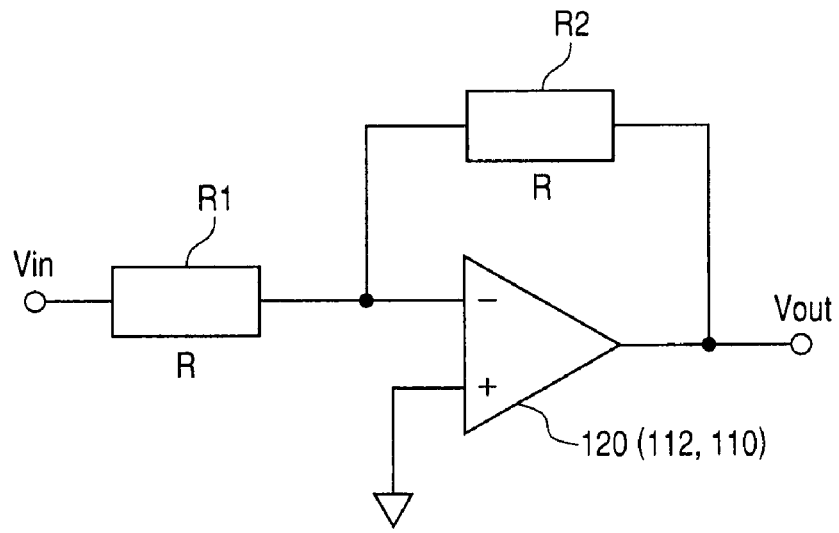
FIG. 23 is a view schematically showing a configuration of an amplification circuit according to Embodiment 6 of the present invention.

FIG. 23 is a view schematically showing a coupling form of the resistor elements of the op-amp according to Embodiment 6. To the negative input of the op-amp 120, an analog input signal Vin is given via the resistor element R1, and the output of the op-amp 120 is coupled to the negative input thereof via the resistor element R2. The op-amp 120 is either of the op-amps 110 and 112 shown in FIGS. 20 and 21. The resistor elements R1 and R2 are the input resistor and feedback resistor of either of the op-amps 110 and 112 shown in FIGS. 20 and 21.

To the resistor elements R1 and R2, a coupling form of the resistor elements in any of Embodiments 1 to 5 described above is applied. As a result, the substrate voltage dependences of the respective resistance values of the resistor elements R1 and R2 are hidden, and the amplification factor −(R2/R1) becomes a prescribed value of "−1" to allow the elimination of the substrate voltage dependence of the amplification factor. Therefore, it is possible to implement a LS modulation analog/digital converter which can perform LS modulation with high accuracy, and performs analog/digital conversion with reduced distortion.

Note that the configuration of the inverting amplifier shown in FIG. 23 is not limited to the application to the LS modulation analog/digital converter for audio processing shown in FIG. 19. The configuration of the inverting amplifier shown in FIG. 23 is also applicable to a typical inverting amplifier.

Embodiment 7

Figure 24:
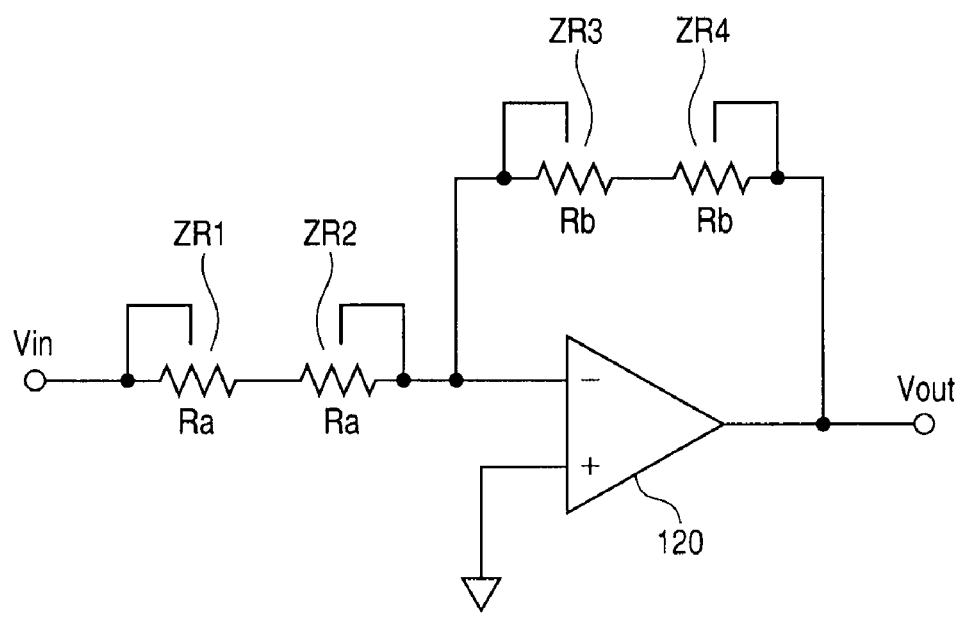
FIG. 24 is a view showing a configuration of an amplification circuit according to Embodiment 7 of the present invention.

FIG. 24 is a view schematically showing a configuration of coupling of an amplification circuit according to Embodiment 7 of the present invention. In FIG. 24, to the negative input of the op-amp 120, the input signal Vin is given via a series-coupled resistor of resistor elements ZR1 and ZR2. The output of the op-amp 120 is coupled to the negative input thereof via a series-coupled resistor of resistor elements ZR4 and ZR3, and the positive input of the op-amp 120 is coupled to the reference voltage source. That is, the input resistor is formed of the series-coupled resistor of the resistor elements ZR1 and ZR2, and the feedback resistor is formed of the series-coupled resistor of the resistor elements ZR3 and ZR4.

To the substrate region of the resistor element ZR1, the input signal Vin is supplied. To the substrate region of the resistor element ZR2, the potential at the negative input node of the op-amp 120 is supplied.

On the other hand, to the substrate region of the resistor element ZR4, an output signal Vout is supplied. The substrate region of the resistor element ZR3 is coupled to the negative input of the op-amp 120.

In the layout shown in FIG. 24, each of the resistor elements ZR1 and ZR2 has a resistance value Ra, and each of the resistor elements ZR3 and ZR4 has a resistance value Rb. In this case, the op-amp 120 operates as an inverting amplifier, and the amplification factor Av thereof is −(Rb/Ra).

In the coupling of the resistor elements ZR1 to ZR4 shown in FIG. 24, the resistor elements ZR1 and ZR2 have resistance values equal to each other, and the resistor elements ZR3 and ZR4 also have resistance values equal to each other. Accordingly, the respective resistance values of the resistor elements ZR1 and ZR2 forming the input resistor have the substrate voltage dependences of the same magnitude in opposite directions. Also, the respective resistance values of the resistor elements ZR3 and ZR4 forming the feedback resistor have the substrate voltage dependences of the same magnitude in opposite directions. As a result, even when the potential levels of the input signal Vin and the output signal Vout vary, in each of the input resistor formed of the series-coupled resistor of the resistor elements ZR1 and ZR2 and the feedback resistor formed of the series-coupled resistor of the resistor elements ZR3 and ZR4, the respective substrate voltage dependences of the resistance values Ra and Rb are made invisible. As a result, the substrate voltage dependence of the gain (amplification factor) of the op-amp 120 is eliminated, and an amplifying operation with reduced distortion can be performed.

Variation 1 of Embodiment 7

Figure 25:
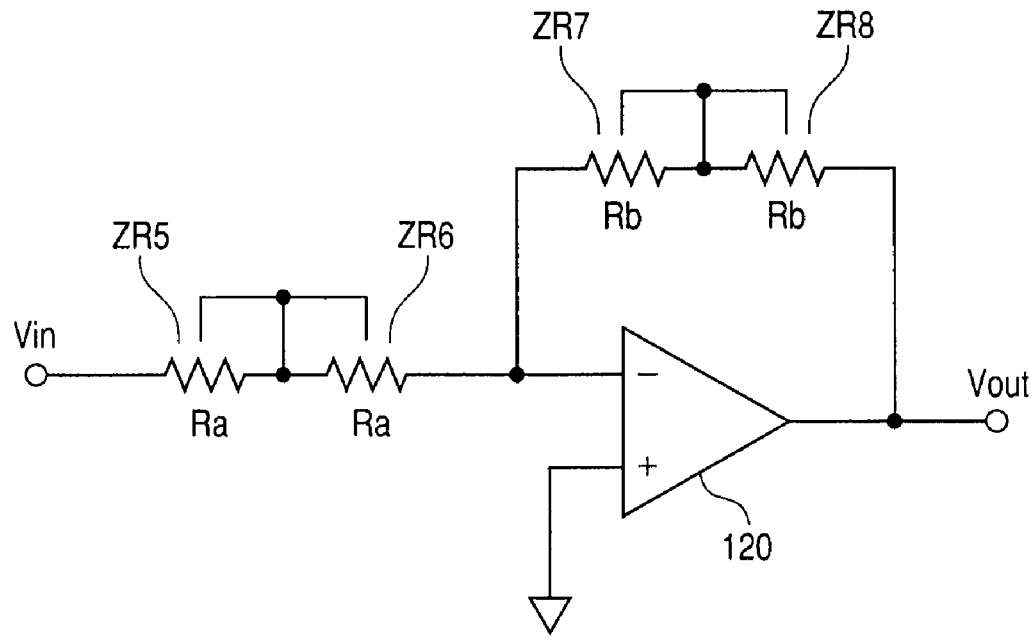
FIG. 25 is a view showing Variation 1 of the amplification circuit according to Embodiment 7.

FIG. 25 is a view schematically showing a configuration of an amplification circuit of a variation of Embodiment 7. In FIG. 25, the negative input of the op-amp 120 receives the input signal Vin via the series-coupled resistor of resistor elements ZR5 and ZR6, and the output of the op-amp 120 is coupled to the negative input thereof via a series-coupled resistor of resistor elements ZR8 and ZR7. The positive input of the op-amp 120 is coupled to the reference voltage source. The series-coupled resistor of the resistor elements ZR5 and ZR6 forms the input resistor, and the series-coupled resistor of the resistor elements ZR7 and ZR8 forms the feedback resistor. The op-amp 120 operates as the inverting amplifier.

The substrate regions of the resistor elements ZR5 and ZR6 are coupled to the coupling node between the resistor elements ZR5 and ZR6. The substrate regions of the resistor elements ZR7 and ZR8 are coupled to the coupling node between the resistor elements ZR7 and ZR8. Each of the resistor elements ZR5 and ZR6 has the resistance value Ra, and each of the resistor elements ZR7 and ZR8 has the resistance value Rb.

In the case of the coupling configuration of the resistor elements ZR5 to ZR8 shown in FIG. 25, even when the input signal Vin changes, and the output signal Vout changes in response thereto, the substrate voltage dependences of the respective resistance values of the resistor elements ZR5 and ZR6 are cancelled therebetween, and the substrate voltage dependences of the respective resistance values of the resistor elements ZR7 and ZR8 are also cancelled therebetween. Therefore, in the coupling configuration shown in FIG. 25 also, the amplification factor of the op-amp 120 can be maintained at the given value −(Rb/Ra) independent of the substrate voltage.

Variation 2 of Embodiment 7

Figure 26:
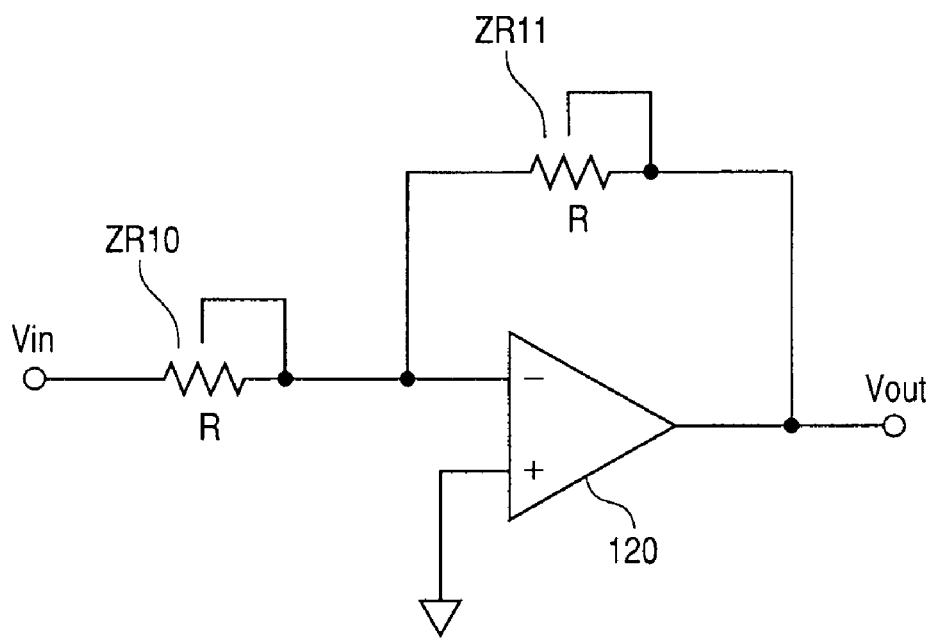
FIG. 26 is a view showing Variation 2 of the amplification circuit according to Embodiment 7.

FIG. 26 is a view schematically showing a configuration of an amplification circuit according to Variation 2 of Embodiment 7. In FIG. 26, the op-amp 120 receives the input signal Vin at the negative input thereof via a resistor element ZR10, and the output of the op-amp 120 is coupled to the negative input thereof via a resistor element ZR11. The substrate region of the resistor element ZR10 is coupled to the negative input of the op-amp 120. The substrate region of the resistor element ZR11 is coupled to the output node of the op-amp 120. Each of the resistor elements ZR10 and ZR11 has the resistance value R.

In the configuration shown in FIG. 26, the op-amp 120 operates as the inverting amplifier. The input signal Vin and the output signal Vout are signals in opposite phases, and the resistance values of the resistor elements ZR10 and ZR11 show substrate voltage dependences in the same direction. Accordingly, the amplification factor of the op-amp 120 is $-(R(0)+\Delta r)/(R(0)+\Delta r)$ or $-(R(0)-\Delta r)/(R(0)-\Delta r)$, the influence of a resistance varying component $\Delta r$ resulting from the substrate voltage dependence is cancelled, and the amplification factor of the op-amp 120 is maintained constant at −1 irrespective of the substrate voltage. Note that R(0) represents the resistance value of each of the resistor elements ZR10 and ZR11 during application of no substrate voltage, i.e., when the average potential from the substrate is 0.

Variation 3 of Embodiment 7

Figure 27:
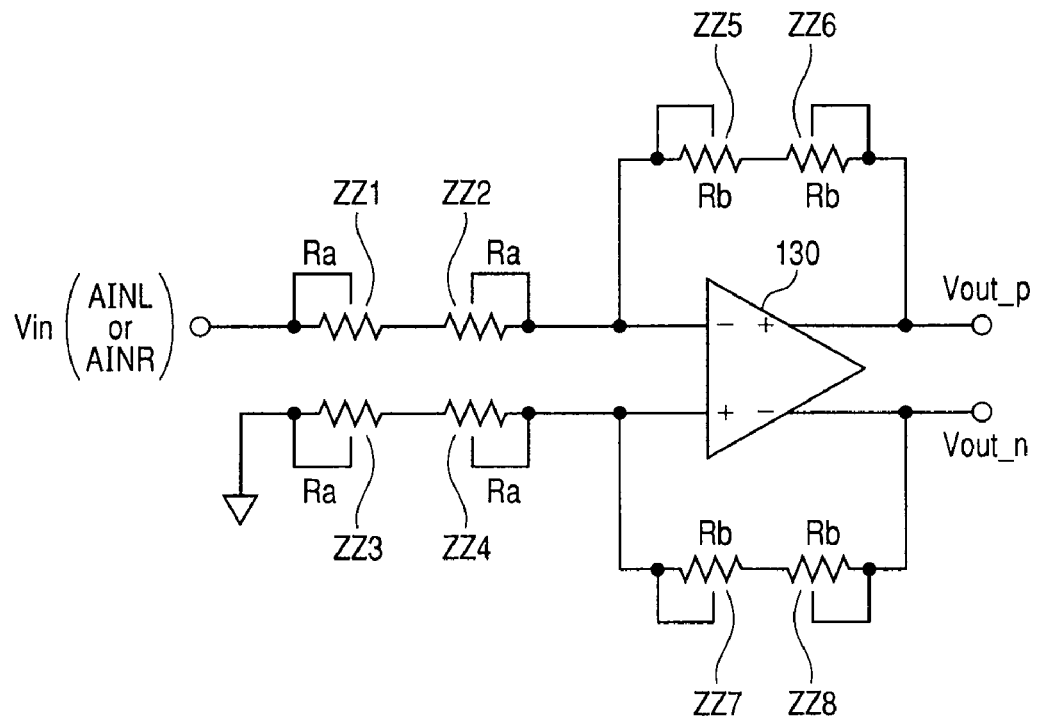
FIG. 27 is a view showing Variation 3 of the amplification circuit according to Embodiment 7.

FIG. 27 is a view schematically showing a configuration of an amplification circuit of Variation 3 of Embodiment 7. In FIG. 27, a fully differential amplifier 130 has positive and negative inputs, and positive and negative outputs. The negative input of the fully differential amplifier 130 receives an input signal via a series-coupled resistor of resistor elements ZZ1 and ZZ2. The positive output of the fully differential amplifier 130 is coupled to the negative input thereof via a series-coupled resistor of resistor elements ZZ6 and ZZ5. The positive input of the fully differential amplifier 130 is coupled to the reference voltage source via a series-coupled resistor of resistor elements ZZ4 and ZZ3. The negative output of the fully differential amplifier 130 is coupled to the positive input thereof via a series-coupled resistor of resistor elements ZZ8 and ZZ7. Each of the resistor elements ZZ1 to ZZ4 has the resistance value Ra, and each of the resistor elements ZZ5 to ZZ8 has the resistance value Rb.

The substrate region of the resistor element ZZ1 is coupled to the node of a signal input. The substrate region of the resistor element ZZ2 is coupled to the negative input of the fully differential amplifier 130. The substrate region of the resistor element ZZ3 is coupled to the reference voltage source. The substrate region of the resistor element ZZ4 is coupled to the positive input of the fully differential amplifier 130. The substrate region of the resistor element ZZ5 is coupled to the negative input of the fully differential amplifier 130. The substrate region of the resistor element ZZ6 is coupled to the positive input of the fully differential amplifier 130. The substrate region of the resistor element ZZ7 is coupled to the positive input of the fully differential amplifier 130. The substrate region of the resistor element ZZ8 is coupled to the negative output of the fully differential amplifier 130.

In the case of the configuration shown in FIG. 27, in each of the series-coupled resistor of the resistor elements ZZ1 and ZZ2, the series-coupled resistor of the resistor elements ZZ3 and ZZ4, the series-coupled resistor of the resistor elements ZZ5 and ZZ6, and the series-coupled resistor of the resistor elements ZZ7 and ZZ8, the substrate regions of the resistor elements are coupled such that the substrate voltage dependences of the respective resistance values thereof are canceled out in the series-coupled resistor of the resistor elements. Accordingly, in the fully differential amplifier 130 also, the amplification factor (gain) with respect to signals from the positive and negative outputs can be set to the value −(Rb/Ra) independent of the substrate voltage.

In the case of the fully differential amplifier shown in FIG. 27, when the reference voltage source is assumed to be the ground, the output signal thereof is given by the following expressions: Vout_p−Vout_n=(Rb/Ra)Vin, Vout_p=(1/2)·Vin·(Rb/Ra), and Vout_n=−(1/2)·Vin·(Rb/Ra). As is obvious from the foregoing expressions, the substrate voltage dependences of the respective resistance values Ra and Rb of the input resistor and the feedback resistor are hidden. Therefore, the gain can be maintained constant without depending on the substrate voltage, and the differential signals can be precisely generated from the input signals.

Note that, in the configuration shown in FIG. 27, the analog input signals AINL and AINR to the ΔS analog/digital converter for audio processing are shown as an example of the input signal Vin. Therefore, as a differential amplifier which performs single-ended/differential signal conversion within the single-ended/differential signal converter shown in FIG. 19, the differential amplifier shown in FIG. 27 may also be used.

Variation 4 of Embodiment 7

Figure 28:
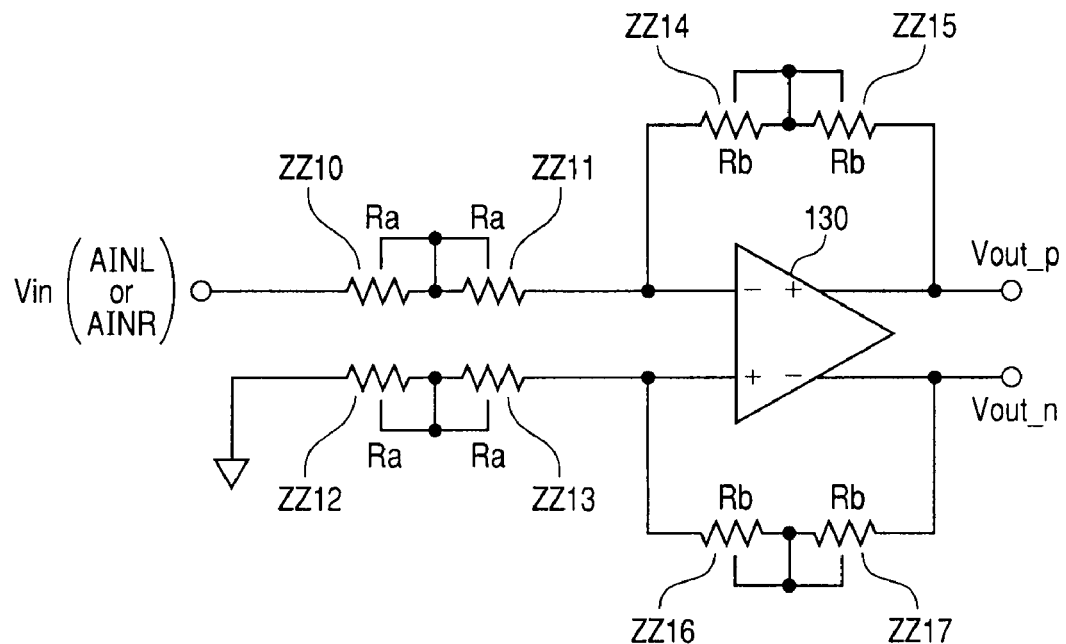
FIG. 28 is a view showing Variation 4 of the amplification circuit according to Embodiment 7.

FIG. 28 is a view schematically showing a configuration of an amplification circuit of Variation 4 of Embodiment 7. In the amplification circuit shown in FIG. 28, instead of the resistor elements ZZ10 to ZZ17 shown in FIG. 27, the resistor elements ZZ1 to ZZ8 are used. Coupling to the fully differential amplifier 130 is the same as in the configuration of the fully differential amplifier shown in FIG. 27 except for coupling of the substrate regions of the resistor elements ZZ10 to ZZ17.

The substrate regions of the resistor elements ZZ10 and ZZ11 are coupled to the coupling node between the resistor elements ZZ10 and ZZ11. The substrate regions of the resistor elements ZZ12 and ZZ13 are coupled to the coupling node between the resistor elements ZZ12 and ZZ13. The substrate regions of the resistor elements ZZ14 and ZZ15 are coupled to the coupling node between the resistor elements ZZ14 and ZZ15. The substrate regions of the resistor elements ZZ16 and ZZ17 are coupled to the coupling node between the resistor elements ZZ16 and ZZ17. Each of the resistance values of the resistor elements ZZ10 to ZZ 13 is Ra, and each of the resistance values of the resistor elements ZZ14 to ZZ 17 is Rb.

In the coupling configuration shown in FIG. 28 also, the substrate regions are coupled such that the substrate voltage dependences of the respective resistance values of the resistor elements are canceled out in each of the series-coupled resistor of the resistor elements ZZ10 and Z11, the series-coupled resistor of the resistor elements ZZ12 and ZZ13, the series-coupled resistor of the resistor elements ZZ14 and ZZ15, and the series-coupled resistor of the resistor elements ZZ16 and ZZ17. Accordingly, in the same manner as in the configuration shown in FIG. 27, the amplification factor of the fully differential amplifier 130 can be maintained at the given value of Vout_p−Vout_n=−(Rb/Ra) without being influenced by the substrate voltage.

When the resistance values Ra and Rb are equal to each other, the differential amplifier shown in FIG. 27 can be used as the differential amplifier which performs single-ended/differential signal conversion within the single-ended/differential signal converter shown in FIG. 19. In FIG. 28, to show an application to the single-ended/differential signal conversion, the analog input signals AINL and AINR are shown as input signals.

Variation 5 of Embodiment 7

Figure 29:
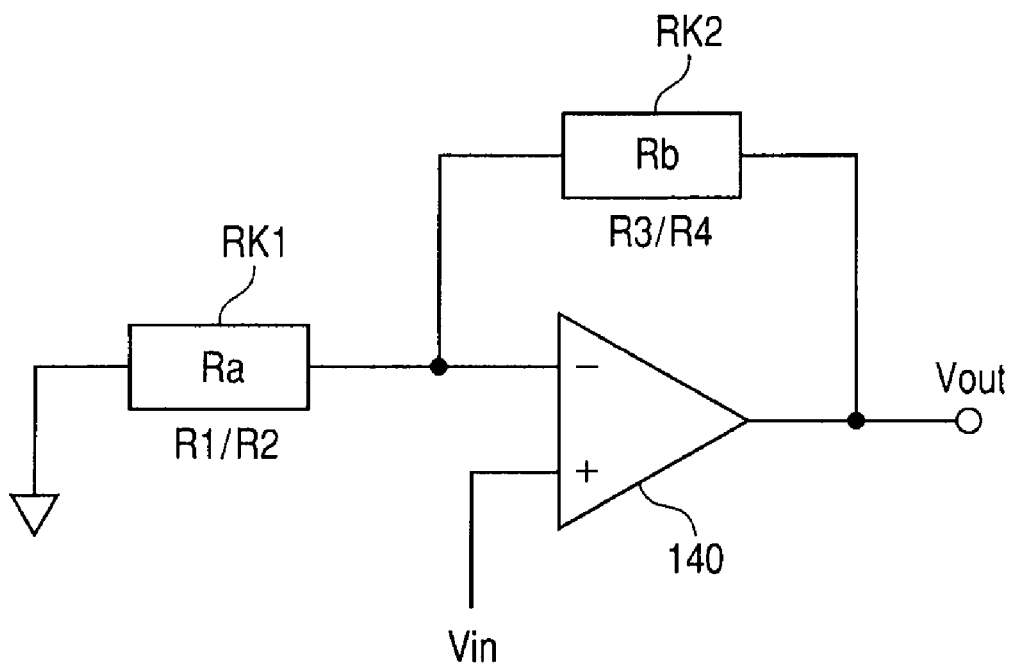
FIG. 29 is a view showing Variation 5 of the amplification circuit according to Embodiment 7.

FIG. 29 is a view schematically showing a configuration of an amplification circuit of Variation 5 of Embodiment 7. In FIG. 29, the negative input of an op-amp 140 is coupled to the reference voltage source via a resistor circuit RK1, and the output of the op-amp 140 is coupled to the negative input thereof via a resistor circuit RK2. The resistor circuits RK1 and RK2 are formed of respective series-coupled resistors of even numbers of resistor elements R1, R2; R3, R4). As coupling of the substrate region of each of the resistor elements, the configuration shown in any of Embodiments 1 to 5 is used. In this manner, in each of the resistor circuits RK1 and RK2, the substrate voltage dependences of the respective resistance values of the resistor elements are cancelled out to eliminate the substrate voltage dependences of the resistance values Ra and Rb.

The op-amp 140 receives the input signal Vin at the positive input thereof. The respective resistance values of the resistor circuits RK1 and RK2 are Ra and Rb. In the coupling form of the op-amp shown in FIG. 29, the op-amp 140 performs a non-inverting amplifying operation, and an amplification factor Ab thereof is given by (1+Rb/Ra).

Therefore, in the coupling of the op-amp 140 which performs the non-inverting amplifying operation also, by applying the configuration of any of Embodiments 1 to 5 in each of the resistor circuit RK1 forming the input resistor and the resistor circuit RK2 forming the feedback resistor, and thereby making invisible the substrate voltage dependences of the respective resistance values Ra and Rb of the input resistor and the feedback resistor, it is possible to hide the substrate voltage dependence of the amplification factor of the amplifier 140, and obtain the precise amplified signal Vout with reduced distortion.

Thus, according to Embodiment 7 of the present invention, in each of the input resistor and the feedback resistor of the op-amp, the substrate regions are coupled such that the substrate voltage dependences of the respective resistance values thereof are cancelled out. As a result, it is possible to obtain a differential amplification circuit which performs an amplifying operation with reduced distortion.

In addition, by applying the amplifiers to, e.g., the single-ended/differential signal conversion portions of an A/D conversion circuit for audio processing, analog differential signals with reduced distortion can be generated.

Embodiment 8

Figure 30:
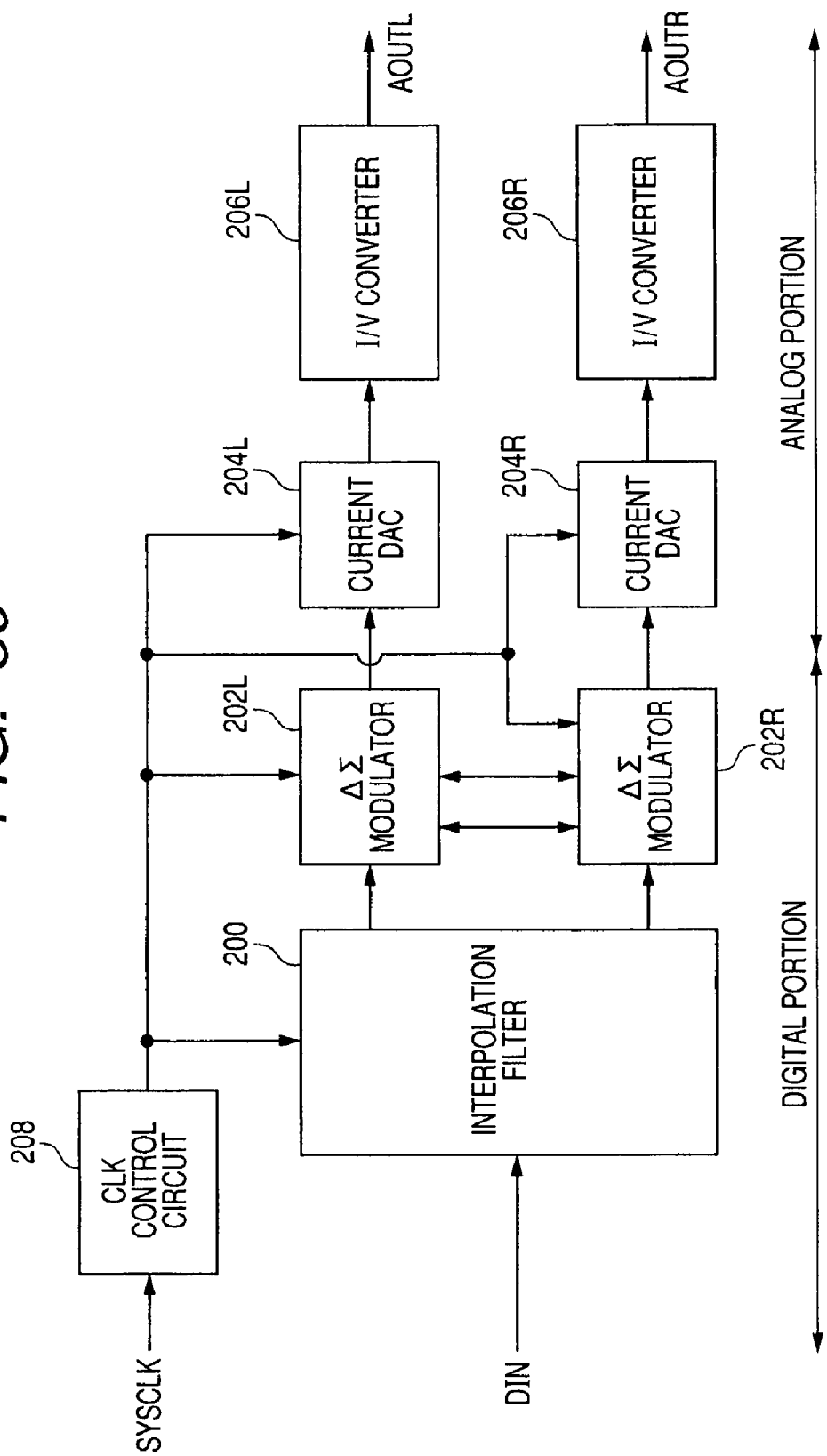
FIG. 30 is a view schematically showing a configuration of a high-accuracy ΔS digital/analog conversion circuit to which a resistor element according to Embodiment 8 of the present invention is applied.

FIG. 30 is a view schematically showing an overall configuration of a high-accuracy ΔS digital/analog conversion circuit for audio processing to which resistor elements according to Embodiment 8 of the present invention are applied. In FIG. 30, the ΔS digital/analog conversion circuit includes an interpolation filter 200 which equivalently increases a sampling frequency for input digital signals DIN, ΔS modulators 202L and 202R which perform ΔS modulation with respect to respective data sets corresponding to L- and R-channels from the interpolation filter 200, current DACs (digital/analog converters) 204L and 204R which convert output signals from the ΔS modulators 202L and 202R to analog signals, and output the analog signals in the forms of current signals, and I/V (current/voltage) converters 206L and 206R which convert the current signals from the current DACs 204L and 204R to voltage signals. From the I/V converters 206L and 206R, an analog output signal AOUTL for the L-channel and an analog output signal AOUTR for the R-channel are respectively generated.

The operation timings of the interpolation filter 200, the ΔS modulators 202L and 202R, and the current DACs 204L and 204R are controlled by an internal clock signal from a clock (CLK) control circuit 208. The clock control circuit 208 generates the internal timing clock signal in accordance with a system clock signal SYSCLK.

To the interpolation filter 200, an L-channel signal and an R-channel signal are given in time series as the digital input signals DIN. The interpolation filter 200 performs interpolation of values obtained by sampling the digital input signals DIN to equivalently increase the sampling frequencies therefor, and then passes a low-frequency component. By interpolation performed with the interpolation filter 200, noise shaping for shifting a noise component such as quantization noise to the high-frequency region is performed, and the noise component is removed by the subsequent low-frequency-component passing process.

The ΔS modulators 202L and 202R perform ΔS modulation to the L-channel signal and the R-channel signal given from the interpolation filter 200. At this time, from the interpolation filter 200, the L-channel signal and the R-channel signal are outputted in parallel with each other. As the digital input signals DIN, the L-channel signal and the R-channel signal are given in time series, and the resulting time-series signal is divided into the L-channel signal and the R-channel signal, and outputted. Therefore, the ΔS modulators 202L and 202R transmit and receive a delay signal for 1-samplingperiod delay or the like therebetween, and execute the ΔS modulation with respect to the L-channel signal and the R-channel signal.

The current DACs 204L and 204R convert the respective digital signals given from the ΔS modulators 202L and 202R to the current signals, and output the current signals. As a result, from the current DACs 204L and 204R, the analog signals obtained by converting the digital signals subjected to the ΔS modulation to the current signals are generated.

By generating the current signals, the signals subjected to the ΔS modulation are converted at a high speed to analog signals and, by current addition, the analog current signals of magnitudes corresponding to the signals subjected to the ΔS modulation are easily generated. As the configuration of each of the current DACs 204L and 204R, any configuration can be used as long as the configuration supplies currents corresponding to the digital signals subjected to the delta-sigma modulation.

The I/V converters 206L and 206R convert the analog current signals supplied from the current DACs 204L and 204R to analog voltage signals to respectively generate the analog L-channel signal AOUTL and the analog R-channel signal AOUTR.

By performing the interpolation with the interpolation filter 200 and generating the current signals with the current DACs 204L and 204R, it is possible to perform digital/analog conversion with high accuracy.

In the case of this configuration, finally in each of the I/V converters 206L and 206R, current/voltage conversion is performed using an op-amp. In the current/voltage conversion, in order to generate the voltage signals in accordance with the current signals and generate signals with reduced distortion, accuracy is required of an I/V converting operation.

Figure 31:
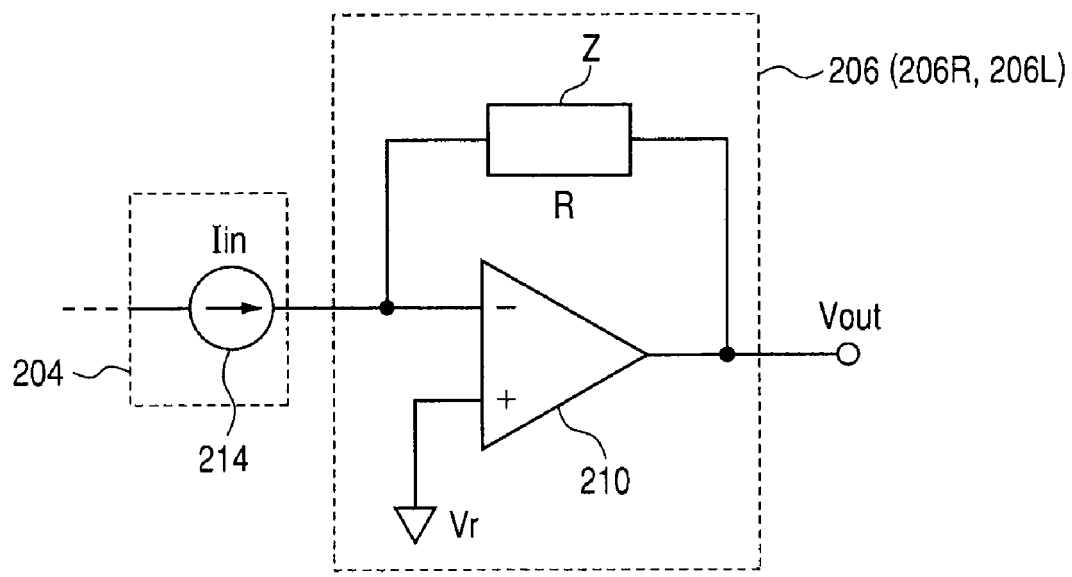
FIG. 31 is a view schematically showing an example of a configuration of the I/V converter shown in FIG. 30.

FIG. 31 is a view schematically showing an example of a configuration of each of the I/V converters 206L and 206R. Because the I/V converters 206L and 206R have the same configuration, an I/V converter 206 representative of the I/V converters 206R and 206L is shown in FIG. 31.

In FIG. 31, the I/V converter 206 (206L, 206R) includes an op-amp 210 which receives an analog input current Iin supplied from a current source 214 of the current DAC 204 (204L, 204R) in the previous stage. The output and negative input of the op-amp 210 are coupled to each other via a resistor element Z, and the positive input of the op-amp 210 is coupled to the reference voltage source Vr.

The current source 214 included in the current DAC 204 supplies a current corresponding to the digital signal subjected to the ΔS modulation. Accordingly, the current source 214 is formed of a variable current source in which an amount of current to be supplied is adjusted in accordance with the digital signal subjected to the LS modulation. However, in FIG. 31, the current source 214 is shown as a mere supplier of the analog current signal.

The input impedance of the op-amp 210 is high, and the analog current signal Iin from the current source 214 is transmitted to an output node via the resistor element Z having the resistance value R. Therefore, the output signal Vout is given by Vr−R·Iin. Note that the current Iin flowing in a direction from the negative input of the op-amp 210 toward the output thereof is assumed to be a positive current.

Because the output signal Vout depends on the resistance value R of the resistor element Z, a voltage signal in accordance with the input current Iin is generated as the output signal Vout. The output voltage signal Vout is required to be on a voltage level precisely corresponding to the input current signal Iin. To effect high-accuracy current-voltage conversion, the configuration of the series-coupled resistor of the resistor elements described above in any of Embodiments 1 to 5 is used.

Figure 32:
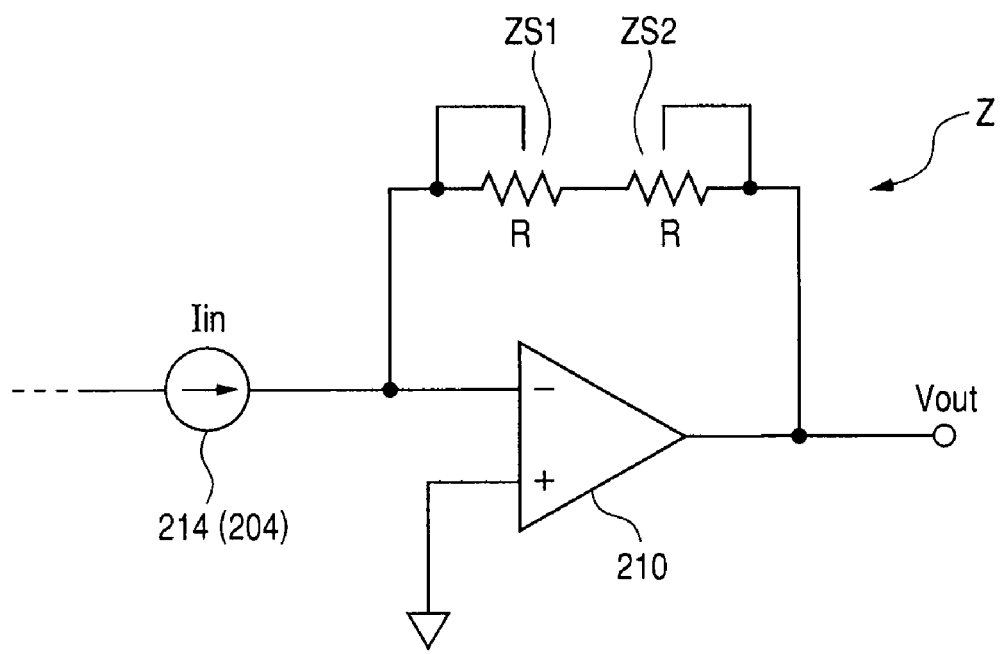
FIG. 32 is a view showing an example of a specific configuration of the I/V converter shown in FIG. 31.

FIG. 32 is a view showing an example of a specific layout of the resistor element Z included in the I/V conversion circuit shown in FIG. 31. In FIG. 32, the resistor element Z includes a series-coupled resistor of resistor sub-elements ZS1 and ZS2. The substrate region of the resistor sub-element ZS1 is coupled to the negative input of the op-amp 210. The substrate region of the resistor sub-element ZS2 is coupled to the output of the op-amp 210. Each of the resistor sub-elements ZS1 and ZS2 has the equal resistance value R.

The analog current signal Iin from the current source 214 of the current DAC 204 has a sign. Accordingly, voltages applied to the resistor sub-elements ZS1 and ZS2 have different polarities depending on the sign of the analog input signal Iin. However, in either case, the average potentials from the substrate regions of the resistor sub-elements ZS1 and ZS2 are in opposite directions, and the magnitudes thereof are equal. Therefore, a combined resistance 2·R of the resistor sub-elements ZS1 and ZS2 maintains a given value without being influenced by the substrate voltage, and a voltage signal in accordance with the analog input signal Iin can be precisely generated as the output signal Vout.

Figure 33:
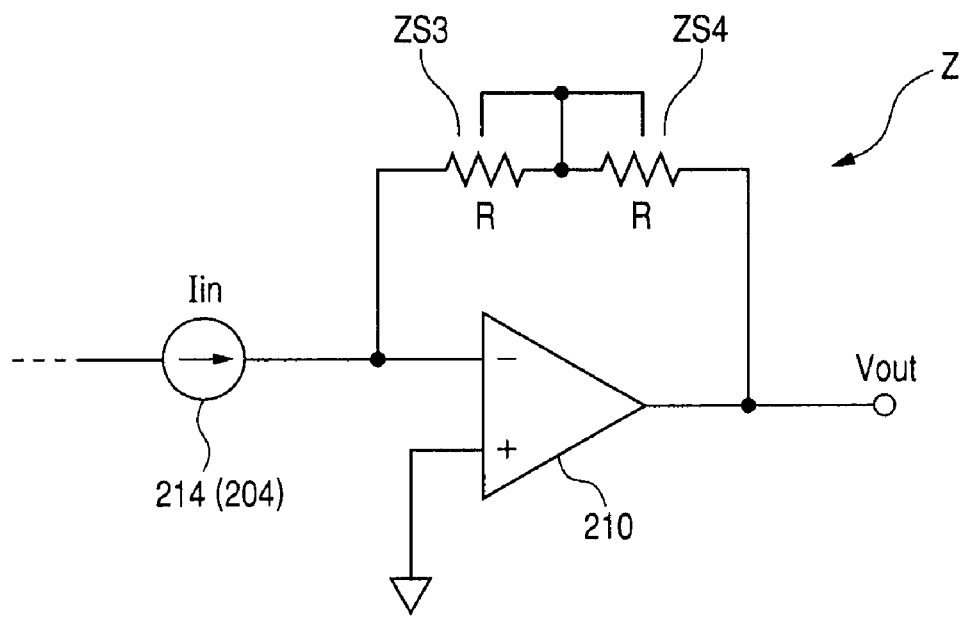
FIG. 33 is a view showing Variation 1 of the I/V converter shown in FIG. 31.

FIG. 33 is a view schematically showing another configuration of the resistor element Z shown in FIG. 31. In FIG. 33, the resistor element Z includes a series-coupled resistor of resistor sub-elements ZS3 and ZS4 in the same manner as in the configuration shown in FIG. 32. The substrate regions of the resistor sub-elements ZS3 and ZS4 are coupled to the connection node between the resistor sub-elements ZS3 and ZS4. Each of the resistor sub-elements ZS3 and ZS4 has the resistance value R.

In the coupling form of the substrate regions of the resistor sub-elements ZS3 and ZS4 of the resistor element Z shown in FIG. 33 also, when a voltage change occurs due to the input signal Iin from the current source 214, the respective average potentials from the substrate regions to the resistor sub-elements ZS3 and ZS4 have equal magnitudes, and opposite signs. Therefore, irrespective of the sign of the analog current signal Iin, the substrate voltage dependences of the respective resistance values of the resistor sub-elements ZS3 and ZS4 are cancelled therebetween, and a signal in accordance with the product of the analog input signal Iin and the combined resistance (2·R) of the resistor sub-elements ZS3 and ZS4 is generated as the output signal Vout without being influenced by the substrate voltage.

Thus, according to Embodiment 8, the substrate regions of the resistor elements used in the amplifier of the current/voltage converter of the high-accuracy ΔS digital/analog conversion circuit are coupled such that the substrate voltage dependence of a series-coupled resistor of the resistor elements is cancelled out. As a result, the output signal in accordance with the combined resistance of the resistor elements of the series-coupled resistor can be generated without being influenced by the substrate voltage, and the analog voltage signals with reduced distortion can be generated. Therefore, it is possible to implement a digital/analog conversion circuit for audio processing which allows reproduction of an audio signal with a reduced distortion component.

Embodiment 9

Figure 34:
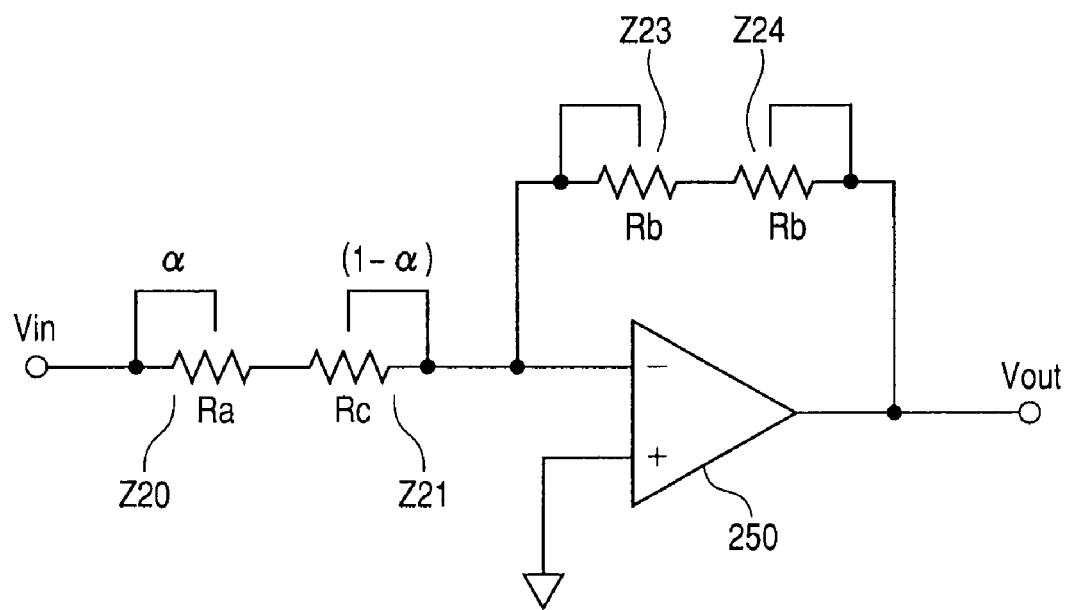
FIG. 34 is a view schematically showing a configuration of an amplification circuit according to Embodiment 9 of the present invention.

FIG. 34 is a view schematically showing a configuration of an amplification circuit according to Embodiment 9 of the present invention. In FIG. 34, a series-coupled resistor of resistor elements Z20 and Z21 is coupled as the input resistor to the negative input of an op-amp 250, and a series-coupled resistor of resistor elements Z23 and Z24 is coupled as the feedback resistor between the output and negative input of the op-amp 250. The positive input of the op-amp 250 is coupled to the reference voltage source.

The substrate regions of the resistor elements Z20 and Z21 are respectively coupled to a signal input node and to the negative input node of the op-amp 250. The substrate regions of the resistor elements Z23 and Z24 are respectively coupled to the negative input and output of the op-amp 250. The resistor elements Z20 and Z21 have the resistance value Ra and a resistance value Rc, respectively, and the resistance ratio therebetween is Ra:Rc=a:(1−a). On the other hand, the resistor elements Z23 and Z24 have the same resistance value Rb.

Figure 35:
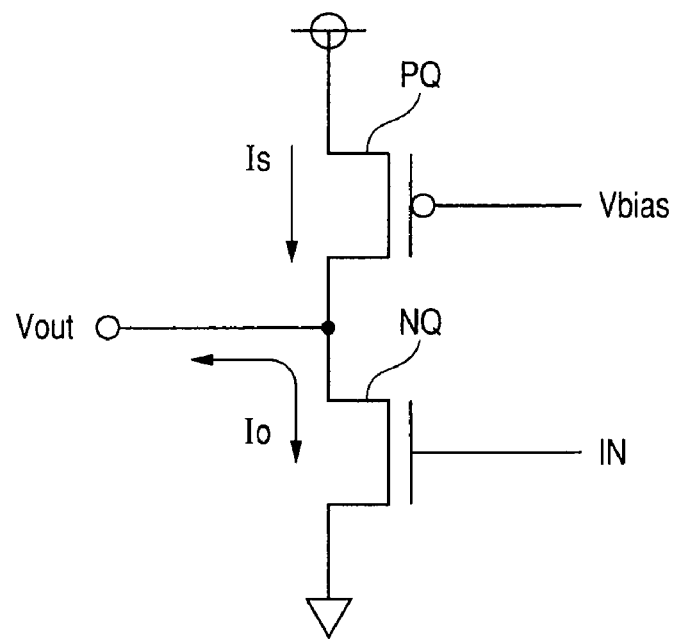
FIG. 35 is a view schematically showing an example of a configuration of an output stage of the op-amp shown in FIG. 34.

FIG. 35 is a view schematically showing an example of a configuration of a final output stage of the op-amp 250 shown in FIG. 34. In FIG. 35, the output stage of the op-amp includes a P-channel MOS transistor PQ which supplies a current to an output node, and an N-channel MOS transistor NQ which releases a current from the output node to a ground node. The P-channel MOS transistor PQ receives a bias voltage Vbias at the gate thereof, and the N-channel MOS transistor NQ receives an internal signal IN at the gate thereof.

The MOS transistor PQ supplies a given current Is in accordance with the bias voltage Vbias. On the other hand, the MOS transistor NQ supplies the current to the output node, or extracts the current from the output node based on the polarity of the output signal Vout. As a result, when the magnitude of a current Io flowing from the output node into the MOS transistor NQ differs according to the output signal Vout, the value of the transconductance gm of the MOS transistor NQ changes to cause distortion in the input/output characteristic thereof. In this case, to maintain constant the transconductance gm of the MOS transistor NQ without being influenced by a variation in the current Io from the output node, it is necessary to increase the current Is supplied from the MOS transistor PQ to make negligible the variation in the current Io from the output node (Is >>Io). However, in this case, the layout area of the MOS transistor PQ increases, and consumed current also increases. Therefore, the size (the ratio between the gate width and the gate length) of the MOS transistor PQ cannot be increased. The amount of the current supplied from the MOS transistor PQ is determined by the bias voltage Vbias. Accordingly, the degree of the influence of the flowing current Io depends on the bias voltage Vbias, and a state occurs where the distortion of the input/output characteristic of the op-amp due to the influence of the current Io flowing from the output node into the MOS transistor NQ has a dependence on the bias voltage. Note that the cause of the distortion mentioned above is one of the causes of distortion in the amp, and there is another distortion resulting from a process.

Figure 36:
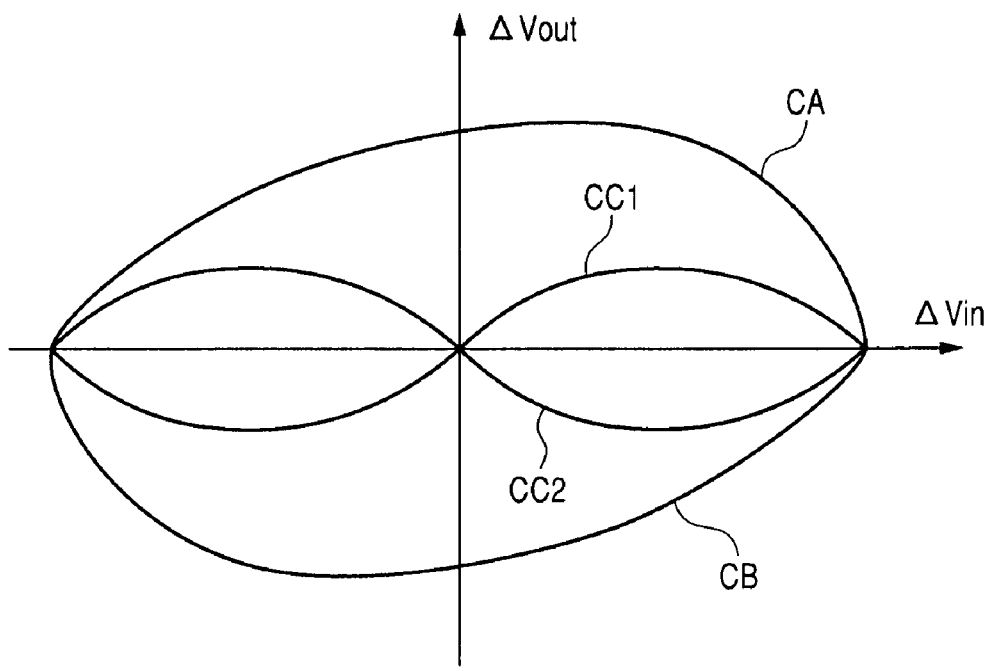
FIG. 36 is a view showing the bias voltage dependence of the input/output characteristic of the op-amp shown in FIG. 34.

FIG. 36 is a view showing the result of determining the input/output characteristic of the op-amp 250 shown in FIG. 34 by simulation. In this case, it is assumed that, in the input/output characteristic, there is no change in the respective resistance values of the input resistor and the feedback resistor. The input/output characteristic is measured by an end point method. The abscissa represents a deviation from the center value of the input signal, and the ordinate represents a deviation from the ideal characteristic (linear response characteristic) of the output signal. Here, the end point method shows a deviation of an actual input/output characteristic from a straight line connecting the both ends of the operation range of the input/output characteristic curve of the op-amp 250. The deviation of the output corresponds to the output deviation ΔVout shown in FIG. 36.

In FIG. 36, as the input/output response characteristic, the characteristics shown by the curves CA, CB, CC1, and CC2 are recognized. The characteristic curve CA shows an upwardly protruding input/output characteristic, and shows the tendency of the output signal to be higher than the straight line showing a linear response. In this case, the output signal shows the tendency to be lower than the ideal response (linear response). Each of the characteristic curves CC1 and CC2 shows an S-shaped input/output characteristic, and there are states where the levels of the output signals thereof are higher and lower than the linear response in accordance with the changes of the input signals from the center value.

In the input/output response characteristic, a state where the output deviation ΔVout is 0 in the entire region corresponds to a state where distortion is minimal.

As shown in FIG. 34, the resistance values Ra and Rc of the resistor elements Z20 and Z21 forming the input resistor are set to the resistance ratio a:(1−a). By giving a substrate voltage dependence to the input resistor, the substrate voltage dependence of the resistance value is reflected in the amplification factor of the op-amp 250 so that the input/output response characteristic is set to the ideal state. Here, the input/output characteristic as a correction target is represented by the curve CA of FIG. 36.

Figure 37:
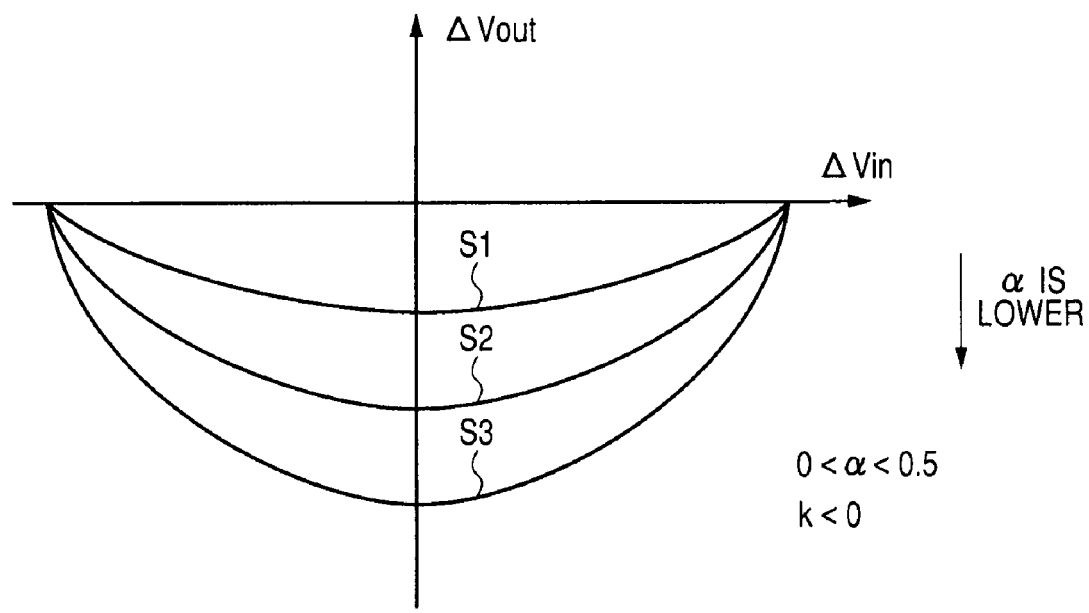
FIG. 37 is a view showing the substrate voltage dependences of the resistor elements in the input/output characteristic of the op-amp shown in FIG. 35.

FIG. 37 is a view showing the input resistance dependence of the input/output characteristic of the op-amp 250 shown in FIG. 34. In FIG. 37, it is assumed that the op-amp 250 is an ideal amplifier, and the input/output characteristic has no bias voltage dependence. The resistance ratio a has a value between 0 and 0.5. The substrate voltage dependence factors k of the resistor elements Z20 and Z21 have negative values. The input/output response characteristic is determined by the end point method.

As shown in FIG. 37, in accordance with the resistance ratio a between the input resistor elements, the input/output characteristic of the op-amp 210 protrudes downward. As the resistance ratio a decreases, the characteristic curves S1, S2, and S3 have progressively larger output deviations. The input resistance value dependence of the output deviation will be described later.

Therefore, by adjusting the input/output characteristic shown in FIG. 37, and combining it with the input/output characteristic represented by the characteristic curve CA shown in FIG. 36, the input resistance dependence resulting from the substrate voltage dependence of the input resistor and the bias voltage dependence in the input/output characteristic of the op-amp can be cancelled therebetween. As a result, an input/output characteristic CF of the op-amp as shown in FIG. 38 can be obtained.

Figure 38:
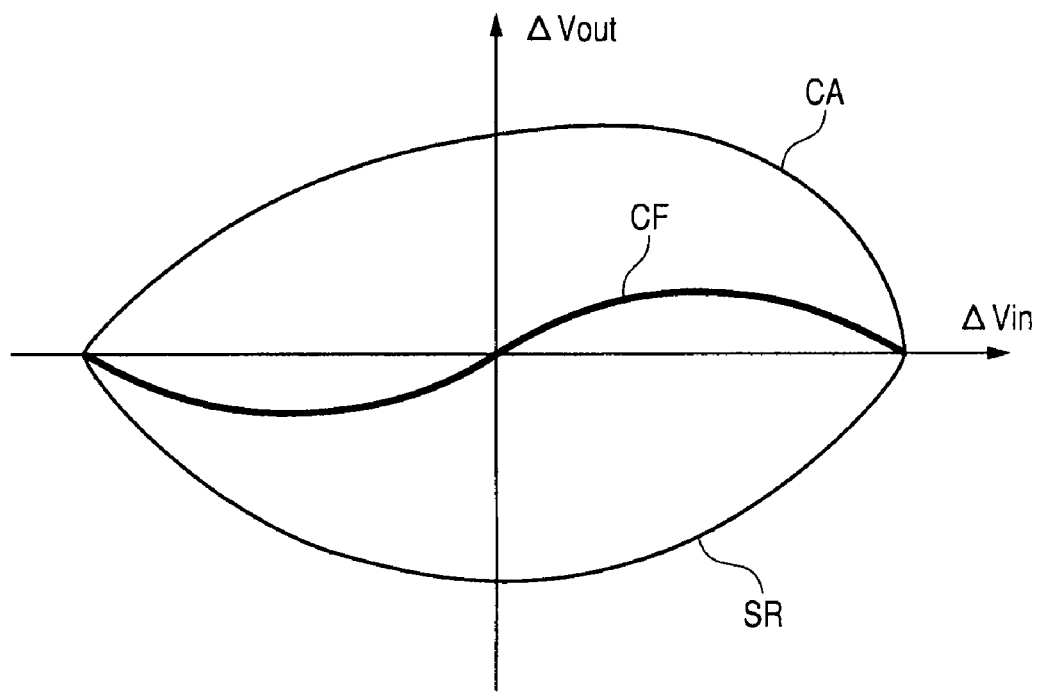
FIG. 38 is a view showing the input/output characteristic of an op-amp which is implemented in Embodiment 9.

In FIG. 38, the curve CA represents the bias voltage dependence of the input/output characteristic of the op-amp 250 when each of the input resistor and the feedback resistor has no substrate voltage dependence. The curve SR represents the input/output characteristic of the op-amp resulting from the substrate voltage dependence of the input resistor when the op-amp has no bias voltage dependence. By combining the input/output characteristics represented by the curves CA and SR, the final input/output characteristic CF is obtained. The resistance ratio a is set such that, in the input/output characteristic represented by the curve CF, the output voltage deviation ΔVout is 0 in the entire input deviation region.

A brief description will be given herein of the reason that the input/output response characteristic shown in FIG. 37 is obtained with reference to the configuration of FIG. 34. The average potentials Vx(A) and Vx(C) from the substrate of the resistor elements Z20 and Z21 forming the input resistor shown in FIG. 34 are given by the following respective expressions: Vx(A)=−a·VIN/2, and Vx(C)=(1−a)·VIN/2 wherein VIN represents a voltage applied to the entire resistor elements Z20 and Z21, which is given by the sum of the input signal Vin and the reference power supply voltage (Vss) of the positive input, i.e., by Vin+Vss.

Accordingly, the respective resistance values Ra and Rc of the resistor elements Z20 and Z21, and the combined resistance Ra+Rc thereof are given by the following respective expressions: Ra=a·R0(1+k·(−a·Vin/2)), Rc=(1−a)·R0·(1+k·(1−a)·Vin/2), and Ra+Rc=R0+k·R0·(1−2·a)·VIN/2=R0{1+k(1−2·a)·VIN/2} wherein R0 represents a unit resistance value in forming the resistance values Ra and Rc of the resistor elements Z20 and Z21.

Since the resistance ratio a satisfies 0<a<½, and the substrate voltage dependence factor k is negative, due to the dependence on the substrate voltage VIN, the combined resistance Ra+Rc decreases in a region where the substrate voltage VIN is positive, and the combined resistance Ra+Rc increases in a region where the substrate voltage VIN is negative. The op-amp is an inverting amplifier, and the amplification factor thereof is given by −2·Rb/(Ra+Rc). Accordingly, when the combined resistance Ra+Rc decreases in the region where the substrate voltage VIN is positive, the output signal increases in the negative direction (because of an increase in the absolute value of the amplification factor) and, when the combined resistance increases in the region where the substrate voltage VIN is negative, the amplitude of the output signal decreases (because of a reduction in the level of the output signal of the positive polarity). As a result, the input/output characteristic changes from the ideal characteristic in the negative direction so that a downwardly protruding input/output response characteristic as shown in FIG. 37 is obtained.

In the case where the resistance ratio a satisfies 1>a>½, when the substrate voltage dependence factor k is negative, an upwardly protruding input/output response characteristic is obtained. On the other hand, if the substrate voltage dependence factor k is positive, a downwardly protruding input/output response characteristic curve as shown in FIG. 37 is obtained when the factor a of the resistance ratio is between ½ and 1, and the upwardly protruding input/output response characteristic is obtained when the resistance ratio a is between 0 and ½.

Therefore, if the substrate voltage dependence factor k is set to a known value which has been preliminarily measured and determined as a parameter, by setting the resistance ratio a to a proper value, it is possible to cancel a bias voltage dependence of the op-amp as shown in FIG. 38 by the substrate voltage dependence of the resistance value of the input resistor, and implement an amplifier with reduced output distortion.

Figure 39:
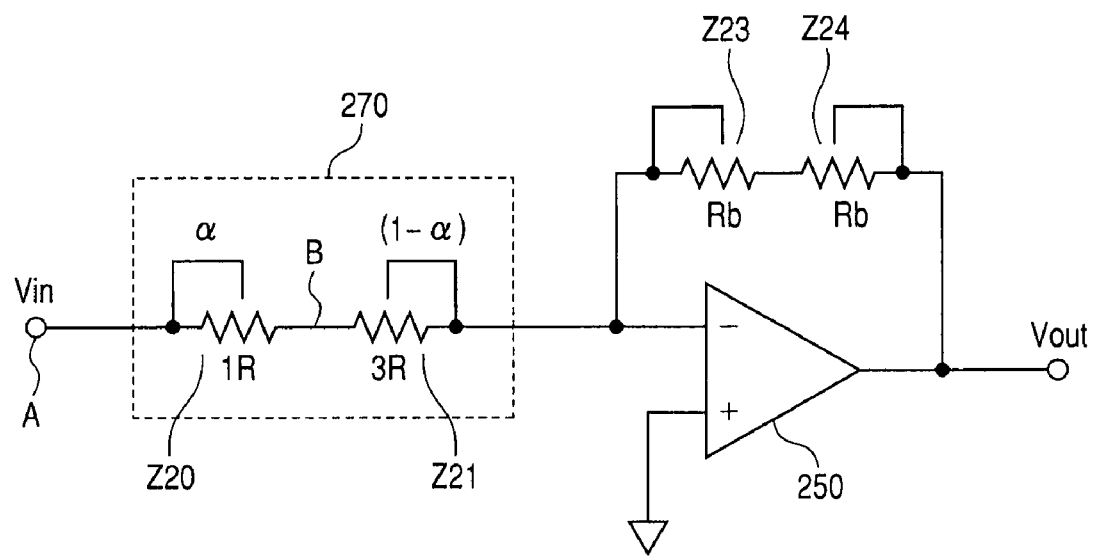
FIG. 39 is a view showing an example of a specific configuration of an amplification circuit according to Embodiment 9.

FIG. 39 is a view showing a specific example of the resistance ratio of an input resistor 270 of an inverting amplifier according to Embodiment 9. In FIG. 39, the respective resistance values of the resistor elements Z20 and Z21 forming the input resistor 270 are respectively set to 1·R and 3·R. In this case, the resistance ratio a is ¼. Each of the resistor elements Z23 and Z24 forming the feedback resistor have the equal resistance value R. In this configuration, the resistor elements Z20 and Z21 forming the input resistor 270 have different numbers of unit resistors forming the resistor elements Z20 and Z21 so that the layouts of the resistor elements Z20 and Z21 are different.

Figure 40:
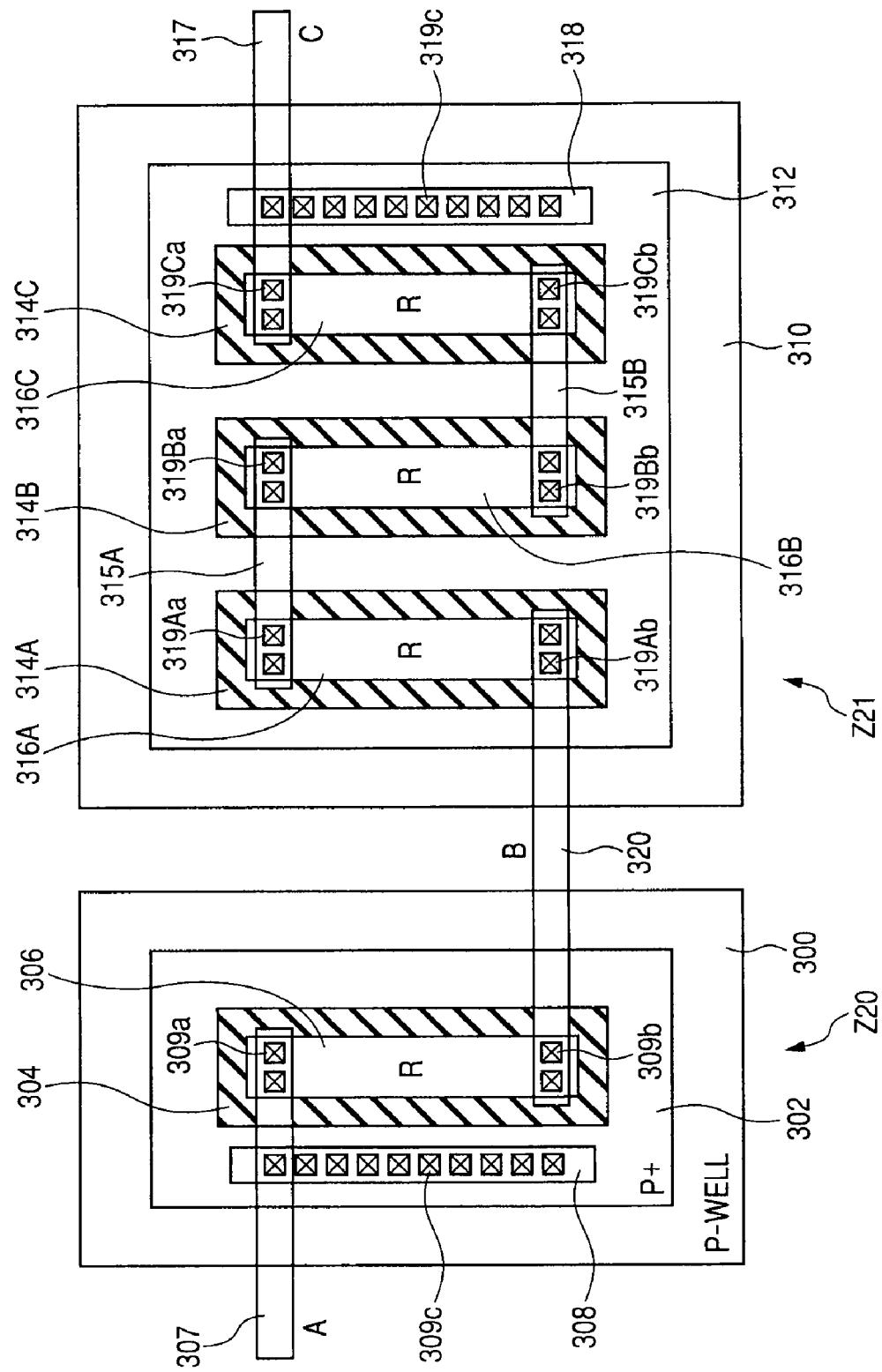
FIG. 40 is a view schematically showing a two-dimensional layout of the input resistor shown in FIG. 39.

FIG. 40 is a view schematically showing a two-dimensional layout of the input resistor 270 shown in FIG. 39. In FIG. 40, the resistor element Z20 is formed over the P-well 300. In the surface of the P-well 300, an isolation film 304 having a rectangular shape is formed and, around the isolation film 304, a high-concentration P-type impurity region 302 is disposed in the surface of the P-well 300. Over the surface of the isolation film 304, a resistive element 306 having a rectangular shape, and formed of, e.g., polysilicon is disposed. The resistance value of the resistive element 306 is R.

One end of the polysilicon resistive element 306 is coupled via contacts 309a to a coupling wire 307, and the other end of the resistive element 306 is coupled via contacts 309b to a coupling wire 320 formed of the first metal wire. A bias wire 308 formed of the first metal wire is disposed in parallel with the resistive element 306 outside the isolation film 304, while being connected to the coupling wire 307. The bias wire 308 is electrically coupled via contacts 309c to the high-concentration impurity region 302 in an underlying layer. By the coupling wire 307, a coupling path to the node A (input node) is formed.

The resistor element Z21 is formed within a P-well 310 disposed apart from the P-well 300. In the surface of the P-well 310, isolation films 314A, 314B, and 314C each having a rectangular shape are arranged with the same pitch in mutually spaced-apart relation. Over the P-well 310, a high-concentration P-type impurity region 312 is formed so as to surround the isolation films 314A, 314B, and 314C. Over the isolation films 314A, 314B, and 314C, resistive elements 316A, 316B, and 316C each having a rectangular shape, and formed of polysilicon are respectively formed. Each of the resistive elements 316A, 316B, and 316C has the equal resistance value R, similarly to the resistive element 306.

The resistive element 316A has one end thereof which is coupled via contacts 319Ab to the coupling wire 320 formed of the first metal wire, and the other end thereof which is electrically coupled via contacts 319Aa to a coupling wire 315A formed of the first metal wire. The coupling wire 315A is electrically coupled via contacts 319Ba to one end of the resistive element 316B. The other end of the resistive element 316B is coupled via contacts 319Bb to a coupling wire 315B formed of the first metal wire.

The other end of the coupling wire 315b is electrically coupled via contacts 319Cb to the resistive element 316C. The other end of the resistive element 316C is electrically coupled via contacts 319Ca to a coupling wire 317 formed of the first metal wire. A bias wire 318 formed of the same wire as forming the coupling wire 317, i.e., the first metal wire is disposed in parallel with the resistive elements on the outside of the isolation film 314 closer to the node C, and connected to the coupling wire 317. The bias wire 318 is electrically coupled via the contacts 319c to the high-concentration impurity region 312 in an underlying layer.

In the resistor element Z21, each of the resistive elements 316A, 316B, and 316C has the resistance value R, and the respective opposing ends thereof are electrically coupled by the coupling wires 315A and 315B. Consequently, the resistive elements 316A, 316B, and 316C are coupled in a meandering pattern to implement the resistor element having the resistance value 3·R.

Note that the coupling wire 317 is coupled to the node C, and the coupling wire 320 corresponds to the coupling node B between the resistor elements Z20 and Z21.

Therefore, in the case where resistor elements having different resistance values are coupled in series, by disposing a plurality of unit resistors each having the resistance value R in series, it is possible to implement the resistor elements each having a desired resistance value. At this time, by coupling the respective substrate regions of the resistor elements by the bias wires 308 and 318 in a direction which cancels out the respective substrate voltage resistances of the resistor elements, it is possible to set the substrate voltage dependence of the resistance value of a series-coupled resistor of the resistor elements to a desired characteristic in accordance with the resistance ratio between the resistor elements.

Variation 1 of Embodiment 9

Figure 41:
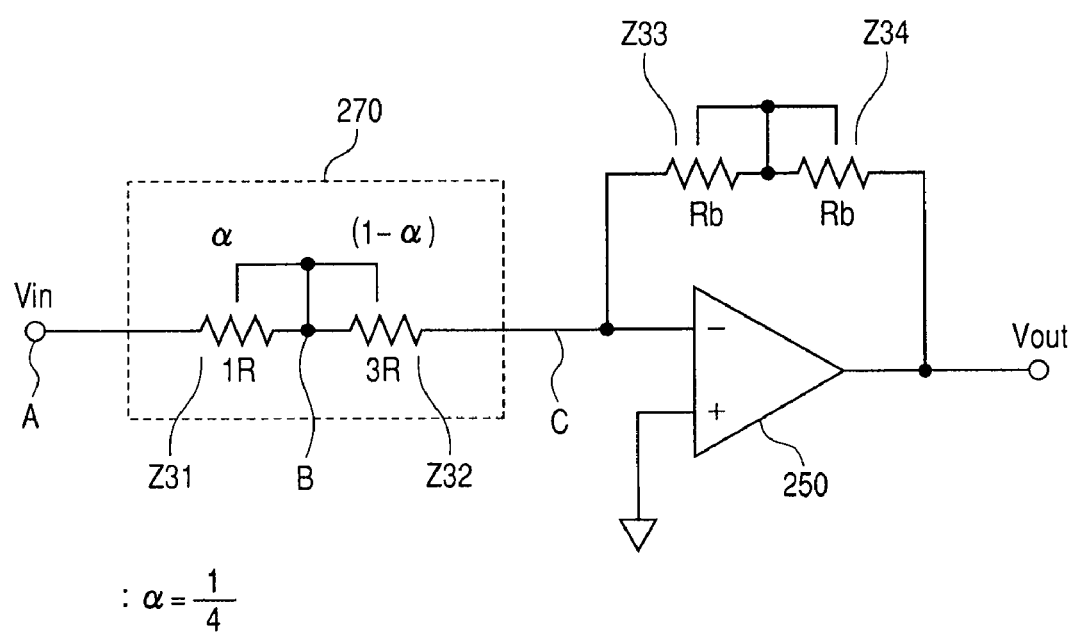
FIG. 41 is a view schematically showing a configuration of Variation 1 of the amplification circuit according to Embodiment 9.

FIG. 41 is a view schematically showing a configuration of a variation of the amplification circuit according to Embodiment 9. The configuration of the amplification circuit shown in FIG. 41 is different from the configuration of the amplification circuit shown in FIG. 39 in the following point. That is, the respective substrate regions of resistor elements Z31 and Z32 forming the input resistor 270 are coupled to the coupling node B between the resistor elements Z31 and Z32. In addition, the respective substrate regions of resistor elements Z33 and Z34 forming the feedback resistor are coupled to the coupling node between the resistor elements Z33 and Z34. The other components of the amplifier shown in FIG. 41, and a coupling form of the resistors are the same as in the configuration of the amplification circuit shown in FIG. 39.

The respective resistance values of the resistor elements Z31 and Z32 are set to a:(1−a). Each of the resistor elements Z33 and Z34 has the equal resistance value Rb. In the configuration of the amplification circuit shown in FIG. 41 also, an inverting amplifying operation is implemented by the input resistor 270 and the feedback resistor (resistor elements Z33 and Z34).

In the configuration shown in FIG. 41, the average potentials Vx(AB) and Vx(BC) from the respective substrate regions of the resistor elements Z31 and Z32 are given by the following respective expressions: Vx(AB)=a·VIN/2, and Vx(BC)=−(1−a)·VIN/2 wherein VIN represents a voltage applied between the nodes A and C.

The combined resistance Ra+Rb of the resistor elements Z31 and Z32 is given by the following expression: Ra+Rb=R0+R0·k·(2·a−1)·VIN/2=R0{1−k·(1−2·a)VIN/2}. The substrate voltage dependence of the combined resistance shown in the foregoing expression has a polarity opposite to the polarity of the substrate voltage dependence of the combined resistance of the resistor elements of the input resistor shown in FIG. 31 described above. Accordingly, in the case where the substrate voltage dependence factor k is negative, when the resistance ratio a is between 0 and ½, an upwardly protruding input/output response curve is given and, when the resistance ratio a is between ½ and 1, a downwardly protruding input/output response curve is obtained, as shown in FIG. 37. On the other hand, in the case where the substrate voltage dependence factor k is positive, when the resistance ratio a is between 0 and ½, the downwardly protruding input/output response characteristic shown in FIG. 37 is obtained and, when the resistance ratio a is between ½ and 1, the upwardly protruding input/output response curve is obtained, in the same manner as in the coupling form of the input resistor shown above in FIG. 39

Figure 42:
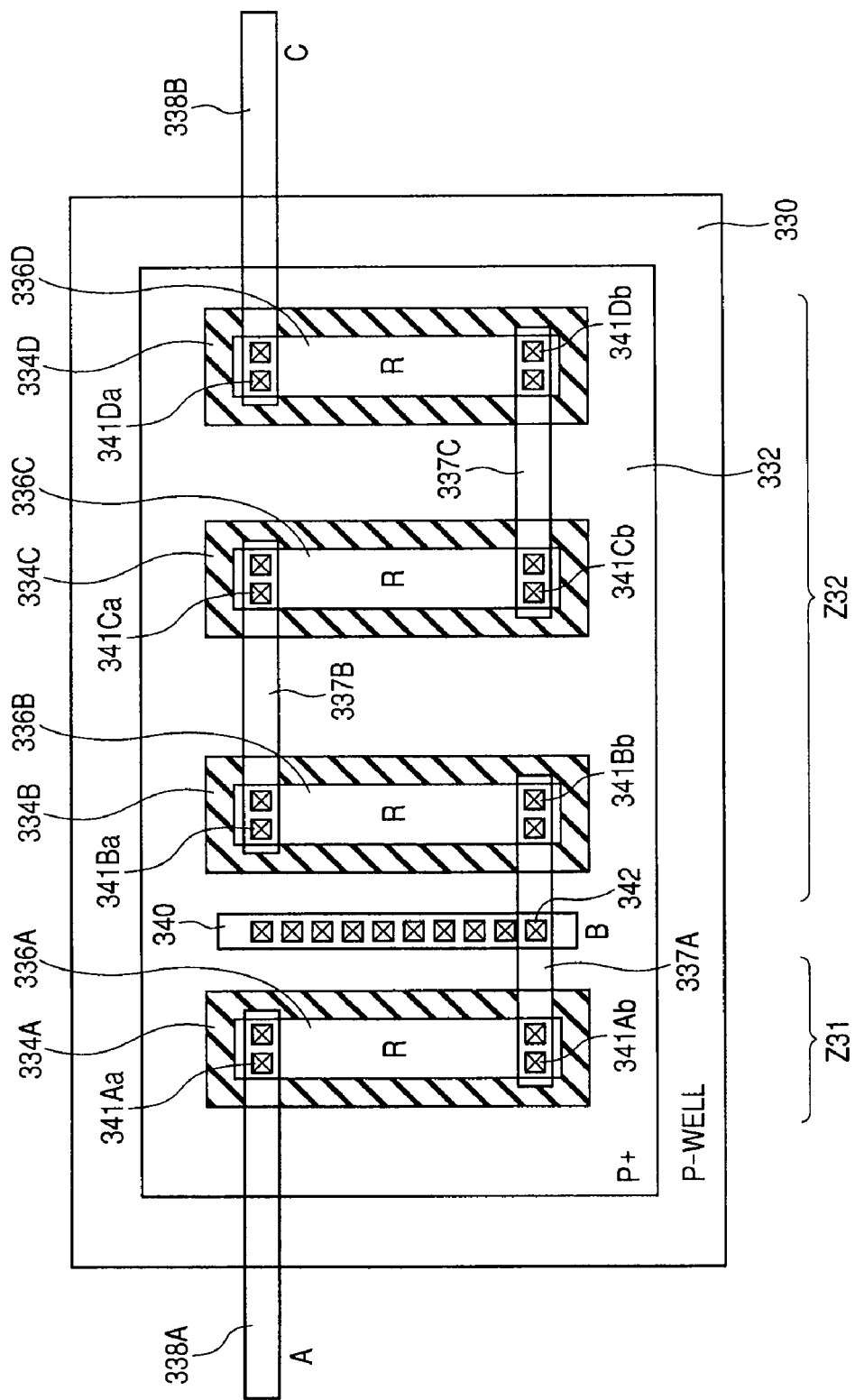
FIG. 42 is a view schematically showing a two-dimensional layout of the input resistor shown in FIG. 41.

FIG. 42 is a view schematically showing a two-dimensional layout of the input resistor 270 shown in FIG. 41. In FIG. 41, the resistor elements Z31 and Z32 have the respective resistance values 1·R and 3·R, so there is schematically shown the two-dimensional layout where the resistance ratio a is ¼.

In FIG. 42, a P-well 330 and a high-concentration P-type impurity region 332 are formed commonly to the resistor elements Z31 and Z32 forming the input resistor. In the surface of the P-well 330, isolation films 334A, 334B, 334C, and 334D each having the same rectangular shape are arranged in mutually spaced-apart relation. Over the isolation films 334A to 334D, resistive elements 336A, 336B, 336C, and 336D each having a rectangular shape, and formed of, e.g., polysilicon are disposed. Each of the resistive elements 336A, 336B, 336C, and 336D has the resistance value R.

The resistive element 336A has one end thereof which is coupled via contacts 341Aa to a coupling wire 338A formed of the first metal wire, and the other end thereof which is coupled via contacts 341Ab to an internal coupling wire 337A formed of the same first metal wire. The internal coupling wire 337A is electrically coupled via contacts 341Bb to the resistive element 336B. The other end of the resistive element 336B is electrically coupled via contacts 341Ba to an internal coupling wire 337B.

The resistive element 336C is electrically coupled via contacts 341Ca to an internal coupling wire 333B at the upper end thereof, and electrically coupled via contacts 341Cb to an internal coupling wire 333C at the other end thereof. The resistive element 336D is electrically coupled via contacts 341Db to an internal coupling wire 337C at the lower end thereof, and electrically coupled via contacts 341Da to a coupling wire 338B at the upper end thereof.

The coupling wire 338A is electrically coupled to the node A, and the coupling wire 338B is electrically coupled to the internal node C.

In the region between the isolation films 334A and 334B, in parallel with the resistive elements, a bias wire 340 having a rectangular shape is disposed, while being connected to the internal coupling wire 337A. The bias wire 340 is electrically coupled via contacts 342 to a high-concentration impurity region 332 formed in an underlying layer.

The respective opposing ends of the resistive elements 334A to 334D are successively coupled to form a signal transmission path in a meandering pattern, and the resistive elements 334A to 334D are coupled in series. At the node B, the bias wire 340 is disposed, and a configuration is implemented in which the resistance ratio a is set to ¼ for the resistor elements Z31 and Z32 forming the input resistor 270 shown in FIG. 41.

In the layout shown in FIG. 42, the bias wire 340 may also be disposed to have the both ends thereof extending along the high-concentration impurity region 332, and electrically coupled via contacts at the peripheral ends of the high-concentration impurity region 332. In this case, the voltage distribution of the P-well 330 can be reliably restricted.

Variation 2 of Embodiment 9

Figure 43:
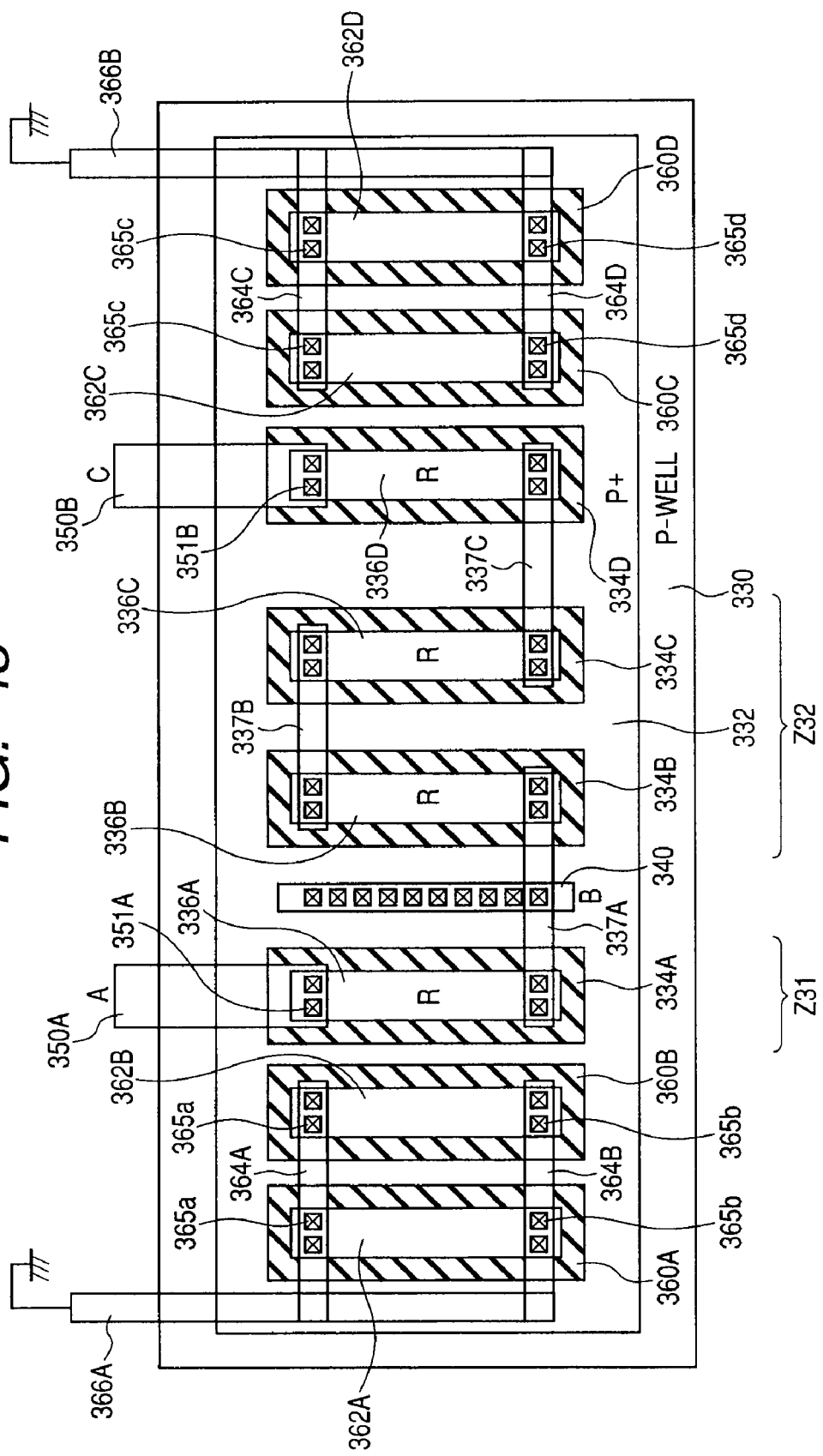
FIG. 43 is a view schematically showing a two-dimensional layout of a variation of the input resistor shown in FIG. 41.

FIG. 43 is a view schematically showing another two-dimensional layout of the input resistor of the amplification circuit according to Embodiment 9. The input resistor shown in FIG. 43 has the same layout configuration as that of the input resistor 270 shown in FIG. 41 so that the respective substrate regions of the resistor elements Z31 and Z32 are coupled to the coupling node B between the resistor elements Z31 and Z32.

In the two-dimensional layout shown in FIG. 43, the resistor elements Z31 and Z32 and coupling wires 350A and 350B respectively coupled to the nodes A and C extend in the longitudinal direction (direction parallel with the resistive elements) of the drawing, and coupled via contacts 351A and 351B to the resistive elements 336A and 336B. The other components of the resistor elements Z31 and Z32 have the same layout as the two-dimensional layout shown in FIG. 42 so that a detailed description thereof is omitted by providing the corresponding parts with the same reference numerals.

In the layout shown in FIG. 43, isolation films 360A and 360B are disposed in mutually separate relation outside the resistor element Z31 (the isolation film 334A and the resistive element 336A). The isolation films 360A and 360B are formed to have the same shapes as those of the isolation films 334A to 334D provided for the resistor elements Z31 and Z32. Over the isolation films 360A and 360B, resistive elements 362A and 362B each having a rectangular shape, and formed of, e.g., polysilicon are disposed. The resistive elements 362A and 362B have respective one ends thereof which are coupled commonly via contacts 365a to a coupling wire 364A formed of the first metal, and the respective other ends thereof which are coupled commonly via contacts 365b to a coupling wire 364B.

The coupling wires 364A and 364B are connected to the coupling wire 366A disposed to extend in parallel with each of the resistive elements. The coupling wire 366A is formed of the first metal wire, and coupled to the ground node.

On the outside of the region where the resistor element Z32 is formed which is closer to the node C, isolation films 360C and 360D are disposed to be spaced apart from each other, and adjacent to the isolation film 334B. Over the isolation films 360C and 360D, resistive elements 362C and 362B each formed of polysilicon are disposed. The isolation films 362C and 362D are formed of the same materials as and in the same shapes as those of the isolation films 334A to 334D. The resistive elements 362C and 362D have the same shapes and sizes as those of the resistive elements 336A to 336D forming the resistor elements Z31 and Z32.

The resistive elements 362C and 362D are coupled via contacts 365c to an internal coupling wire 364C formed of the first metal wire at respective one ends (upper ends) thereof, and coupled via contacts 366c to an internal coupling wire 360D formed of the first metal wire at the respective other ends (lower ends) thereof. The internal coupling wires 364C and 364D are connected to a coupling wire 366B disposed in parallel with the resistive element 362D. The coupling wire 366B is formed of the first metal wire, and coupled to the ground node.

By disposing the isolation films 360A to 360D and the resistive elements 362A to 362D as the shape dummy elements in the same patterns and the same shapes outside the region where the resistor elements Z31 and Z32 are formed, it is possible to precisely perform patterning of the resistor elements Z31 and Z32, and precisely set the resistance ratio a between the resistor elements of the input resistor.

In the layout shown in FIG. 43, the resistive elements and isolation films of the resistor elements Z31 and Z32 are disposed in line-symmetrical relation with respect to the region where the internal coupling wire 337B is formed. This is for the purpose of equalizing the wiring resistances (of the coupling wires 337A and 337C) since the bias wire 340 is disposed between the isolation films 334A and 334B, and the distance between the isolation films 334A and 334B is larger than the distance between the isolation films 334B and 334C.

In the layout shown in FIG. 43 also, it is possible that the bias wire 340 may be disposed to extend along the upper and lower peripheries of the high-concentration P-type impurity region 332, and electrical coupling may be provided between the bias wire 340 and the P-well 330 of the substrate region along the outer peripheral portion of the P-type impurity region 332.

Variation 3 of Embodiment 9

Figure 44:
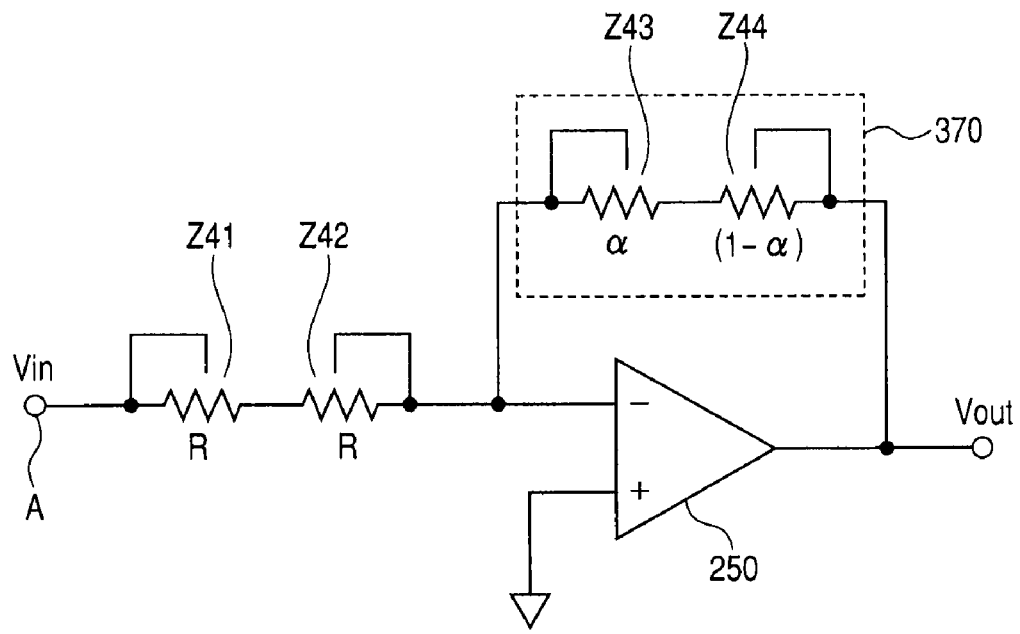
FIG. 44 is a view showing a configuration of Variation 3 of the amplification circuit according to Embodiment 9.

FIG. 44 is a view schematically showing a configuration of an amplification circuit according to Variation 3 of Embodiment 9. In FIG. 44, resistor elements Z41 and Z42 are coupled in series as the input resistor to the negative input of the op-amp 250. Each of the resistor elements Z41 and Z42 has the resistance value R. The substrate regions of the resistor elements Z41 and Z42 are respectively coupled to the signal input node and the negative input node of the op-amp 250.

Between the negative input and output node of the op-amp 250, a feedback resistor 370 is coupled. The feedback resistor 370 is formed of a series-coupled resistor of resistor elements Z43 and Z44. The substrate region of the resistor element Z43 is coupled to the negative input node of the op-amp 250, and the substrate region of the resistor element Z44 is coupled to the output node of the op-amp 250. The resistance ratio between the resistor elements Z43 and Z44 is a:(1−a). The positive input of the op-amp 250 is coupled to the reference voltage source.

In the feedback resistor 370 shown in FIG. 44, the substrate voltage dependences of the respective resistance values of the resistor elements Z43 and Z44 occur in the combined resistance value thereof. In this case, the same dependences as the foregoing substrate voltage dependences of the respective resistance values of the resistor elements Z20 and Z21 of the input resistor 270 shown in FIG. 39 occur. The op-amp 250 performs the inverting amplifying operation and, when the resistance value of the feedback resistor 370 increases, the absolute value of the amplification factor thereof increases. Accordingly, in the case of the configuration of the amplification circuit shown in FIG. 44, an upwardly protruding input/output response characteristic is obtained (when the substrate voltage dependence factor k is negative, and the resistance ratio a is between 0 and ½), which is opposite to the input/output characteristic of the amplification circuit shown in FIG. 39. On the other hand, when the substrate voltage dependence factor k is negative, and the resistance ratio a is between ½ and 1, a downwardly protruding input/output response characteristic is obtained, as shown in FIG. 37. When the substrate voltage dependence factor k is positive, the input/output characteristics described above are interchanged. In accordance with the bias voltage dependence of the input/output characteristic of the op-amp, a proper substrate voltage dependence factor k and a proper resistance ratio a are selected, and the values thereof are set.

Therefore, even in the case of giving a substrate voltage dependence to the resistance value of the feedback resistor 370 as shown in FIG. 44, the bias voltage dependence of the input/output characteristic of the op-amp 250 can be cancelled by the substrate voltage dependence of the resistance value of the feedback resistor.

Variation 4 of Embodiment 9

Figure 45:
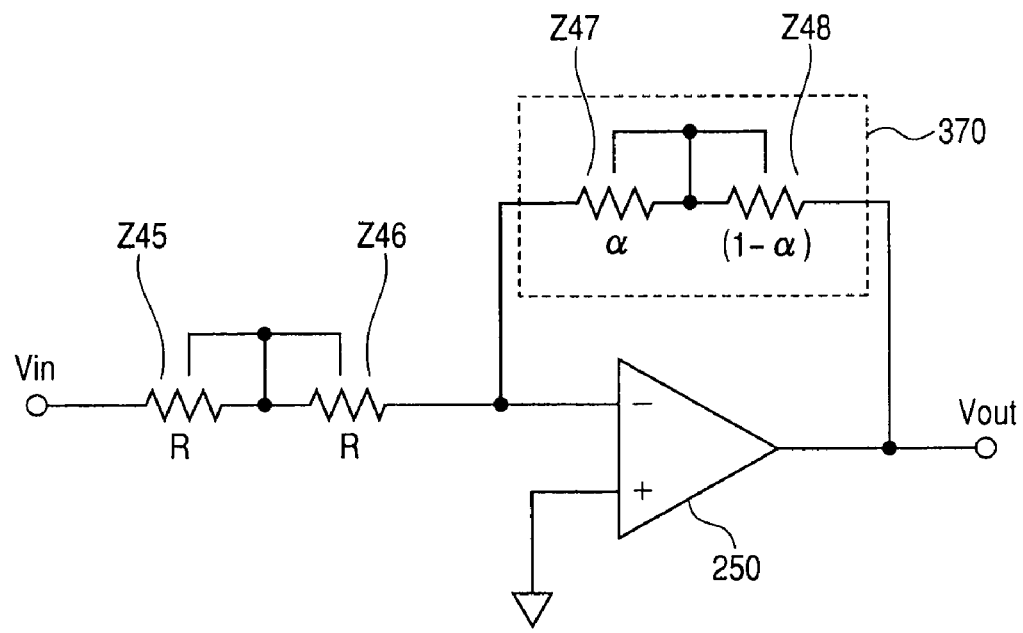
FIG. 45 is a view schematically showing a configuration of Variation 4 of the amplification circuit according to Embodiment 9.

FIG. 45 is a view schematically showing a configuration of an amplification circuit of Variation 4 of Embodiment 9. In FIG. 45, the input resistor of the op-amp 250 is formed of a series-coupled resistor of resistor elements Z45 and Z46, and the feedback resistor 370 is formed of a series-coupled resistor of resistor elements Z47 and Z48. The respective substrate regions of the resistor elements Z45 and Z46 are coupled to the coupling node between the resistor elements Z45 and Z46. Each of the resistor elements Z45 and Z46 has the equal resistance value R. On the other hand, the respective substrate regions of the resistor elements Z47 and Z48 forming the feedback resistor 370 are coupled to the coupling node between the resistor elements Z47 and Z48. The positive input of the op-amp 250 is coupled to the reference voltage source.

In the amplification circuit shown in FIG. 45, the op-amp 250 performs inverting amplification, and the relations among the polarities of respective voltages applied to the resistor elements Z45 to Z48 are the same as in a form of voltage application in the resistor elements Z31 to Z34 of the amplification circuit shown in FIG. 41. Accordingly, in the case of the coupling configuration shown in FIG. 45, the resistance value of the feedback resistor 370 has a substrate voltage dependence, which is opposite to the substrate voltage dependence of the input/output response characteristic of the op-amp shown in FIG. 41. In this case also, it is possible to cancel out the bias voltage dependence of the input/output characteristic of the op-amp 250 using the substrate voltage dependences of the resistor elements in the input/output characteristic of the op-amp 250.

The bias voltage dependence in the input/output characteristic of the op-amp may also be cancelled out by giving a substrate voltage dependence to the resistance value of each of the input resistor and the feedback resistor.

Variation 5 of Embodiment 9

Figure 46:
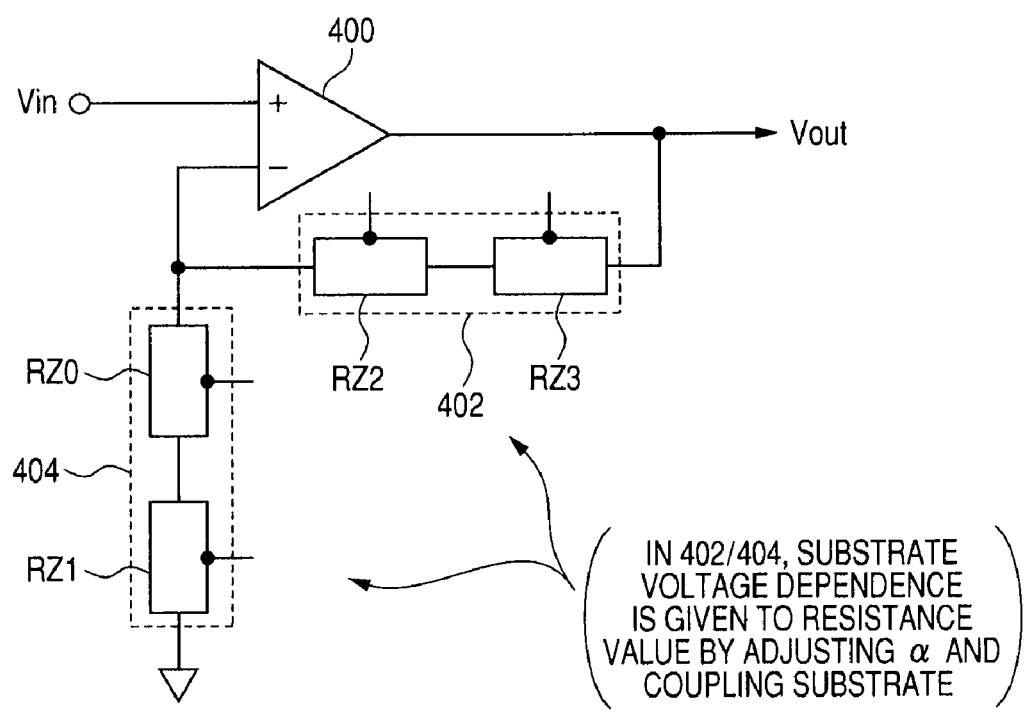
FIG. 46 is a view schematically showing a configuration of Variation 5 of the amplification circuit according to Embodiment 9.

FIG. 46 is a view schematically showing a configuration of an amplification circuit of Variation 5 of Embodiment 9. In FIG. 46, the input signal Vin is given to the positive input of an op-amp 400. Between the output node and negative input node of the op-amp 400, a feedback resistor 402 is coupled, and a bias resistor 404 is provided between the negative input and the reference voltage source. The feedback resistor 402 is formed of a series-coupled resistor of resistor elements RZ2 and RZ3, and the bias resistor 404 is formed of a series-coupled resistor of resistor elements RZ0 and RZ1. Each of the resistor elements RZ0 to RZ3 has a terminal for coupling to the substrate voltage, and is shown as a so-called three-terminal element in FIG. 46.

In one or each of the feedback resistor 402 and the bias resistor 404, adjustment of the resistance ratio a and coupling of a substrate node are performed, thereby giving a substrate voltage dependence to the resistance value thereof. A coupling form of the resistor elements of the feedback resistor 402 and the bias resistor 404 is set similarly to the coupling form of the feedback resistor (370) and the input resistor (270) shown in FIGS. 39, 41, 44, and 45.

In the amplification circuit shown in FIG. 46, the op-amp 400 performs the non-inverting amplifying operation, and the amplification factor Av thereof is given by the following expression: $Av = (1 + (RZ2 + RZ3)/(RZ0 + RZ1))$. As can be seen from the foregoing expression, during the non-inverting amplifying operation also, the amplification factor of the op-amp 400 differs according to the resistance ratio between the feedback resistor 402 and the bias resistor 404. Therefore, even in the case where the input/output characteristic of the op-amp 400 has a bias voltage dependence, by giving substrate voltage dependences to the respective resistance values of the feedback resistor 402 and the bias resistance 404, it is possible to cancel the bias voltage dependence of the input/output characteristic of the op-amp 400 by the substrate voltage dependences of the resistance values of the feedback resistor/bias resistor, as described heretofore in Embodiment 9.

Note that the op-amp 400 shown in FIG. 46 performs the non-inverting amplifying operation, and the substrate voltage dependence of the input/output characteristic of the non-inverting amplification circuit shown in any FIGS. 39 to 45 and the substrate voltage dependence opposite thereto are provided in the non-inverting amplification circuit shown in FIG. 46.

The amplification circuit of Embodiment 9 may be applied to the ADC or DAC for audio processing shown above, or may also be used in a portion where a normal amplifying operation is needed.

Thus, according to Embodiment 9, a resistance value is set in at least one of the input resistor, feedback resistor, and bias resistor of the op-amp so as to have a substrate voltage dependence. As a result, it is possible to cancel out the bias voltage dependence of the input/output characteristic of the op-amp and the substrate voltage dependence of the input/output characteristic via the resistor elements, and implement a high-accuracy amplification circuit with reduced distortion.

Embodiment 10

Figure 47:
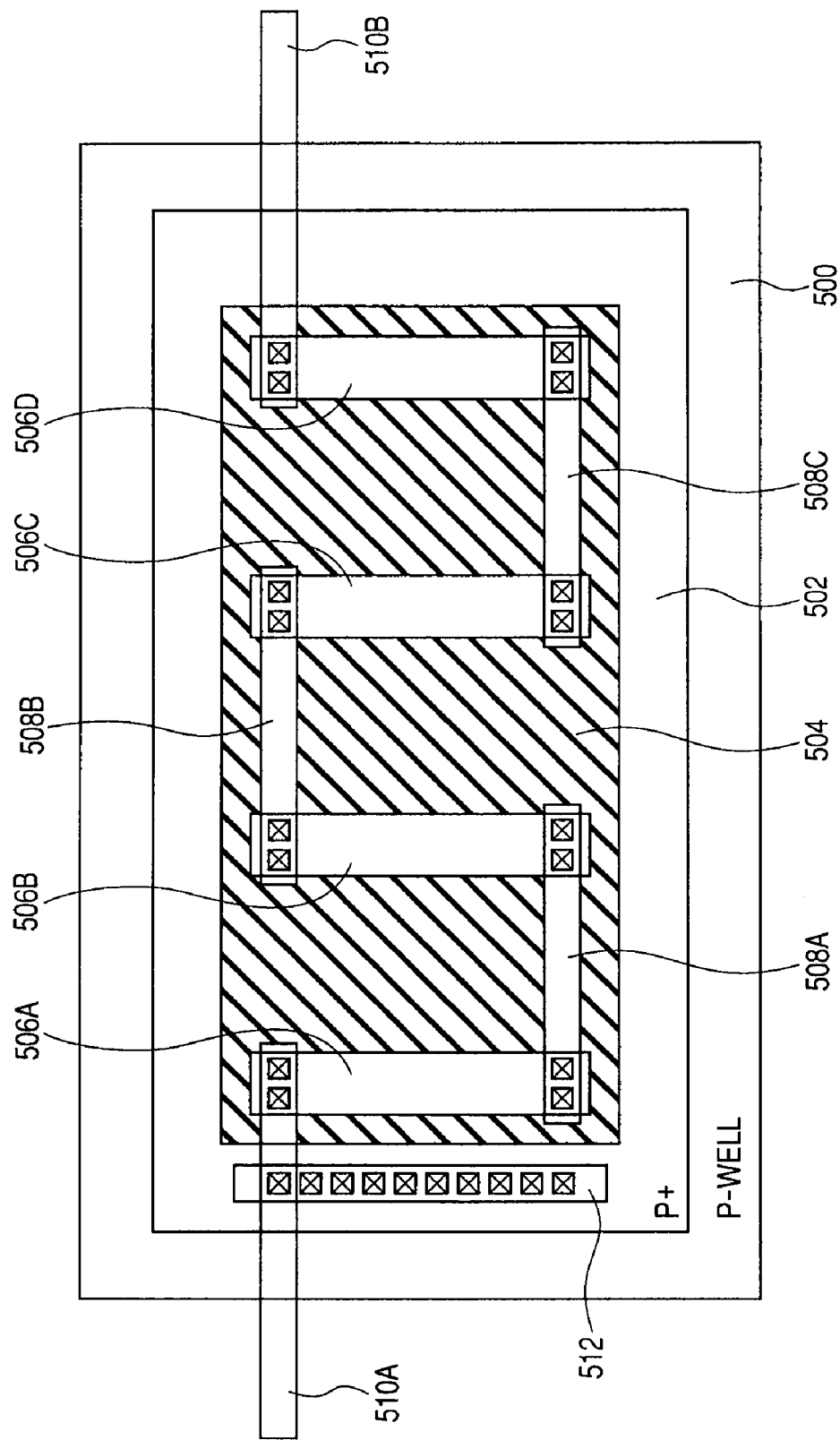
FIG. 47 is a view schematically showing a two-dimensional layout of resistor elements in Embodiment 10 of the present invention.

FIG. 47 is a view schematically showing a two-dimensional layout of resistor elements according to Embodiment 10 of the present invention. In FIG. 47, the layout of the resistor elements is shown. In FIG. 47, an isolation film 504 is formed in a surface of a P-well 500. In the surface of the P-well 500, a high-concentration P-type impurity region 502 is formed so as to surround the isolation film 504.

Over the isolation film 504, resistive elements 506A to 506D each formed of, e.g., polysilicon are disposed in the same shape in mutually spaced-apart relation. The respective opposing ends of the resistive elements 506A to 506D are successively coupled to each other by internal coupling wires 508A, 508B, and 508C. The upper end of the resistive element 506A is coupled to a coupling wire 510A. The upper end of the resistive element 506B is coupled via contacts to a coupling wire 510B. The coupling wire 510A is also connected to a bias wire 512 which is electrically coupled via contacts to the high-concentration P-type impurity region 502.

In the case of the configuration shown in FIG. 47, isolation films are not individually provided for the resistive elements 506A to 506D, but the isolation film 504 is provided commonly thereto. In this case also, the potential of the P-well 500 is set by the bias wire 512 and, likewise, an electric field applied via the isolation films between the P-well and the resistive elements 506A to 506D is exerted to the same degree. Therefore, it is possible to obtain the same effect as obtained in the configuration described heretofore in Embodiments 1 to 9. The resistive elements 506A to 506D are used as, e.g., unit resistor elements, and a plurality of (an even number of) the resistive elements 506A to 506D are coupled to implement a resistor element having a necessary resistance value. Alternatively, each of the resistive elements 506A to 506D is used as a resistor element having a desired resistance value.

In the configuration shown in FIG. 47 also, the bias wire 912 may be formed in a recumbent U-shaped shape so as to surround the isolation film 504, and electrically coupled along the periphery of the high-concentration P-type impurity region 502 to achieve stabilization of the potential of the P-well 500.

In the case of the configuration shown in FIG. 47, it is not necessary to divide the isolation film into separate films for the individual resistive elements, and it is possible to reduce the pitch of the resistive elements as well as the layout area of the resistive elements. However, by dividing the isolation film into separate films on a per resistive-element basis, and dispose them, each of the resistor elements has the same layout of the resistive elements and the isolation film, and can be uniformly formed.

In the configuration shown in FIG. 47, a series-coupled resistor of the resistive elements 506A to 506D implements one resistor element for which the substrate potential is adjusted. Therefore, a resistor element having the same layout as in the configuration shown in FIG. 47 is coupled in series with the resistor element shown in FIG. 47 such that the respective substrate voltage dependences thereof are cancelled therebetween. The layout of the resistor element shown in FIG. 47 is applicable to each of the resistor elements of Embodiments 1 to 9 described heretofore.

In the description given above, the resistor elements are formed of polysilicon. However, the resistor elements may also be metal resistors as long as the resistance values thereof change due to the influence of the substrate potentials (as long as the resistance values thereof are significantly influenced by the electric field formed between the substrate and each of the resistor elements). In the description given above, in the case of cancelling out the substrate voltage dependences, one resistor is formed of two resistor elements. However, the number of the resistor elements forming the one resistor may be any as long as the substrate voltage dependences of the series-coupled resistor elements are cancelled therebetween and there are equal numbers of respective resistor elements having dependences of the opposite polarities.

The present invention is typically applied to a semiconductor device including a series-coupled resistor of resistor element to allow generation of a required internal signal with high accuracy. In particular, by applying the present invention to a resistor element for implementing an amplifying operation of an operational amplifier (op-amp), it is possible to obtain an amplifier which performs a high-accuracy amplifying operation with reduced distortion.

In particular, by applying the present invention to an amplifier (operational amplifier) for audio processing or the like of which accuracy is required, it is possible to obtain a high-accuracy output signal with reduced distortion. By applying the present invention to an LSI for audio processing in a mobile phone or the like, it is possible to implement a circuit which performs high-accuracy audio processing.

What is claimed is:

1. A semiconductor device comprising:
   a plurality of resistor elements formed over respective substrate regions each via an insulating film, and coupled in series to each other;
   at least one bias wire electrically coupling one end of each of the plurality of resistor elements to one of the substrate regions corresponding thereto,
   an operational amplifier which amplifies a signal applied thereto;
   and input resistor which transmits the applied signal to an input of the operational amplifier; and
   a feedback resistor which feedbacks a signal from an output of the operational amplifier to the input,
   wherein the bias wire is arranged such that respective voltages between a pair of resistor elements of the plurality of resistor elements, which are coupled in series to each other, and the respective substrate regions corresponding thereto have opposite polarities,
   wherein the plurality of resistor elements include resistor elements forming the input resistor and resistor elements forming the feedback resistor, and
   wherein the bias wire is provided for each of a series-coupled resistor of the resistor elements forming the input resistor and a series-coupled resistor of the resistor elements forming the feedback resistor.

2. A semiconductor device according to claim 1,
   wherein the resistor elements include an even number of resistor elements, and
   wherein the bias wire is arranged such that the number of the resistor elements each having a positive-polarity average voltage between itself and the corresponding substrate region is the same as the number of the resistor elements each having a negative-polarity average voltage between itself and the corresponding substrate region.

3. A semiconductor device according to claim 1,
   wherein the resistor elements include a first resistor element and a second resistor element coupled in series to each other,
   wherein the substrate regions include a plurality of well regions disposed in mutually separate relation correspondingly to the first and second resistor elements, and
   wherein the bias wire couples the first and second resistor elements to the corresponding well regions at ends different from a coupling node between the first and second resistor elements.

4. A semiconductor device according to claim 3,
   wherein each of the first and second resistor elements includes a plurality of resistor sub-elements coupled in series to each other.

5. A semiconductor device according to claim 3, further comprising:
   a first dummy resistor element and a second dummy resistor element formed in the respective substrate regions of the first and second resistor elements in respectively adjacent relation to the first and second resistor elements, having the same shapes as those of the first and second resistor elements, and each having both ends thereof which are coupled to a fixed power supply.

6. A semiconductor device according to claim 1,
   wherein the resistor elements include a first resistor element and a second resistor element coupled in series to each other,
   wherein the substrate regions include a well region provided commonly to the first and second resistor elements, and
   wherein the bias wire couples a coupling node between the first and second resistor elements to the well region.

7. A semiconductor device according to claim 6,
   wherein each of the first and second resistor elements includes a plurality of resistor sub-elements coupled in series to each other.

8. A semiconductor device according to claim 6, further comprising:
   a first dummy resistor element and a second dummy resistor element formed in the respective substrate regions of the first and second resistor elements in respectively adjacent relation to the first and second resistor elements, having the same shapes as those of the first and second resistor elements, and each having both ends thereof which are coupled to a fixed power supply.

9. A semiconductor device according to claim 1,
   wherein the resistor elements include a first resistor element and a second resistor element coupled in series to each other, and having different resistance values.

10. A semiconductor device according to claim 1,
    wherein said operational amplifier converts a current signal applied thereto to a voltage signal,
    wherein the resistor elements include resistor elements forming a feedback resistor which feedbacks an output of the operational amplifier to an input thereof.

11. A semiconductor device according to claim 1,
    wherein said operation amplifier has a first input to which an input signal is transmitted, a second input to which a fixed potential is transmitted, a first output, and a second output, and amplifying the input signal to generate a complementary pair of signals at the first and second outputs, wherein the plurality of resistor elements include an input resistor which transmits the input signal to the first input, a first feedback resistor which feedbacks a signal from the first output to the first input, and a second feedback resistor which feedbacks a signal from the second output to the second input, wherein at least one of the input resistor and the first and second feedback resistors includes a first resistor element and a second resistor element coupled in series to each other, and wherein the bias wire is arranged such that respective voltages between the first and second resistor elements and the corresponding substrate regions have opposite polarities.

12. A semiconductor device according to claim 1,
wherein respective resistance values of the input resistor and the feedback resistor are the same during application of no voltage to the substrate regions.

13. A semiconductor device according to claim 1,
wherein respective resistance values of the input resistor and the feedback resistor are different from each other even during application of no voltage to the substrate regions.

14. A semiconductor device according to claim 1,
wherein at least one of the input resistor and the feedback resistor includes a first resistor element and a second resistor element coupled in series to each other, and
wherein respective resistance values of the first and second resistor elements are the same during application of no substrate voltage.

15. A semiconductor device according to claim 1,
wherein at least one of the input resistor and the feedback resistor includes a first resistor element and a second resistor element coupled in series to each other, and
wherein respective resistance values of the first and second resistor elements are different from each other during application of no substrate voltage.

16. A semiconductor device according to claim 1,
wherein operational amplifier has a first input which receives an input signal, a second input, and an output,
wherein the resistor elements include resistor elements forming a bias resistor coupled between the second input and a reference power supply, and resistor elements forming a feedback resistor coupled between the output and the second input, and
wherein each of the bias resistor and the feedback resistor includes a pair of resistor elements coupled in series to each other.

* * * * *